(12) United States Patent
Goda et al.

(10) Patent No.: US 7,245,534 B2
(45) Date of Patent: Jul. 17, 2007

(54) NONVOLATILE SEMICONDUCTOR MEMORY

(75) Inventors: Akira Goda, Yokohama (JP);
Mitsuhiro Noguchi, Yokohama (JP);
Minori Kajimoto, Fujisawa (JP); Yuji Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/135,415

(22) Filed: May 24, 2005

(65) Prior Publication Data

US 2005/0265109 A1 Dec. 1, 2005

(30) Foreign Application Priority Data

May 31, 2004 (JP) ............................. 2004-162276

(51) Int. Cl.
*G11C 11/34* (2006.01)

(52) U.S. Cl. ........................... 365/185.17; 365/185.13; 365/185.18

(58) Field of Classification Search ........... 365/230.06, 365/51, 63, 185.17, 185.12, 185.16, 185.18, 365/185.13, 185.11
See application file for complete search history.

(56) References Cited

U.S. PATENT DOCUMENTS

| | | | |
|---|---|---|---|
| 5,508,957 A | 4/1996 | Momodomi et al. | |
| 6,084,283 A | 7/2000 | Arai | 257/500 |
| 6,115,287 A * | 9/2000 | Shimizu et al. | 365/185.17 |
| 6,376,879 B2 | 4/2002 | Mori et al. | |
| 6,411,548 B1 * | 6/2002 | Sakui et al. | 365/185.17 |
| 6,483,749 B1 * | 11/2002 | Choi et al. | 365/185.18 |
| 6,507,508 B2 | 1/2003 | Hosono et al. | |
| 6,845,042 B2 * | 1/2005 | Ichige et al. | 365/185.17 |
| 6,900,086 B2 | 5/2005 | Mori et al. | |
| 7,054,195 B2 * | 5/2006 | Matsunaga | 365/185.11 |
| 2002/0098652 A1 | 7/2002 | Mori et al. | |
| 2004/0228193 A1 * | 11/2004 | Shibata et al. | 365/222 |
| 2005/0237808 A1 * | 10/2005 | Ichikawa et al. | 365/185.17 |
| 2006/0083072 A1 * | 4/2006 | Umezawa | 365/185.29 |

FOREIGN PATENT DOCUMENTS

JP 2000-243926 8/2000

* cited by examiner

*Primary Examiner*—Anh Phung
*Assistant Examiner*—Hien N Nguyen
(74) *Attorney, Agent, or Firm*—Oblon, Spivak, McClelland, Maier & Neustadt, P.C.

(57) ABSTRACT

A nonvolatile semiconductor memory includes: a memory cell array constituted by word lines, bit lines, and electrically erasable/rewritable memory cell transistors, which have respective tunnel insulating films and are arranged at the intersections of the word lines and the bit lines; and a word line transfer transistor, which is separated by an element isolation region, has a source diffusion layer, a channel region, a gate insulating film on the channel region, and a drain diffusion layer, and is connected to a word line and a gate electrode formed on the gate insulating film via a word line contact plug formed in the drain diffusion layer. The channel width of the word line transfer transistor is at least six times width of the word line contact plug, and the distance in a second direction between the word line contact plug and corresponding element isolation region is greater than distance in a first direction between the word line contact plug and corresponding element isolation region where, the first direction denotes a direction from the source diffusion layer towards the drain diffusion layer, and the second direction denotes a direction perpendicular to the first direction.

18 Claims, 48 Drawing Sheets

NONVOLATILE SEMICONDUCTOR MEMORY

CROSS REFERENCE TO RELATED APPLICATIONS AND INCORPORATION BY REFERENCE

This application is based upon and claims the benefit of priority from prior Japanese Patent Application P2004-162276 filed on May 31, 2004; the entire contents of which are incorporated by reference herein.

BACKGROUND OF THE INVENTION

1. Field of the Invention

The present invention relates to an electrically rewriteable/erasable semiconductor memory device, and more particularly to a non-volatile semiconductor memory having peripheral circuits constituted by high voltage transistors.

2. Description of the Related Art

In a NAND type EEPROM, a type of nonvolatile semiconductor memory device, a high voltage programming write-in voltage $V_{pgm}$ is applied to the word line during NAND cell programming. The programming write-in voltage $V_{pmg}$ is supplied by the word line drive signal lines CG0 to CGm (m is a natural number). A word line transmission transistor is disposed in between the word line drive signal lines CG0 to CGm and the word lines WL0 to WLm, and executes switching that controls whether or not the programming voltage $V_{pmg}$ is transferred to the word lines WL0 through WLm according to the program selected/un-selected blocks. The word line transfer transistor must be able to cut off a programming voltage $V_{pmg}$ of approximately 20V, and so it must be a transistor that possesses a high breakdown voltage. However, in order to increase the value of the breakdown voltage, things like the gate length and the distance between the gate electrode and the contact must be set wider, which presents the problem of increased surface area of the semiconductor chip (see, for instance, Japanese Patent Application Laid-open No. 2002-141477, in particular, FIG. 7.).

SUMMARY OF THE INVENTION

An aspect of the present invention inheres in a nonvolatile semiconductor memory, which includes: a memory cell array constituted by a plurality of word lines, a plurality of bit lines, and electrically erasable/writable memory cell transistors, which have respective tunnel insulating films and are arranged at the intersections of the plurality of word lines and the plurality of bit lines; and a word line transfer transistor, which is separated by an element isolation region, has a source diffusion layer, a channel region, a gate insulating film on the channel region, and a drain diffusion layer, and is connected to a word line and a gate electrode formed on the gate insulating film via a word line contact plug formed in the drain diffusion layer. The channel width of the word line transfer transistor is at least six times width of the word line contact plug, and the distance in a second direction between the word line plug and corresponding element isolation region is greater than distance in a first direction between the word line contact plug and corresponding element isolation region where the first direction denotes a direction from the source diffusion layer towards the drain diffusion layer, and the second direction denotes a direction perpendicular to the first direction.

Another aspect of the present invention inheres in a nonvolatile semiconductor memory, which includes: a memory cell array constituted by a plurality of word lines, a plurality of bit lines, and electrically erasable/writable memory cell transistors arranged at the intersections of the plurality of word lines and the plurality of bit lines; a word line transfer transistor, which is separated by an element isolation region, has a source diffusion layer, a channel region, and a drain diffusion layer; and a word line contact plug and a word line drive signal line contact plug formed in the drain diffusion layer and the source diffusion layer, respectively. The channel width of the word line transfer transistor is at least six times width of the word line contact plug, and the distance in a second direction between the word line connection plug and corresponding element isolation region is greater than distance in a first direction between the word line contact plug and corresponding element isolation region where the first direction denotes a direction from the source diffusion layer towards the drain diffusion layer, and the second direction denotes a direction perpendicular to the first direction.

Another aspect of the present invention inheres in A nonvolatile semiconductor memory, which includes: a memory cell array constituted by a plurality of word lines, a plurality of bit lines, and electrically-erasable, -writable memory cell transistors arranged at the intersections of the plurality of word lines and the plurality of bit lines; and a bit line switch transistor, which is separated by an element isolation region, has a source diffusion layer, a gate electrode, and a drain diffusion layer, and is connected to a sense amplifier/shield power supply via a sense amplifier/shield power supply contact plug formed in the drain diffusion layer. The distance between the gate electrode and the bit line contact plug is greater than distance between the gate electrode and the sense amplifier/shield power supply contact plug.

BRIEF DESCRIPTION OF DRAWINGS

FIG. 16B is an equivalent circuit diagram that expresses the main relationship of a voltage of the block selected during data write-in.

FIG. 16C is an equivalent circuit diagram that expresses the main relationship of a voltage of the block selected during data write-in.

FIG. 16D is an equivalent circuit diagram that expresses the main relationship of a voltage of the block unselected during data write-in.

FIG. 16E is an equivalent circuit diagram that expresses the main relationship of a voltage of the block unselected during data write-in.

DETAILED DESCRIPTION OF THE INVENTION

Figure 1:
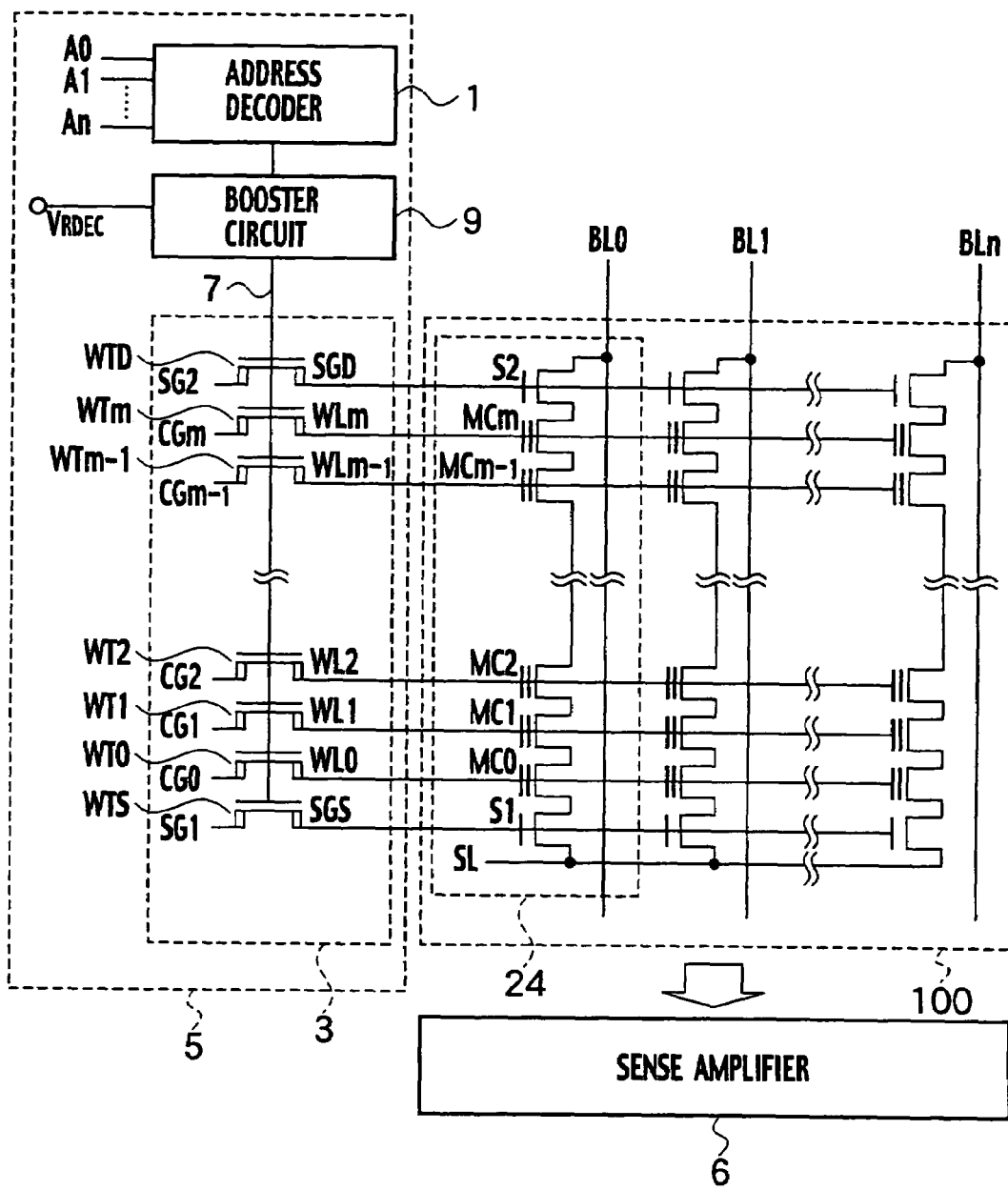
FIG. 1 is a schematic block diagram showing a NAND type EEPROM as the nonvolatile semiconductor memory device according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modified examples that fall within the claims.

Also, the first through eighth embodiments put forth below are merely to give examples of the device and method that embodies the technical concept of the present invention, and are not meant to limit the composing materials, form, structure, or disposal of the technical concept of the present invention to those appearing herein below.

On the description herein below, the channel's lengthwise direction flowing from the source to the drain is defined as a "first direction", and the channel's widthwise direction, which orthogonally crosses the channel's lengthwise direction, is defined as a "second direction". Accordingly, "the direction orthogonal to the channel's width" corresponds to the "first direction", and "the direction parallel to the channel's width" corresponds to the "second direction".

The directions of the layout patterns of the word line transfer transistor and the bit line switching transistor vary depending on the circuit. Therefore, the 'first direction' is not limited to the direction of the bit line, in which the bit line spans within the memory cell array, but 'first direction' can also refer to the direction of the word line, in which the word line spans crossing the bit line orthogonally within the memory cell array. In the same fashion, the 'second direction' is not limited to the direction of the word line, in which the word line spans within the memory cell array, but it can also refer to the direction of the bit line, in which the bit line spans crossing the word line orthogonally within the memory cell array.

The thickness of the gate insulating film of the high breakdown voltage word line transfer transistor and the bit line switching transistor should be twice as thick as the thickness of the tunnel insulating film of the memory cell transistor, and more preferably, should have a thickness of between 25 nm and 50 nm. This is to make it so that the even if a 25V voltage is applied to the gate electrodes or the diffusion layers of the high breakdown voltage word line transfer transistor and the bit line switching transistor after having set the programming voltage $V_{pgm}$ and the erasing voltage $V_{era}$ of the memory cell transistor to below 25V, the gate insulating films of the word line transfer transistor and the bit line switching transistor will not be destroyed.

According to the embodiments of the present invention, it is possible to provide a nonvolatile semiconductor memory device having reduced dimensions while maintaining a high breakdown voltage, on the word line transfer transistors, and the bit line switching transistors.

[First Embodiment]

The nonvolatile semiconductor memory device according to the first embodiment of the present invention, as shown in FIG. 1, is constituted by a memory cell array 100, a row decoder 5, and a sense amplifier 6, in an instance where the memory cell array is composed of a NAND type EEPROM. The memory cell array 100 includes memory cell transistors MC that are disposed at the intersections of the plurality of word lines WL0 through WLm that span in rows, and the plurality of bit lines that span in columns. The row decoder 5 is disposed on the periphery of the memory cell array 100. The row decoder 5 includes a word line transfer transistor unit 3, a booster circuit 9, and an address decoder 1. The memory cell array 100 further includes a NAND cell unit 24. The NAND cell unit 24 is constituted by a plurality of memory cell transistors MC0 through MCm that are connected in series in between select gate transistors S2 on a bit line BL side and select gate transistors S1 on a source line SL side. The n-number of NAND cell units 24 are lined in parallel rows constituting a single memory-cell block. The memory-cell blocks are disposed in rows and columns forming a matrix, which constitutes the actual memory cell array 100. FIG. 1 shows the state in which n-number of NAND cell unit 24 are lined in parallel rows.

The bit lines BL0 through BLm that are connected to the NAND call unit 24, are also connected to a sense amplifier 6. The sense amplifier 6 has a latch circuit that reads data, and temporarily stores data during write-in.

The row decoder 5 includes the address decoder 1, the word line transfer transistor unit 3, and the booster circuit 9. The address decoder 1 is used to select a block according to an input address A0 through An. The word line transfer transistor unit 3 includes a plurality of word line transfer transistors WTS, WT0 through WTD, which are used to transfer a high voltage to the word lines WL0 through WLm, and select gate lines SGD, SGS. The booster circuit 9 is used to supply an increasing voltage to the transfer gate line 7 that is connected in common with the gate electrodes of the word line transfer transistors WTS, WT0 through WTD inside the word line transfer transistor unit 3. A row decoder drive voltage $V_{RDEC}$ is supplied to the booster circuit 9. The word line transfer transistors WT0, through WTm are connected to the word lines WL0 through WLm on one side, and are connected to word line drive signal lines CG0 through CGm on the other side, inside of the source and drain diffusion layers. The word line transfer transistors WTD and WTS drive the select gate transistors S1 and S2. The word line transfer transistors WTD and WTS are connected to the select gate lines SGD and SGS on one side, and are connected to SG driver lines SG2 and SG1 on the other side, inside of the source and drain diffusion layers.

Figure 2:
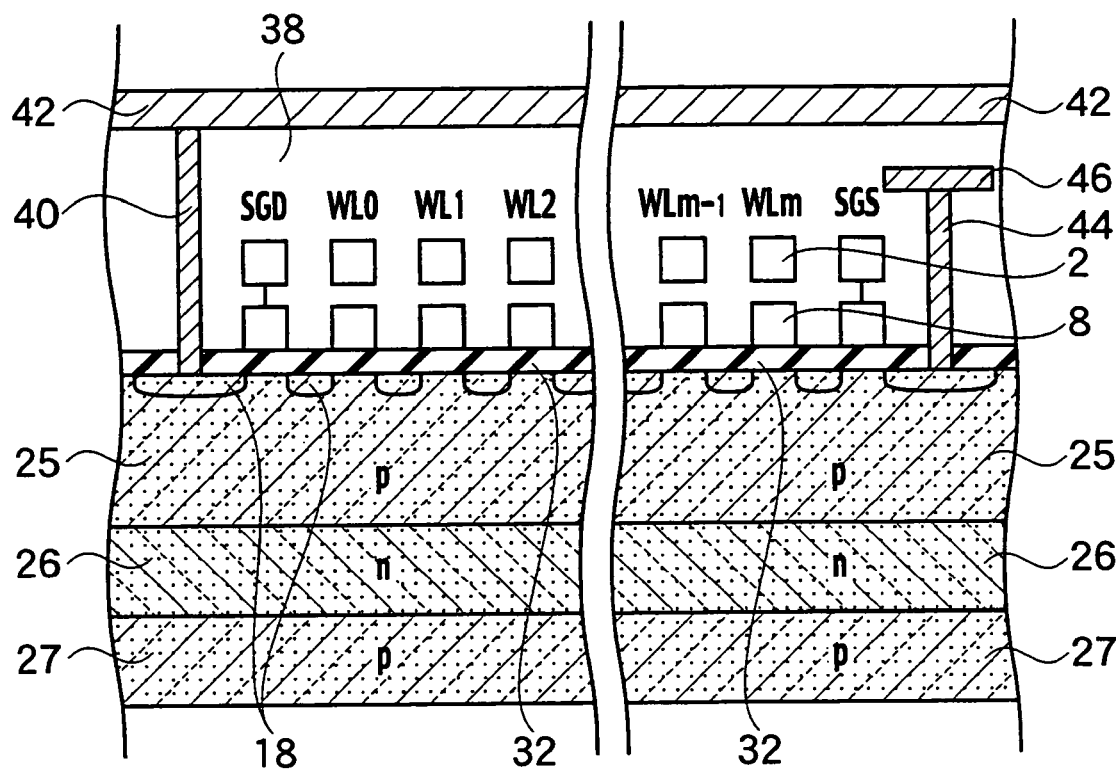
FIG. 2 is a schematic cross section diagram showing of a NAND type memory cell's structure of a memory cell array of the nonvolatile semiconductor memory device according to the first embodiment of the present invention.

The basic structure of a cross section of the elements of the memory cell transistors MC0 through MCm includes an n-well region 26 and a p-well region 25 formed within the p-type semiconductor substrate 27, as shown in FIG. 2. According to a well structure in this fashion, it is possible to apply a high erasing voltage $V_{era}$ to the p-well region 25 during erasing.

The stacked gate structure is formed by: disposing the memory cell transistor's gate insulating film 32 (tunnel insulating film) above the p-well region 25, stacking a floating gate 8 above the gate insulating film 32, and stacking a control gate 2 above the floating gate 8 in throughout an inter-gate insulating film 38. The adjacent memory cell transistor's source and drain regions are mutually connected by the diffusion layer 18, forming the NAND cell unit 24. The basic structure of the select gate transistors S1 and S2 that are disposed on each side of the NAND cell unit 24 are the same as that of the memory cell transistor MC, but form a MOS transistor when the floating gate 8 and the control gate 2 electrically short circuit. These stacked gate structured NAND cell units 24 are formed within an interlayer insulating film 38. The diffusion layer 18, which serves as the drain on the select gate transistor S1 is connected to a bit line electrode wiring 42 by a bit line contact plug 40. The diffusion layer 18 serving as the source on the select gate transistor S2 is connected to a source line electrode wiring 46 by a source line contact plug 44.

The film thickness of the high breakdown voltage word line transfer transistor's gate insulating film should be twice as thick as the thickness of the tunnel insulating film of the memory cell transistor, and more preferably, should have a thickness of between 25 nm and 50 nm. This is to make it so that the even if a 25V voltage is applied to the gate electrode or the diffusion layer of the high breakdown voltage word line transfer transistor after having set the programming voltage $V_{pgm}$ and the erasing voltage $V_{era}$ of the memory cell transistor to below 25V, the word line transfer transistor's gate insulating film will not be destroyed.

(Write-in Operation)

Figure 3:
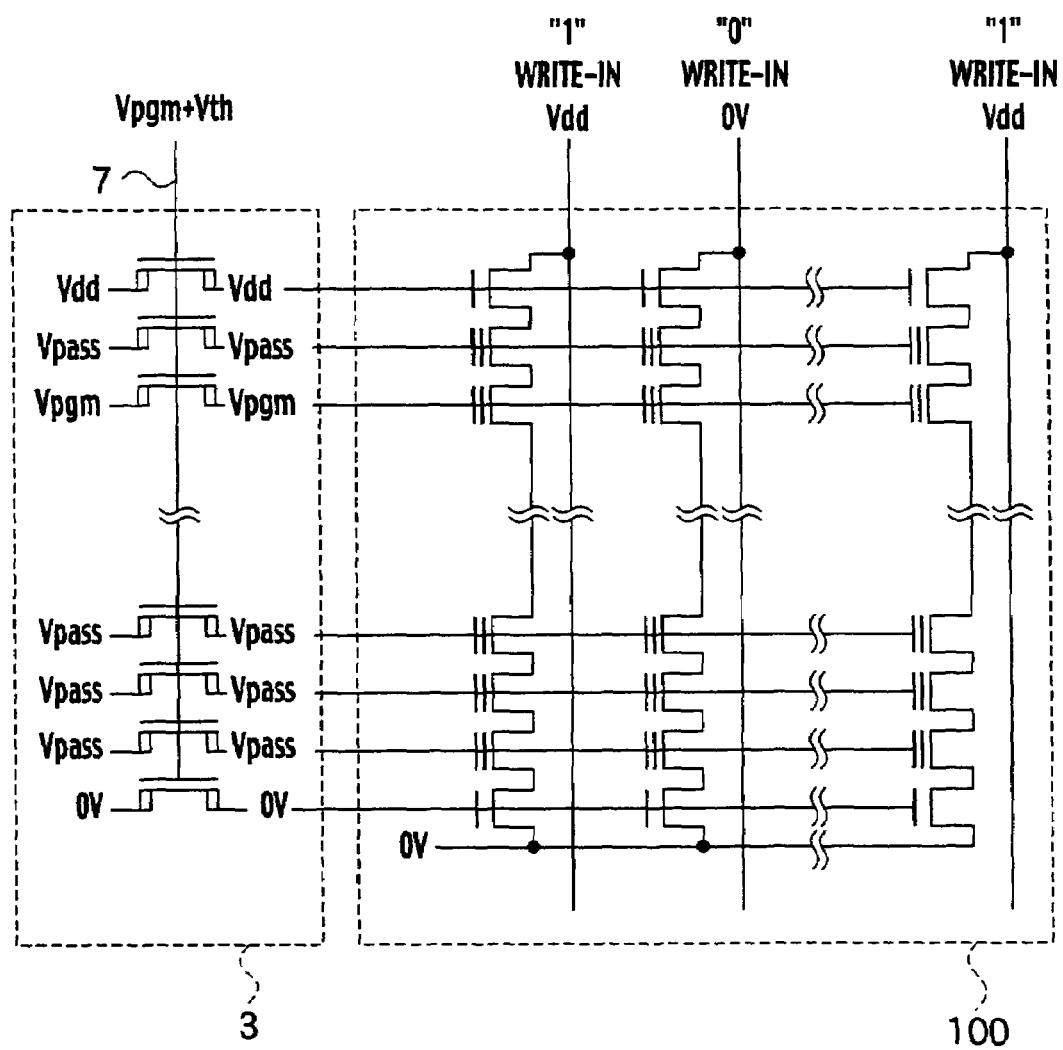
FIG. 3 is a schematic circuit diagram showing the write-in operation of a NAND type EEPROM as the nonvolatile semiconductor memory device according to the first embodiment of the present invention (In the instance of a write-in selected block).
Figure 4:
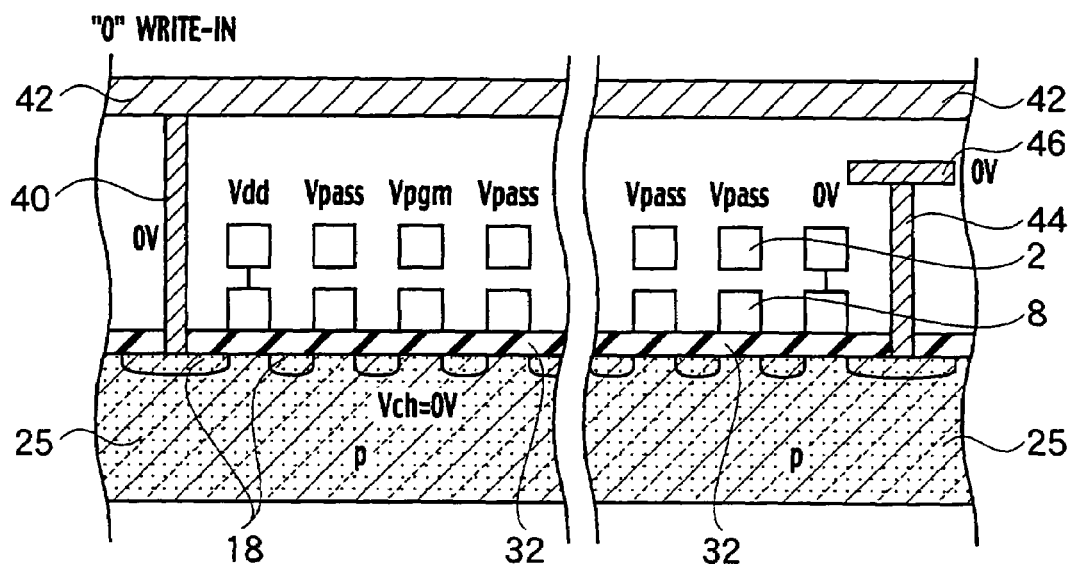
FIG. 4 is a schematic cross section diagram of a NAND type memory cell's structure showing the "0" write-in operation on the nonvolatile semiconductor memory device according to the first embodiment of the present invention, corresponding to FIG. 3.

As an example of the write-in operation of the NAND type EEPROM of the write-in selected block of the nonvolatile semiconductor memory device according to the first embodiment of the present invention, the electric potential of each part is set, as shown in FIG. 3. More specifically, a power supply voltage of 2.5V is given to the "1" write-in bit line, and 0V is given to the "0" write-in bit line in the instance of a write-in selected block. The transfer gate line 7 of the word line transfer transistor unit 3 is set to an electric potential of $V_{pgm}+V_{th}$ (in the range of 25V). And for instance, the power supply voltage $V_{dd}$ or 0V is supplied to the select gate lines SGD, SGS, and the programming voltage $V_{pgm}$ or intermediate voltage $V_{pass}$ is applied to the word lines WL0 through WLm. In regard to the electric potential of each part on the cross section structure of the basic elements of the memory cell transistors MC0 through MCm that have been selected by "0", the selected memory cell transistor's control gate 2 is given the programming voltage $V_{pgm}$ in the range of 20V, the write-in unselected memory cell transistor's control gate 2 is given the intermediate voltage $V_{pass}$ in the range of 10V, the bit line side select gate line SGD is given the $V_{dd}$ in the range of 2.5V, the source line side select gate line SGS is given 0V, as shown in FIG. 4.

Figure 6:
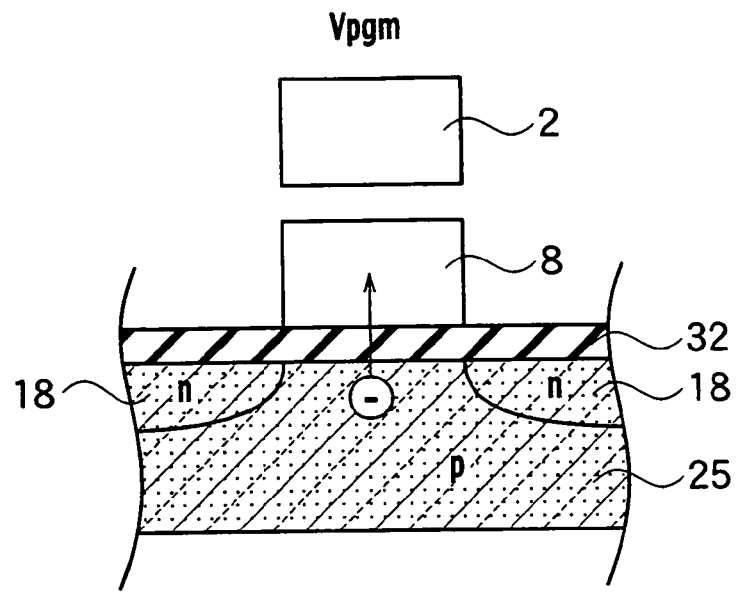
FIG. 6 is a schematic cross section diagram showing the write-in operation that injects electrons into a floating gate on the basic structure of a memory cell
Figure 7:
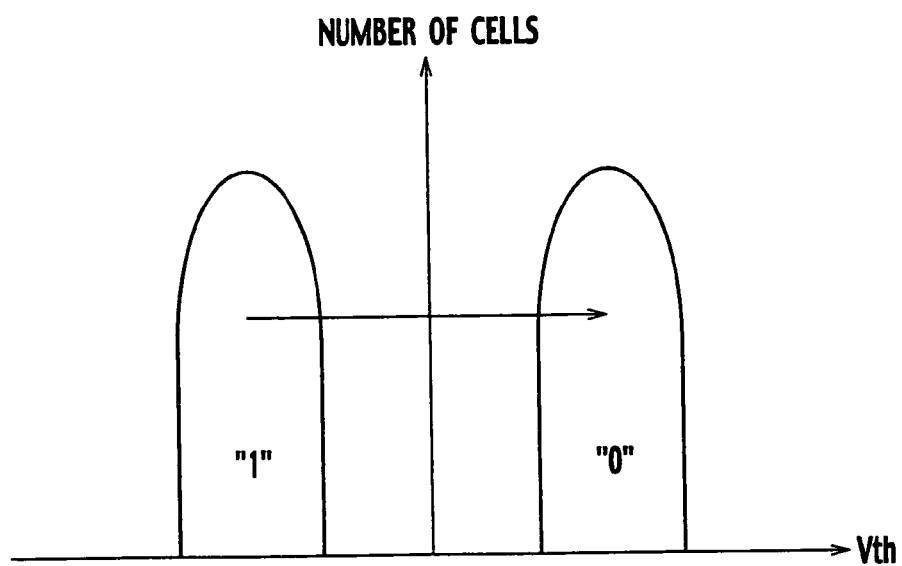
FIG. 7 is a diagram showing a shift in the threshold voltage distribution when electrons are injected into the floating gate, on the basic structure of a memory cell.

In "0" write-in, the bit line electric potential of 0V is supplied to the channel surface through the select gate transistor. Therefore, a high electric field is applied to the selected memory cell transistor's tunnel insulating film 32, and electrons are injected into the floating gate 8 according to the Fowler Nordheim (FN) current, as shown in FIG. 6. As a result, write-in is performed while the value of the threshold voltage $V_{th}$ changes, as shown in FIG. 7. Because only the intermediate voltage $V_{pass}$ is needed on the write-in unselected memory cell transistor's control gate 2, the value of the threshold voltage $V_{th}$ of the memory cell transistor will remain unchanged, as the more the FN current flows, the lower the electric field of the channel in between the floating gate 8 and the p-well region 25 will be.

Figure 5:
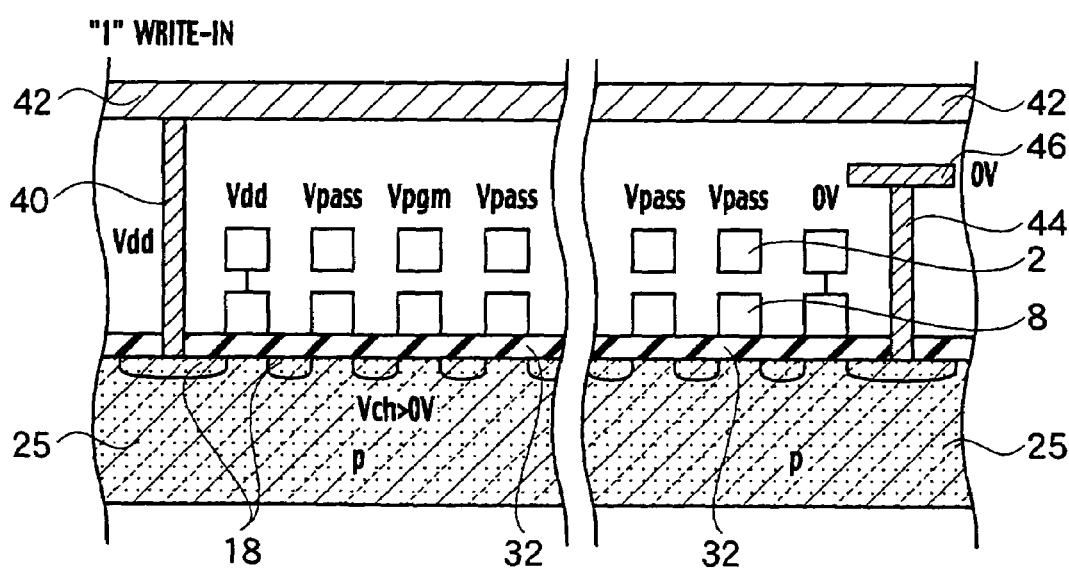
FIG. 5 is a schematic cross section diagram of a NAND type memory cell's structure showing the "1" write-in operation on the nonvolatile semiconductor device according to the first embodiment of the present invention, corresponding to FIG. 3.

In regard to the electric potential of each part on the cross section structure of the basic elements of the memory cell transistors MC0 through MCm that have been selected by "1", the selected memory cell transistor's control gate 2 is given the programming voltage $V_{pgm}$ in the range of 20V, the write-in unselected memory cell transistor's control gate 2 is given the intermediate voltage $V_{pass}$ in the range of 10V, the bit line side select gate line SGD is given the $V_{dd}$ in the range of 2.5V, the source line side select gate line SGS is given 0V, as shown in FIG. 5.

In "1" write-in, the bit line side select gate transistor S2 is in the OFF state because the power supply voltage $V_{dd}$ is supplied as the bit line electric potential. Therefore, the electric potential of the channel $V_{ch}$ assumes a floating state. When the programming voltage $V_{pgm}$ is applied to the selected memory cell transistor's control gate 2, the electric potential of the channel increases according to the capacitance coupling. Therefore, the value of the threshold voltage $V_{th}$ of the memory cell transistor will remain unchanged, as the more the FN current flows, the lower the electric field of the channel in between the floating gate 8 and the p-well region 25 will be.

Figure 8:
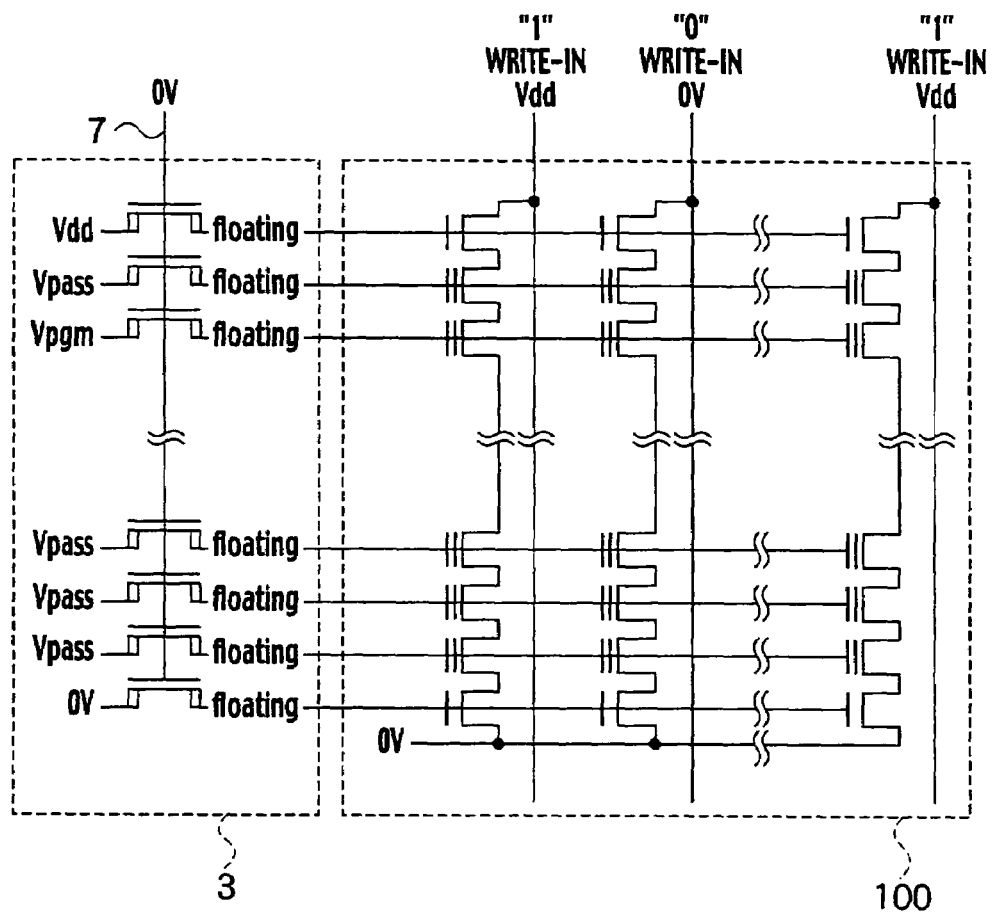
FIG. 8 is a circuit diagram showing the write-in operation of the NAND type EEPROM as the nonvolatile semiconductor device according to the first embodiment of the present invention (In the instance of a write-in unselected block).
Figure 9:
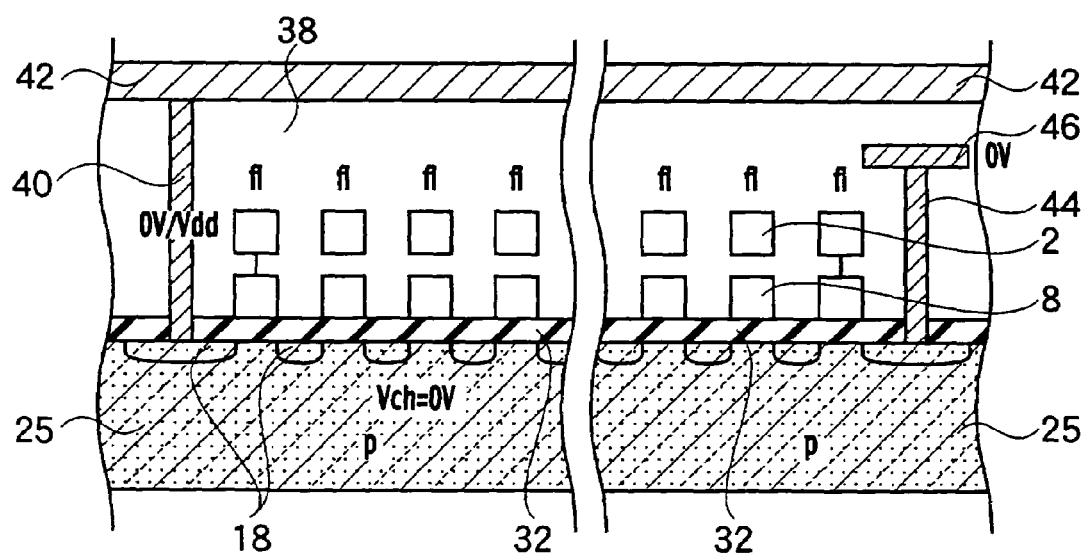
FIG. 9 is a schematic cross section diagram showing the operation of a NAND type memory cell of a write-in selected block on the nonvolatile semiconductor memory device according to the first embodiment of the present invention, corresponding to FIG. 8.

As an example of the write-in operation of the NAND type EEPROM of the write-in unselected block of the nonvolatile semiconductor memory device according to the first embodiment of the present invention, the electric potential of each part is set, as shown in FIG. 8. More specifically, a power supply voltage of 2.5V is given to the "1" write-in bit line, and 0V is given to the "0" write-in bit line in the instance of a write-in unselected block. Because the electric potential of the transfer gate line 7 of the word line transfer transistor unit 3 is 0V, the word line transfer transistors WTD, WT0 through WTm, WTS assume an OFF state, and the voltage of the word line drive signal line CG0 through CGm is not sent to the word lines WL0 through WLm. Therefore, all the select gate lines SGD, SGS, and the word lines WL0 through WLm assume a floating state, and as a result, there will be no voltage applied to the control gate 2 of the memory cell transistors MC0 through MCm, and the write-in operation will not be performed.

In regard to the electric potential of each part on the cross section structure of the basic elements of the memory cell transistors MC0 through MCm that are unselected, even if the bit line BL is given the voltage $V_{dd}$ or 0V, the electric potential of the select gate lines SGD, SGS of the select gate transistors S1, S2 are in a floating state, thus the select gate transistors S2, S1 assume a cut off state.

As a result, the control gates 2 of the memory cell transistors MC0 through MCm all assume a floating state. The electric potential of the channel $V_{ch}$ remains at its initial state of 0V, and because only the floating electric potential is needed on the write-in unselected memory cell transistor's control gate 2, the value of the threshold voltage $V_{th}$ of the memory cell transistor will remain unchanged, as the more the FN current flows, the lower the electric field of the channel in between the floating gate 8 and the p-well region 25 will be.

(Erasing Operation)

Figure 10:
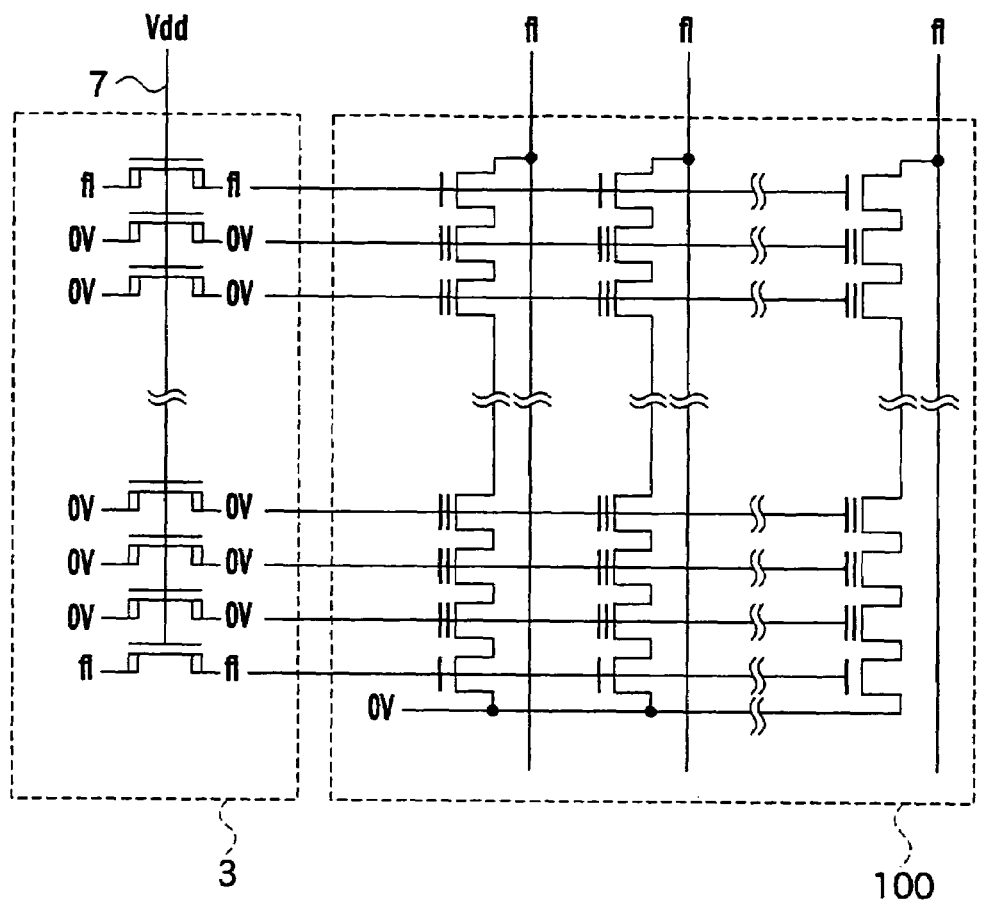
FIG. 10 is a circuit diagram showing the erasing operation of the NAND type EEPROM as the nonvolatile semiconductor memory device according to the first embodiment of the present invention (In the instance of an erase selected block).

As an example of the erasing operation of the NAND type EEPROM of the erase selected block of the nonvolatile semiconductor memory device according to the first embodiment of the present invention, the electric potential of each part is set, as shown in FIG. 10. More specifically, the erase selected block's bit line is in a floating state, and the transfer gate line 7 of the word line transfer transistor 3 is given a power supply voltage in the range of 2.5V, and 0V is given to the word lines WL0 through WLm through the word line transfer transistors WT0 through WTm. On one side, the floating electric potential is given to the select gate lines SGD, SGS, due to the word line transfer transistors WTD, WTS being in a cut off state. During erasing, an erasing voltage $V_{era}$ in the range of 20V is applied to the p-well region 25.

Figure 11:
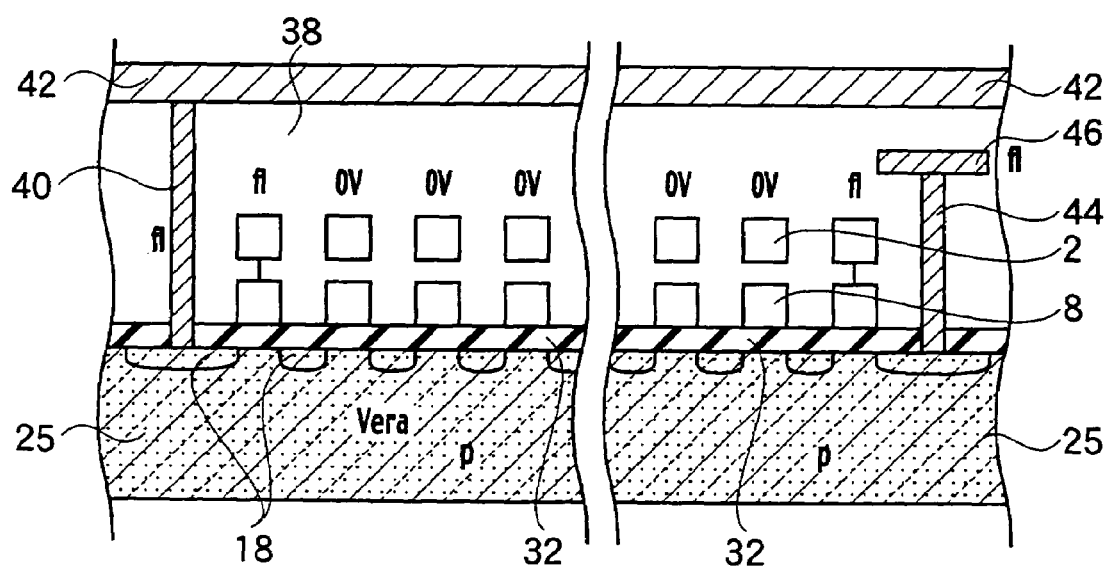
FIG. 11 is a schematic cross section diagram showing the operation of the NAND type EEPROM of the erase-selected block on the nonvolatile semiconductor device according to the first embodiment of the present invention.
Figure 12:
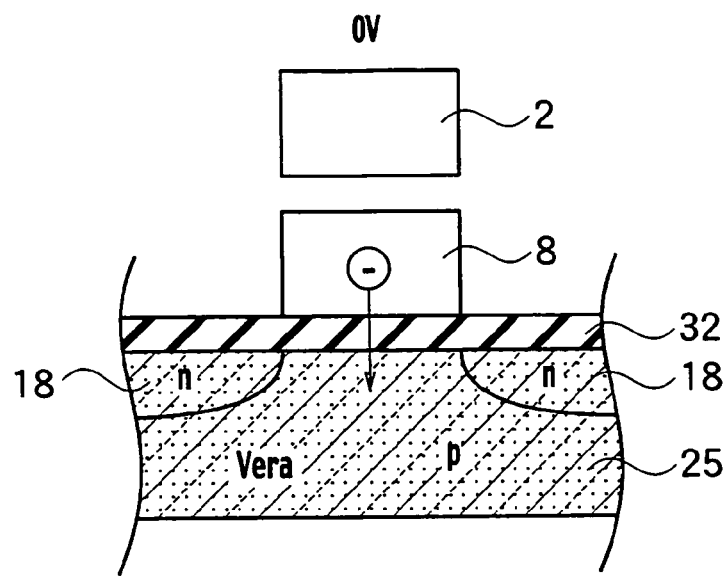
FIG. 12 is a schematic cross section diagram showing the erasing operation that sweeps electrons out of the floating gate on the basic structure of the memory cell.
Figure 13:
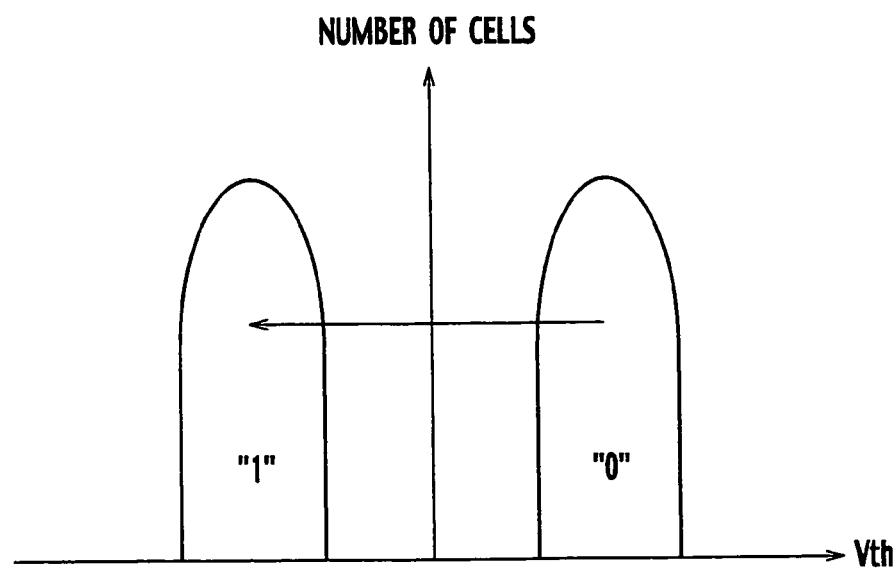
FIG. 13 is a diagram showing a shift in the threshold voltage distribution when injected-electrons are swept out of the floating gate, on the basic structure of a memory cell.

In regard to the electric potential of each part on the cross section structure of the basic elements of the memory cell transistors MC0 through MCm of the block that has been erase selected, the control gates 2 of the memory cell transistors that have been erase selected are given 0V, the select gate line SGD on the bit line side, and the select gate line SGS on the source line side are given the floating electric potential, as shown in FIG. 11. Because a high erasing voltage $V_{era}$ in the range of 20V is applied to the p-well region 25 during erasing, the memory cell transistor's tunnel insulating film 32 requires a high electric field, and the electrons are swept out from the floating gate 8 to the p-well region 25 according to the Fowler Nordheim (FN) current, as shown in FIG. 12.

Figure 14:
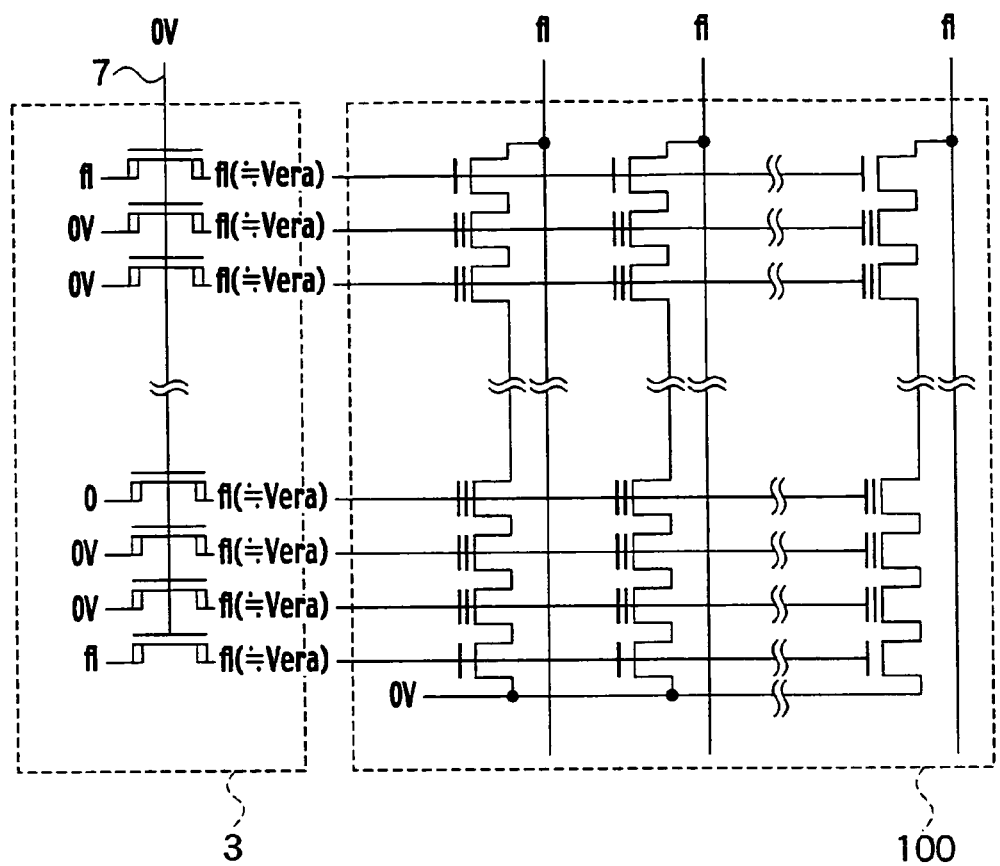
FIG. 14 is a circuit diagram showing the erasing operation of the NAND type EEPROM as the nonvolatile semiconductor memory device according to the first embodiment of the present invention (In the instance of an erasing unselected block).

As an example of the erasing operation of the NAND type EEPROM of the erase unselected block of the nonvolatile semiconductor memory device according to the first embodiment of the present invention, the electric potential of each part is set, as shown in FIG. 14. More specifically, the electric potential of the bit line is put in a floating state, in the instance of an erase unselected block. And because the electric potential of the transfer gate line 7 of the word line transfer transistor unit 3 is 0V, the word line transfer transistors WTD, WT0 through WTm, WTS assume an off state, and a word line driver voltage is not sent to the word lines WL0 through WLm. Therefore, the select gate lines SGD, SGS, the word lines WL0 through WLm all assume a floating state. As a result, the control gates 2 of the memory cell transistors MC0 through MCm all assume a floating state.

Figure 15:
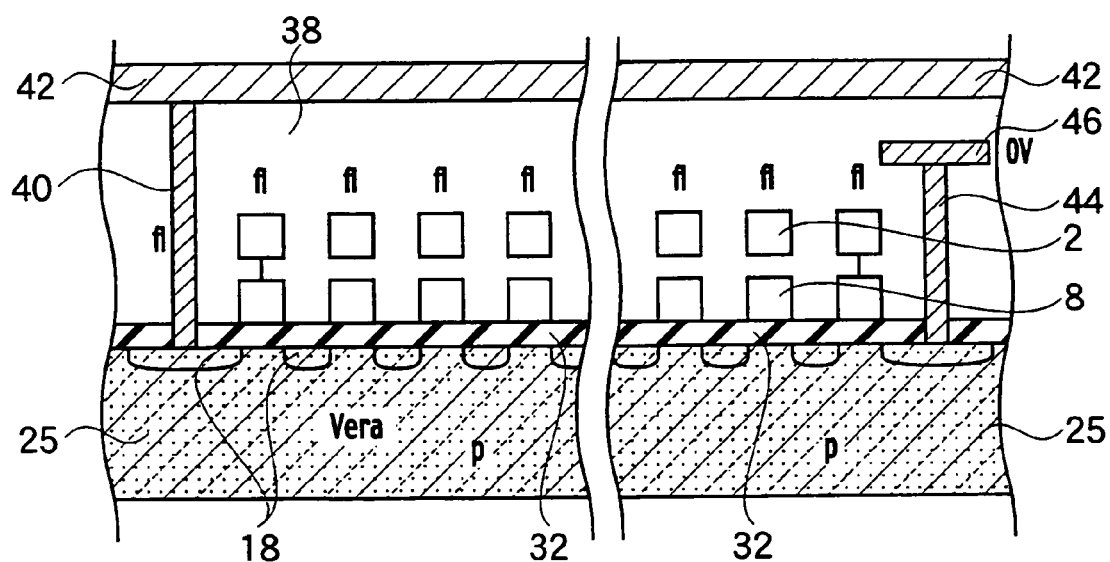
FIG. 15 is a schematic cross section diagram showing the operation of a NAND type memory cell of an erasing unselected block on the nonvolatile semiconductor memory device according to the first embodiment of the present invention, corresponding to FIG. 14.

Regarding the electric potential of the cross section structure of the elements of the memory cell transistors MC0 through MCm of the erase unselected blocks, the electric potential of the bit line BL is in a floating state, and the select gate line SGD and SGS of the select gate transistors S2 and S1 are also in a floating state, as shown in FIG. 15. Because of this, select gate transistors S1 and S2 assume a cut off state, and as a result, the control gates 2 of the memory cell transistors MC0 through MCm all assume a floating state. A high erasing voltage $V_{era}$ in the range of 20V is applied to the p-well region 25 of the erase unselected block, and the control gates 2 also reach a high voltage near the erasing voltage $V_{era}$ due to the capacitance coupling. As a result, the threshold value $V_{th}$ of the memory cell transistors will remain unchanged, as the more the FN current flows, the lower the electric field applied to the channel formed in between the floating gate 8 and the p-well region 25 will be.

As described above, on the write-in and erasing operations of the nonvolatile semiconductor memory device according to the first embodiment of the present invention, an intermediate voltage $V_{pass}$, and an electric potential of 0V are given to the word lines WL0 through WLm according to the on and off states of the word line transfer transistors WTD, WT0 through WTm and WTS. Also, the floating also is executed according to the on and off states of the word line transfer transistors WTD, WT0 through WTm and WTS. In order for the write-in and erasing operations to be performed correctly, the word line transfer transistors WTD, WT0 through WTm, and WTS must be able to perform the switching of the programming voltage $V_{pgm}$ and the erasing voltage $V_{era}$ in the range of 20V.

(The Main Relationships of the Voltages Applied to the Word Line Transfer Transistors)

Figure 16A:
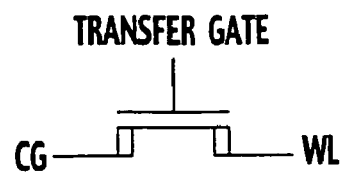
FIG. 16A is an equivalent circuit diagram that expresses the main relationship of the voltage applied to the word line transfer transistor.

On the word line transfer transistor's equivalent circuit shown in FIG. 16A, one end of the word line transfer transistor's source and drain diffusion layer is connected to the word line drive signal line CG, and the other end is connected to the word line. The gate electrode is connected to the transfer gate line 7.

Figure 16B:
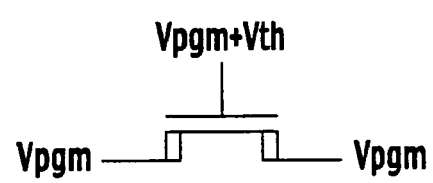
Figure 16C:
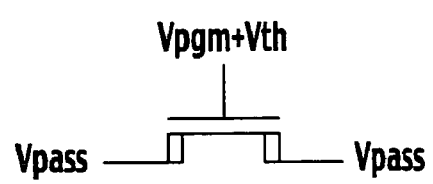

The voltage relationships of the block selected during data write-in are given to the select block in the manner shown in FIGS. 16B and 16C, and the write-in voltage $V_{pgm}$ and the intermediate voltage $V_{pass}$ are transferred. At this time, it is essential to bias the transfer gate line 7 to $V_{pgm}+V_{th}$. This is to transfer the programming voltage $V_{pgm}$ without the threshold voltage dropping, as it is essential to apply a voltage corresponding to the value of the threshold voltage of the word line transfer transistor by adding to the voltage to be transferred. The value of the threshold voltage $V_{th}$ at this time is the same as the value of the threshold voltage of the word line transfer transistor in the instance where a backward biased voltage corresponding to the programming voltage $V_{pgm}$ is applied.

The lower the threshold voltage value $V_{th}$ is, the more possible it is to reduce the voltage applied to the transfer gate line 7, which is beneficial when considering the breakdown voltage of the gate oxide film, the size reduction of the peripheral circuitry, and the like.

Figure 16D:
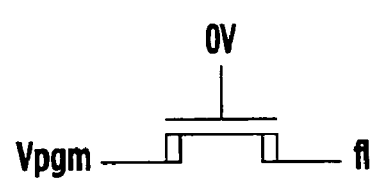
Figure 16E:
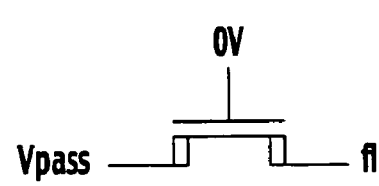
Figure 16F:
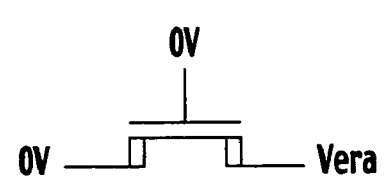
FIG. 16F is an equivalent circuit diagram that expresses the main relationship of a voltage of the block unselected during data erasing.

Regarding the voltage relationships of the block unselected during data write-in, as shown in FIGS. 16D and 16E, by biasing the transfer gate line 7 to 0 v, the intermediate voltage $V_{pass}$ and the programming voltage $V_{pgm}$ supplied by the word line drive signal line CG are cut off. Regarding the voltage relationships of the block unselected during data erasing, as shown in FIG. 16F, in order to maintain the voltage of the word line WL increased by the erasing voltage $V_{era}$ according to the capacitive-coupling, the word line transfer transistor is cut off by biasing the transfer gate line 7 to 0V.

Figure 16G:
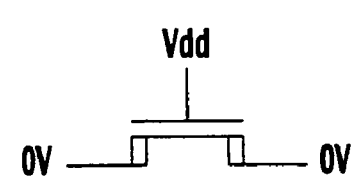
FIG. 16G is an equivalent circuit diagram that expresses the main relationship of a voltage of the block selected during data erasing.

On the other hand, the voltage relationships of the block selected during data erasing, as shown in FIG. 16G, in order to transfer the 0V supplied by the word line drive signal line CG to the word line WL, the power supply voltage $V_{dd}$ is applied to the transfer gate line 7.

In the manner put forth above, because it is necessary for the word line transfer transistor to transfer as well as cut off high voltages (in the range of 20V) like those of the programming voltage $V_{pgm}$ and the erasing voltage $V_{era}$, it is essential to secure the breakdown voltage of the pn junction of the word line transfer transistor's source and drain diffusion layers, and the cut off breakdown voltage of in between the source and drain regions. Further, on the field-inverted breakdown voltage of the p-well region 25 serving as the semiconductor region that is the bottom layer of the element isolation region in between the word line transfer transistors also, it is essential to secure capabilities that can handle voltages higher than the programming voltage $V_{pgm}$ and the erasing voltage $V_{era}$.

(Constitution of the Memory Cell Array and the Block-switching Unit)

Figure 17:
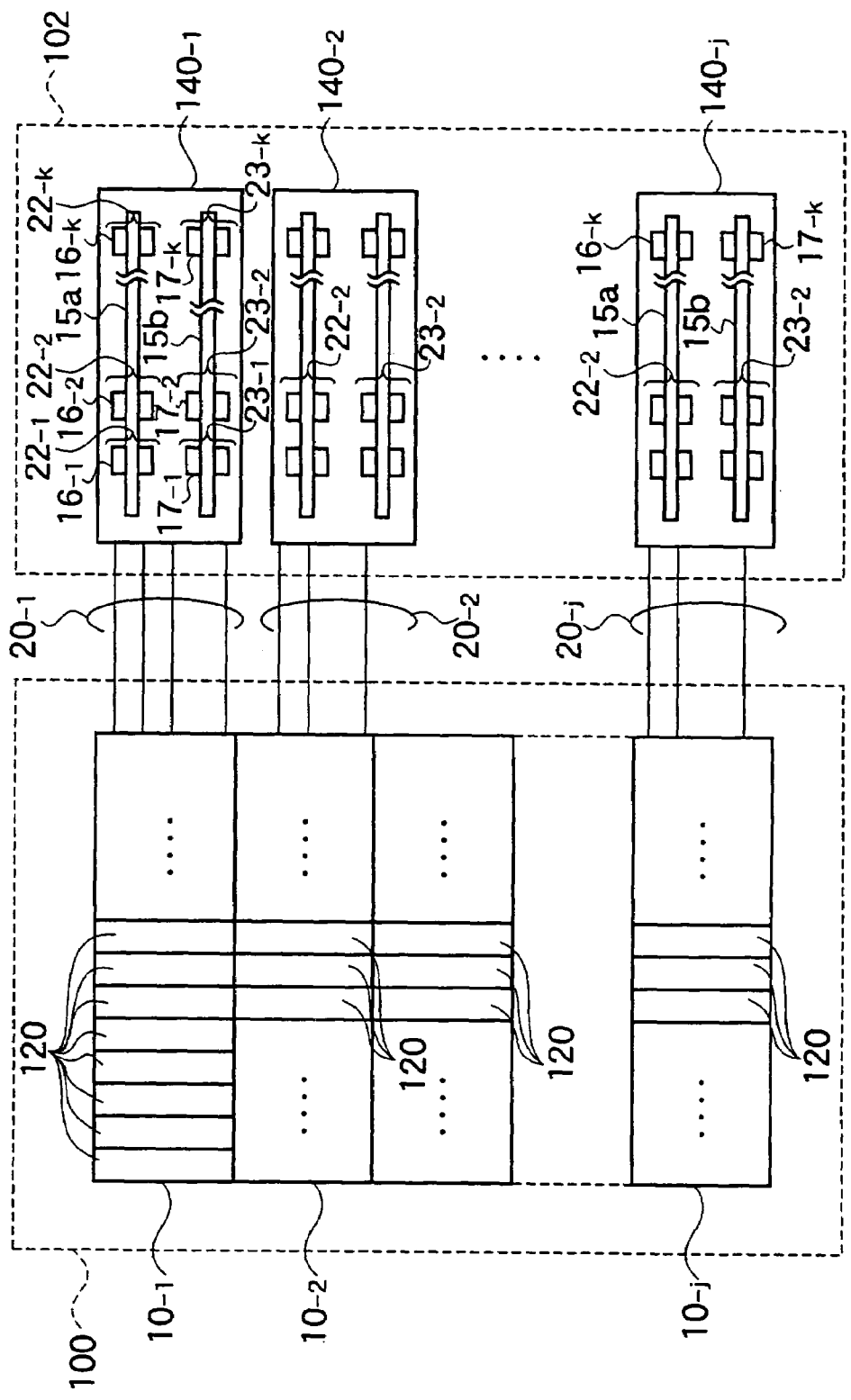
FIG. 17 is a schematic constitution diagram showing a memory cell array and a block-switching unit on the nonvolatile semiconductor memory device according to the first embodiment of the present invention.
Figure 18:
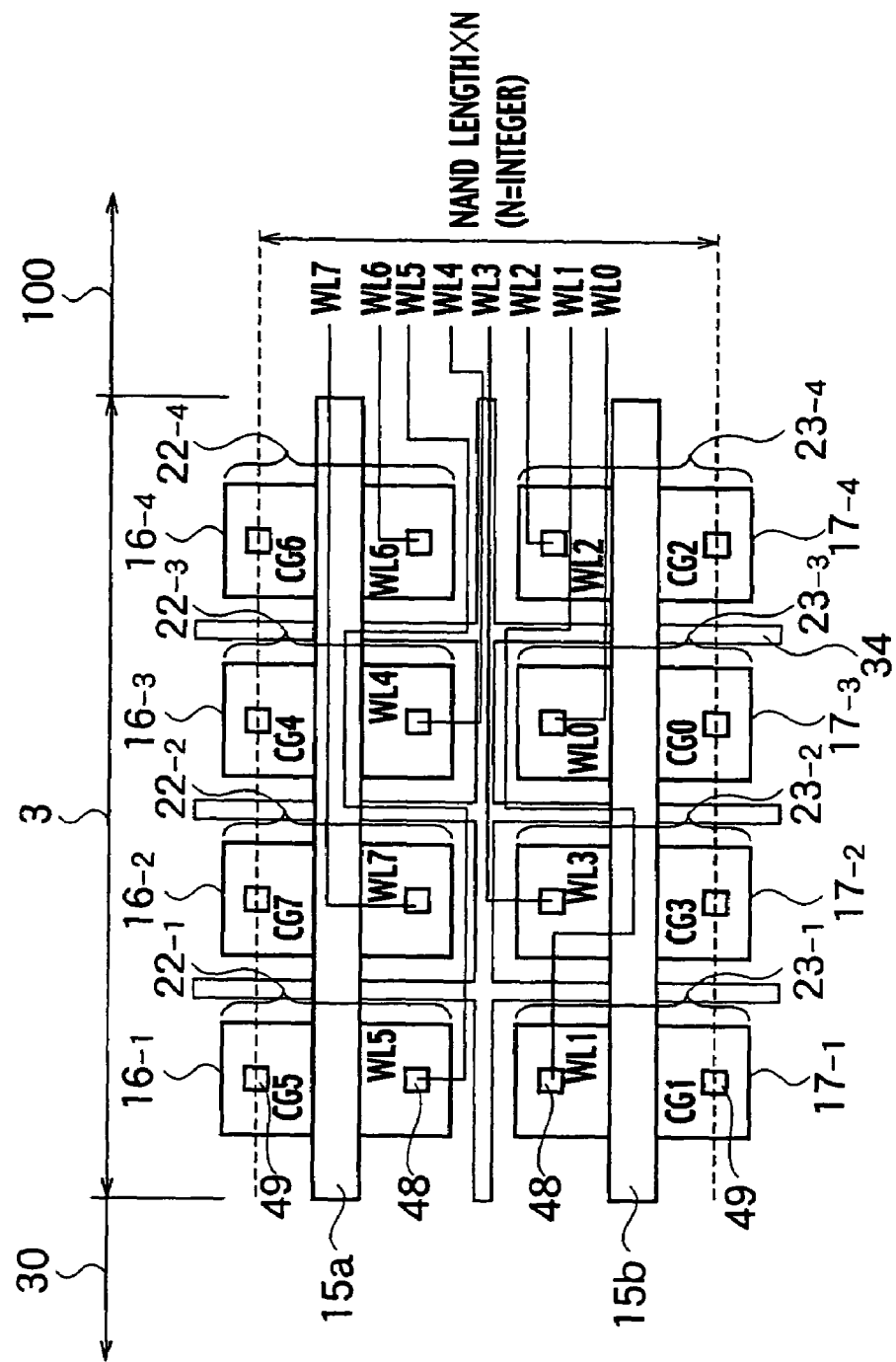
FIG. 18 is a constitution diagram of the layout pattern of a word line transistor on the nonvolatile semiconductor memory device according to the first embodiment of the present invention (In an instance constituting a NAND cell block with eight of the memory cell transistors of the first layout pattern example).
Figure 19:
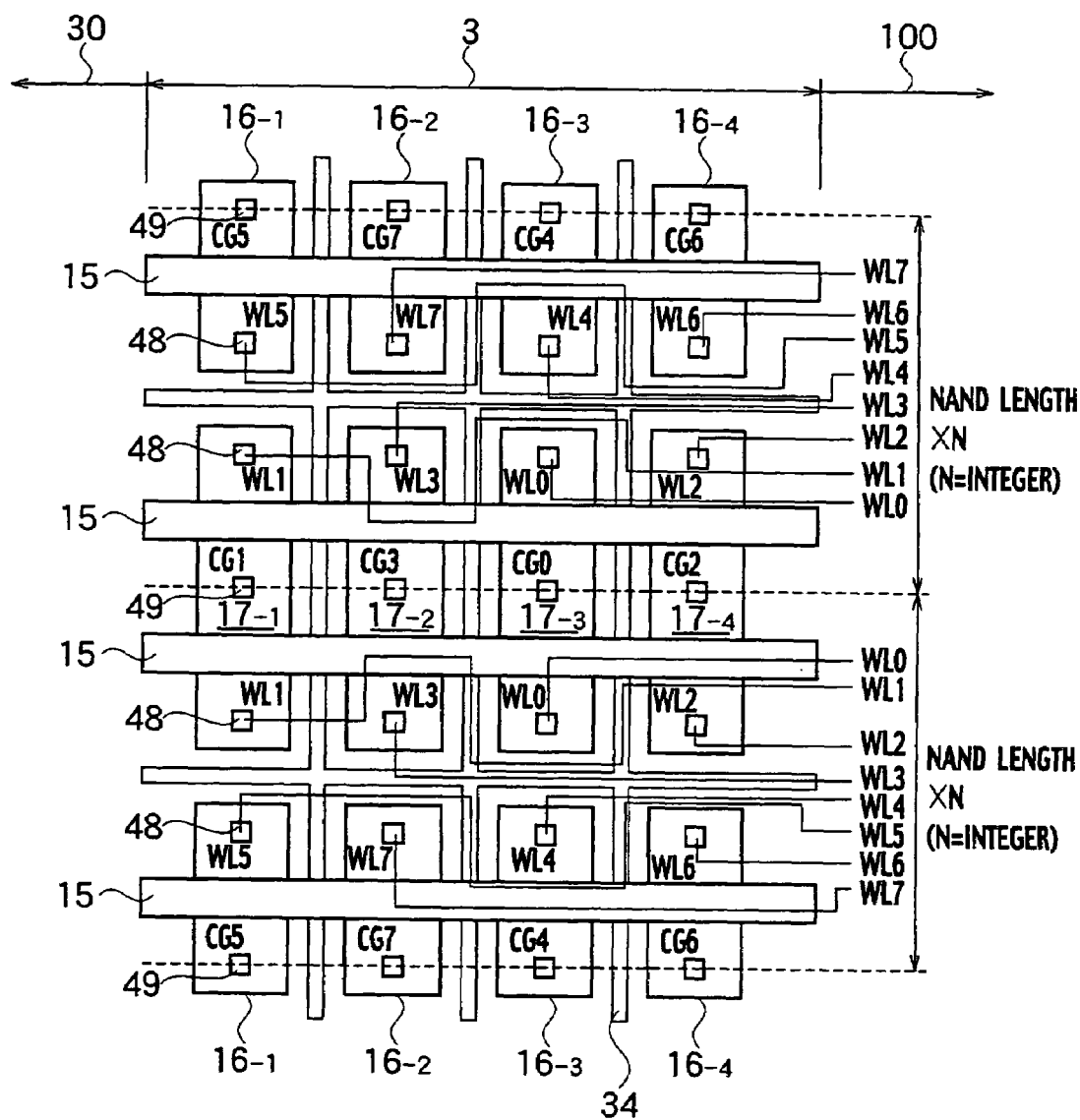
FIG. 19 is a constitution diagram of the layout pattern of a word line transistor on the nonvolatile semiconductor memory device according to the first embodiment of the present invention (In an instance constituting a NAND cell block with two of the memory cell transistors of the second layout pattern example).

On the nonvolatile semiconductor memory device according to the first embodiment of the present invention, the relationship of the connection of the memory cell 100 array and a block switching unit 102 is shown in FIG. 17. In the memory cell array 100, a plurality of the memory cell blocks are divided into 10-1, 10-2, 10-3, . . . , 10-j, and a memory cell unit 120 is lined in a row inside of each of the memory cell blocks 10-1, 10-2, 10-3, . . . , 10-j. Word lines 20-1, 20-2. 20-3, . . . , 20-j are wired in between the memory cell blocks 10-1, 10-2, 10-3, . . . , 10-j and the block switching unit 102. The relatively high voltages like the programming voltage $V_{pgm}$ generated inside of the block switching unit 102 are transferred to the control gates 2 of the memory cell transistors inside of the memory cell unit 120, through the word lines 20-1, 20-2. 20-3, . . . , 20-j. Block select circuit units 140-1, 140-2, 140-3, . . . , 140-j are disposed inside of the block switching unit 102 corresponding to each of the memory cell blocks 10-1, 10-2, 10-3, . . . , 10-j. As shown in FIG. 17, as an example, a plurality of word line transfer transistors 22-1, 22-2, 22-3, . . . , 22-k and 23-1, 23-2, 23-3, . . . , 23-k, active areas 16-1, 16-2, 16-3, . . . , 16-k and 17-1, 17-2, 17-3, . . . , 17-k, a gate electrode 15a, and a gate electrode 15b are disposed inside of each of the block select circuit units 140-1, 140-2, 140-3, . . . , 140-j. The active areas 16-1, 16-2, 16-3, . . . 16-k and 17-1, 17-2, 17-3, . . . , 17-k correspond to each of the word line transfer transistors 22-1, 22-2, 22-3, . . . , 22-k and 23-1, 23-2, 23-3, . . . , 23-k. The gate electrode 15a is connected in common on top of the active areas 16-1, 16-2, 16-3, . . . , 16-k, and the gate electrode 15b is connected in common on top of the active areas 17-1, 17-2, 17-3, . . . , 17-k. Further, although the state of a word line contact plug 48 and the word lines 20-1, 20-2, 20-3, . . . , 20-j formed inside of the active areas 16-1, 16-2, 16-3, . . . , 16-k and 17-1, 17-2, 17-3, 17-k and being connected is not shown in FIG. 17, this state is shown in FIG. 18 and FIG. 19.

In FIG. 17, the memory cell unit 120 includes the circuit structure of the NAND cell unit shown in FIG. 1 for instance. The number of memory cell transistors connected in series is 8 for instance, but is not limited to being 8, it is acceptable to have 16, 32, 64 or more memory cell transistors.

Again, in FIG. 17, the active areas 16-1, 16-2, 16-3, . . . , 16-k and 17-1, 17-2, 17-3, 17-k of the plurality of word line transfer transistors 22-1, 22-2, 22-3, . . . , 23-1, 23-2, 23-3, . . . , 23-k are each isolated from one another by the element isolation region 28, although illustration is omitted from the FIGS.

(First Example of a Layout Pattern of the Word Line Transfer Transistor Unit)

The constitution of the layout pattern of the word line transfer transistor unit 3 of the nonvolatile semiconductor memory device according to the first embodiment of the present invention is constituted by the plurality of the word line transfer transistors 22-1, 22-2, 22-3, 22-4, and 23-1, 23-2, 23-3, 23-4 aligned in two rows, the active areas 16-1, 16-2, 16-3, 16-4, and 17-1, 17-2, 17-3, 17-4 of the plurality of word line transfer transistors 22-1, 22-2, 22-3, 22-4, and 23-1, 23-2, 23-3, 23-4, the word line contact plug 48 and CG line contact plug 49 (word line drive signal line contact plug) formed inside of the active areas 16-1, 16-2, 16-3, 16-4, and 17-1, 17-2, 17-3, 17-4, the gate electrodes 15a and 15b, and the word lines WL0 through WL7, using a case having eight memory cell transistors and the NAND memory cell block 10 of FIG. 17 as an example, as shown in FIG. 18. The word line contact plug 48 and CG line contact plug 49 are formed inside of the active areas 16-1, 16-2, 16-3, 16-4, and 17-1, 17-2, 17-3, 17-4, the gate electrodes 15a and 15b are connected in common with the gates of the plurality of word line transfer transistors 22-1, 22-2, 22-3, 22-4, and 23-1, 23-2, 23-3, 23-4 aligned in rows, and the word lines WL0 through WL7 are connected in common with the memory cell unit 120 that forms the memory cell block 10 inside of the memory cell array 100. Further, illustration concerning the electrode wiring given from the peripheral circuitry 30 and the like to the CG line contact plug 49 inside of the active areas 16-1, 16-2, 16-3, 16-4, and 17-1, 17-2, 17-3, 17-4 has been omitted from FIG. 18.

Eight word line transfer transistors are disposed in the manner shown in FIG. 18, and the word line contact plug 48 of each of the word line transfer transistors is connected to one of the word lines WL, and the CG line contact plug 49 is connected to the word line drive signal line CG. The 8 word line transfer transistors are disposed so as to occupy a length of the integral multiple of the length of a NAND.

(Second Example of a Layout Pattern of the Word Line Transfer Transistor Unit)

The constitution of another layout pattern of the word line transfer transistor unit 3 of the nonvolatile semiconductor memory device according to the first embodiment of the present invention is constituted by a plurality of word line transfer transistors aligned in three columns, the active areas 16-1, 16-2, 16-3, 16-4, and 17-1, 17-2, 17-3, 17-4 of the plurality of word line transfer transistors, the word line contact plug 48 and CG line contact plug 49 formed inside of the active areas 16-1, 16-2, 16-3, 16-4, and 17-1, 17-2, 17-3, 17-4, the gate electrode 15, and the word lines WL0 through WL7, as an example sharing the contact connected to the word line drive signal line CG and the diffusion layer in between the 2 NAND blocks, an shown in FIG. 19. The word line contact plug 48 and CG line contact plug 49 are formed inside of the active areas 16-1, 16-2, 16-3, 16-4, and 17-1, 17-2, 17-3, 17-4, and the gate electrode 15 is connected in common with the gates of the plurality of word line transfer transistors aligned in rows. Further, illustration concerning the electrode wiring given from the peripheral circuitry 30 and the like to the CG line contact plug 49 has been omitted from FIG. 19. Sharing the contact connected to the word line drive signal line CG and the diffusion layer in between the two NAND blocks makes it possible to reduce the surface area of the word line transfer transistors, as shown in FIG. 19. Also the disposal of the word line transfer transistors is carried out so as to repeat at the pitch of the integral multiple of the length of the NAND. The word line transfer transistors are isolated from each other by the element isolation layer 28, and a field stopper $p^+$ layer is disposed on the bottom of the element isolation region 28 in order to increase isolation performance. Illustration of this field stopper $p^+$ layer however is omitted from FIG. 19.

(Optimization of the Dimensions of the Word Line Transfer Transistors and Element Isolation Regions)

(Third Example of a Layout Pattern of the Word Line Transfer Transistor Unit)

Figure 20:
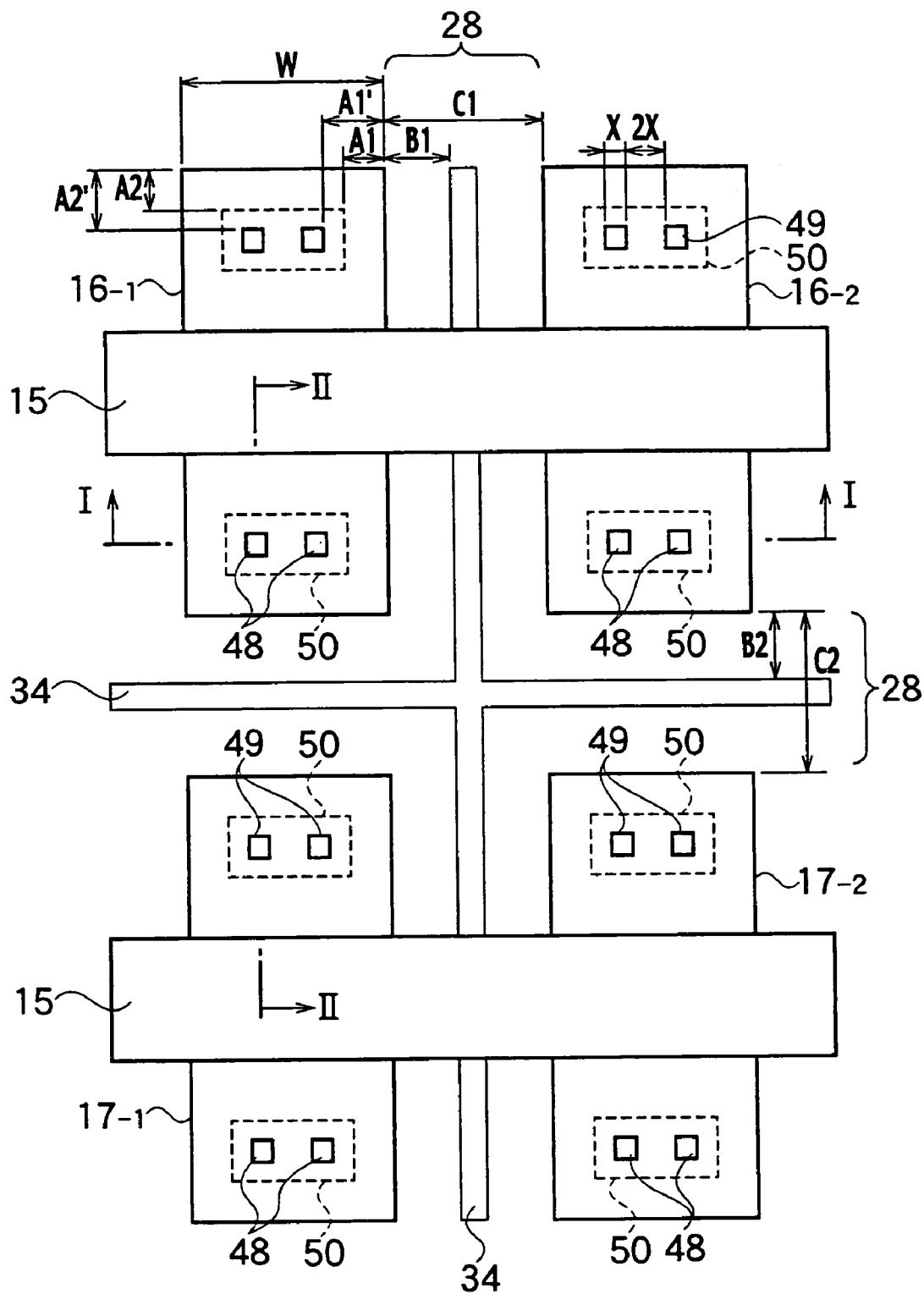
FIG. 20 is another constitution diagram of the layout pattern of the four adjacent word line transistors on the nonvolatile semiconductor memory device according to the first embodiment of the present invention (In an instance constituting a NAND cell block with the memory cell transistors of the third layout pattern example).

The constitution of the layout pattern of the four adjacent word line transfer transistor of the nonvolatile semiconductor memory device according to the first embodiment of the present invention is constituted by the active areas 16-1, 16-2, and 17-1, 17-2 of the plurality of the word line transfer transistors aligned in two rows, two each of the word line contact plug 48 and CG line contact plug 49 formed inside of the active areas 16-1, 16-2, and 17-1, 17-2, the gate electrode 15, the element isolation region 28 , and a field stopper $p^+$ layer 34, as shown in FIG. 20. The gate electrode 15 is connected in common with the gates of the plurality of word line transfer transistors aligned in rows, the element isolation region 28 separates each of the active areas 16-1, 16-2, and 17-1, 17-2 from each other, and the field stopper $p^+$ layer 34 is disposed on the bottom of the element isolation region 28.

Figure 21:
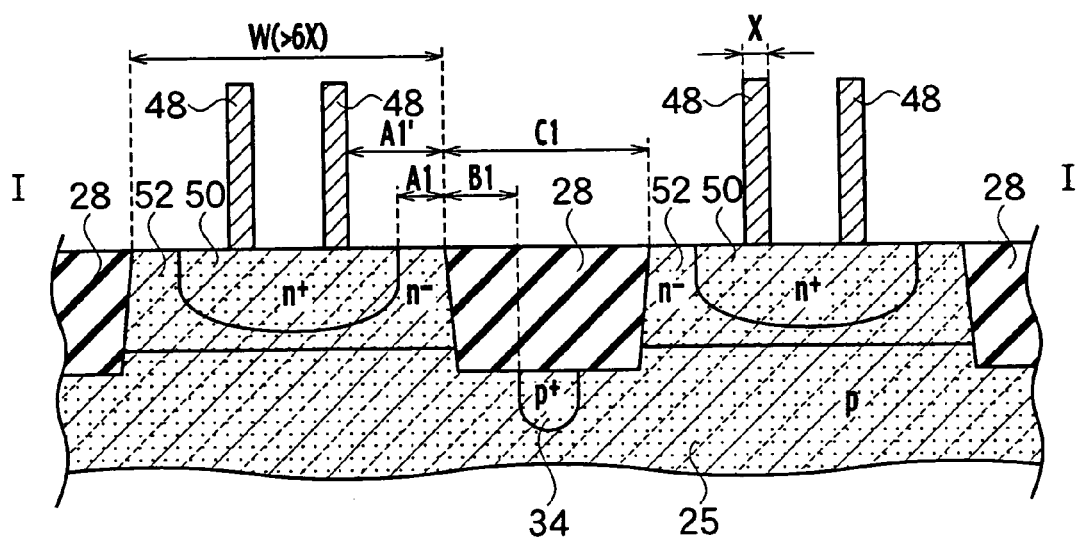
FIG. 21 is a schematic cross section diagram taken on the I—I line of FIG. 20 spanning parallel to the channel width, showing a word line transfer transistor.

In FIG. 21, the schematic cross section structure of the word line transfer transistor exhibited by the cross section taken along the I—I line spanning in the direction parallel to the channel width in FIG. 20, includes the p-well region 25, the element isolation region 28 formed inside of the p-well region 25, the field stopper $p^+$ layer 34, an $n^-$ diffusion layer 52, an $n^+$ diffusion layer 50, and the word line contact plug 48. The field stopper $p^+$ layer 34 is disposed on the bottom of the element isolation region 28, the $n^-$ diffusion layer 52 defines the active areas 16-1, 16-2, and the word line contact plug 48 is disposed two to every one of the $n^+$ diffusion layers 50.

Figure 22:
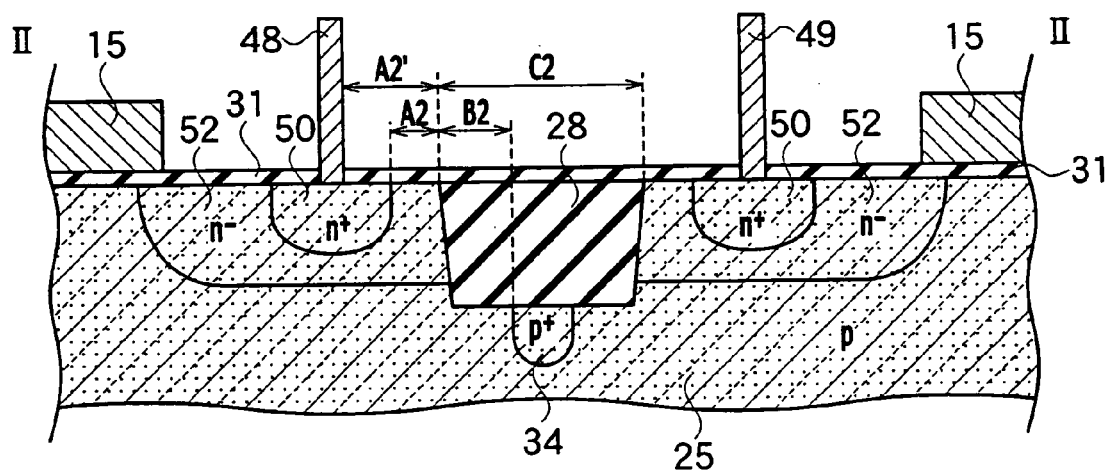
FIG. 22 is a schematic cross section diagram taken on the II—II line of FIG. 20 spanning orthogonal to the channel width, showing a word line transfer transistor.

In FIG. 22, the schematic cross section structure of the word line transfer transistor exhibited by the cross section taken along the II—II line spanning in the direction orthogonal to the channel width in FIG. 20, includes the p-well region 25, the element isolation region 28 formed inside of the p-well region 25, the field stopper $p^+$ layer 34, an $n^-$ diffusion layer 52, an $n^+$ diffusion layer 50, the word line contact plug 48 and the CG line contact plug 49, and the gate electrode 15. The field stopper p+ layer 34 is disposed on the bottom of the element isolation region 28, the n− diffusion layer 52 defines the active areas 16-1, 17-1, and the word line contact plug 48 and CG line contact plug 49 are disposed to the n+ diffusion layer 50.

The source and drain diffusion layers of the word line transfer transistor are formed by the n+ diffusion layer 50 and the n− diffusion layer 52. The n+ diffusion layer 50 has a high concentration of impurities and lies directly below the word line contact plug 48 and CG line contact plug 49. The n− diffusion layer 52 has a comparatively low concentration of impurities and is formed to cover the n+ diffusion layer 50. The n+ diffusion layer 50 is formed as an Arsenic (As) doped layer, and the n− diffusion layer 52 is formed as a phosphorous (P) doped layer, which is desirable in order to secure the junction breakdown voltage and suppress the short channel effect at the same time.

The field stopper p+ layer 34, having a relatively high concentration of impurities, is formed on the bottom of the element isolation region 28. It is also acceptable to form the word line transfer transistor on top of the p type semiconductor substrate 27, which has a relatively low concentration of impurities. Here, the impurity concentration of the field stopper p+ layer 34 is more than 100 times greater than the impurity concentrations of the p type semiconductor substrate 27 and the p-well region 25, which realizes a sufficient reverse field breakdown voltage, and is desirable in order to raise the junction breakdown voltage of in between the p type semiconductor substrate 27, the p-well region 25, and the n+ diffusion layer 50.

(The Relationship of the Dimensions and the Reduction of the Surface Area of the Word Line Transfer Transistor)

Guidelines concerning the dimensions are provided below for the purpose of raising the breakdown voltage and reducing the surface area of the word line transfer transistor on the nonvolatile semiconductor memory device according to the first embodiment of the present invention.

The channel width of the word line transfer transistor is defined as W, the distance between the n+ diffusion layer 50 and the edge of the element isolation region 28 is defined as A1 (direction parallel to the channel width), the distance between the word line contact plug 48 and the edge of the element isolation region 28 is defined as A1' (direction parallel to the channel width), the distance between the field stopper p+ layer 34 and the edge of the element isolation region 28 is defined as B1 (direction parallel to the channel width), the width of the element isolation region is defined as C1 (direction parallel to the channel width), the distance between the n+ diffusion layer 50 and the edge of the element isolation region 28 is defined as A2 (direction orthogonal to the channel width) the distance between the word line contact plug 48 and the edge of the element isolation region 28 is defined as A2' (direction orthogonal to the channel width), the distance between the field stopper p+ layer 34 and the edge of the element isolation region 28 is defined as B2 (direction orthogonal to the channel width), the width of the element isolation region is defined as C2 (direction orthogonal to the channel width), and the widths of the word line contact plug 48 and CG line contact plug 49 (or the diameters) are defined as X.

Here, in a case in which the word line transfer transistor has a plurality of the word line contact plug 48 on top of the same n+ diffusion layer 50, the word line contact plugs 48 defined as A1 and A2 are the closest word line contact plugs 48 to the edge of the element isolation region 28.

As shown in FIG. 20, it is desirable that the interval between the word line contact plug 48 and the CG line contact plug 49, in the case in which a plurality are disposed within a single n+ diffusion layer 50, is more than 2X, in order to secure the lithography margin.

Figure 23:
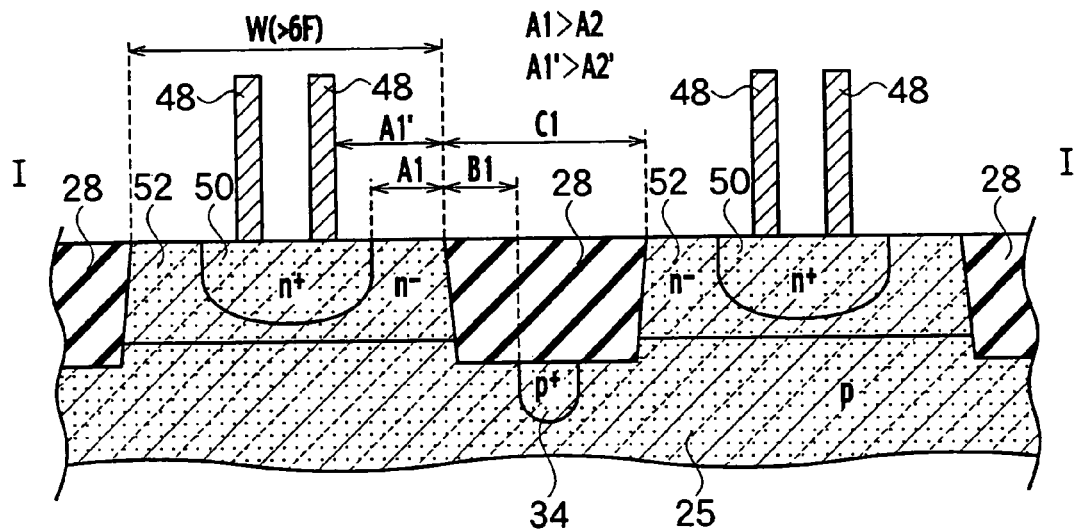
FIG. 23 is a schematic cross section diagram taken on the I—I line of FIG. 20 spanning parallel to the channel width, showing a word line transfer transistor in an example in which the dimensions A1' and A1 have been optimized.
Figure 24:
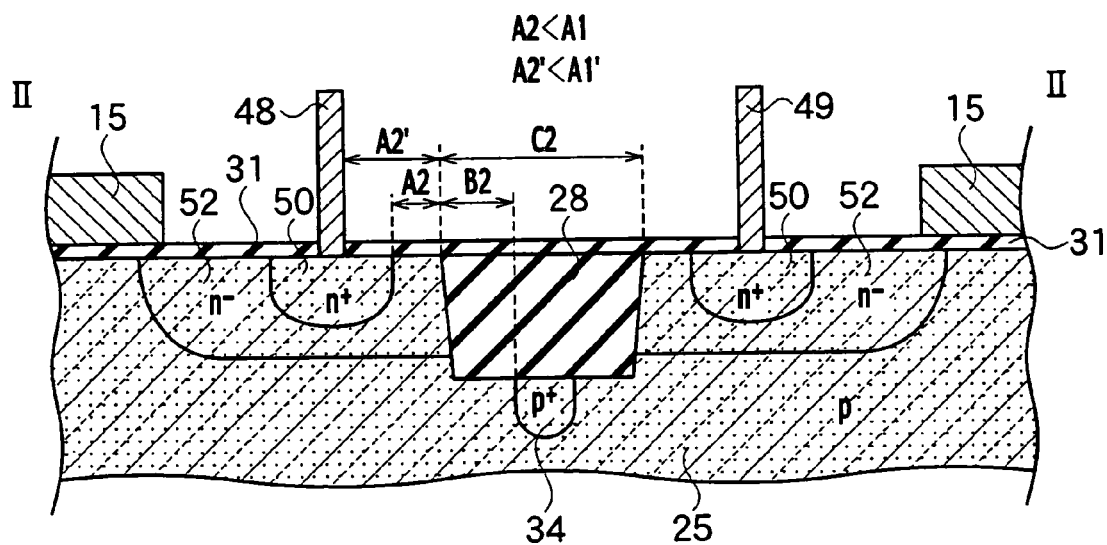
FIG. 24 is a schematic cross section diagram taken on the II—II line of FIG. 20 spanning orthogonal to the channel width, showing a word line transfer transistor in an example in which the dimensions A1' and A1 have been optimized.

In FIG. 23, the schematic cross section structure of the word line transfer transistor exhibited by the cross section taken along the I—I line spanning in the second direction parallel to the channel width in FIG. 20 is an example in which the dimensions of A1', which is the distance between the word line contact plug 48 and the edge of the element isolation region 28 (direction parallel to the channel width) and A1, which is the distance between the n+ diffusion layer 50 and the edge of the element isolation region 28 (direction parallel to the channel width) have been reduced, and the channel width W of the word line transfer transistor remains the same. In FIG. 24 on the other hand, the schematic cross section structure of the word line transfer transistor exhibited by the cross section taken along the II—II line spanning in the first direction orthogonal to the channel width in FIG. 20 is an example in which the dimensions of A2', which is the distance between the word line contact plug 48 and the edge of the element isolation region 28 (direction parallel to the channel width) and A2, which is the distance between the n+ diffusion layer 50 and the edge of the element isolation region 28 (direction parallel to the channel width) have been reduced, and the channel width W of the word line transfer transistor remains the same.

In FIGS. 23 and 24, A1 is attributively greater than A2 (A1>A2) and A1' is attributively greater than A2' (A1'>A2'). More specifically, A1, which is the distance between the n+ diffusion layer 50 and the edge of the element isolation region 28 in the second direction parallel to the channel width has the attribute of being comparatively greater than A2, which is the distance between the n+ diffusion layer 50 and the edge of the element isolation region 28 in the first direction orthogonal to the channel width. A1', which is the distance between the word line contact plug 48 and the edge of the element isolation region 28 in the second direction parallel to the channel width has the attribute of being comparatively greater than A2', which is the distance between the word line contact plug 48 and the edge of the element isolation region 28 in the first direction orthogonal to the channel width.

Figure 25:
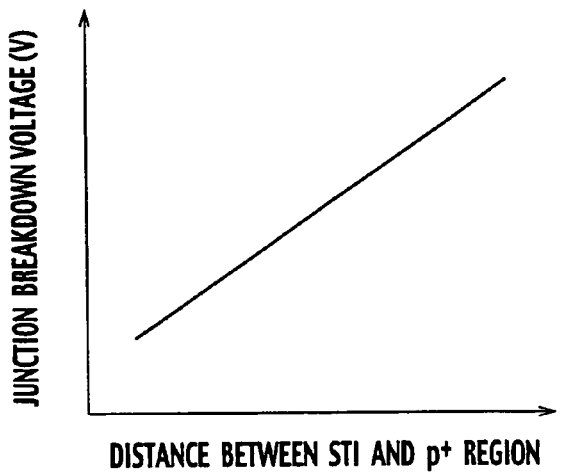
FIG. 25 is the relationship between the junction breakdown voltage in between the field stopper p$^+$ layer 34 and the n$^+$ diffusion layer 50, and the distance in between the element isolation region (STI) 28 and the field stopper p$^+$ layer 34.

The relationship between the junction breakdown voltage in between the field stopper p+ layer 34 and the n+ diffusion layer 50 and B1 or B2, which are the distances between the field stopper p+ layer 34 and the edge of the element isolation region 28 (STI), is expressed by the relationship shown in FIG. 25. In the same fashion, the relationship between the junction breakdown voltage in between the field stopper p+ layer 34 and the n+ diffusion layer 50 and A1 or A2, which are the distances between the n+ diffusion layer 50 and the edge of the element isolation region 28, is expressed by the relationship shown in FIG. 26. By increasing the value of A1 or A2, which are the distances between the n+ diffusion layer 50 and the edge of the element isolation region 28 (STI), it is possible to increase the value of the junction breakdown voltage.

Figure 27:
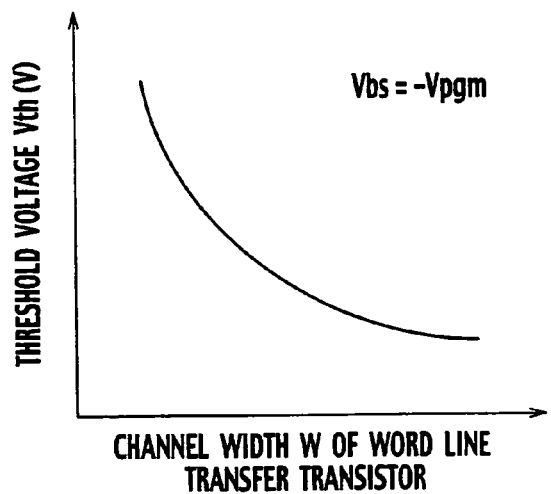
FIG. 27 is the relationship between the threshold voltage $V_{th}$ value during application of a backward biased voltage $V_{bs}(=-V_{pgm})$ and the channel width W of the of the word line transfer transistor.

On the other hand, the relationship between the threshold voltage $V_{th}$ value and the channel width W of the word line transfer transistor during application of the backward biased voltage $V_{bs}(=-V_{pgm})$ is expressed by the relationship shown in FIG. 27. The greater the channel width W of the word line transfer transistor becomes the smaller the threshold voltage $V_{th}$ value during the application of backward biased voltage $V_{bs}(=-V_{pgm})$ well become, which makes it possible to lower the gate voltage of the word line transfer transistor when transferring the programming voltage $V_{pgm}$. Because of this, it is desirable to increase the channel width W of the word line transfer transistor when considering factors such as the operation margin and the reduction of the surface area of the peripheral circuits.

Compared to the structures shown in FIGS. 21 and 22, the structure shown in FIGS. 23 and 24 exhibit a larger A1, which is the distance between the $n^+$ diffusion layer 50 and the edge of the element isolation region 28, and a larger A1', which is the distance between the word line contact plug 48 and the edge of the element isolation region 28, with the channel width of the word line transfer transistor remaining the same. Because of this, it is possible to increase the junction breakdown voltage without increasing the threshold voltage $V_{th}$ of the word line transfer transistor during application of a backward biased voltage $V_{bs}(=-V_{pgm})$. Also, because the channel width W of the word line transfer transistor remains the same, there is no increase in the surface area of the word line transfer transistor.

[Modified Example of the First Embodiment]

Figure 28:
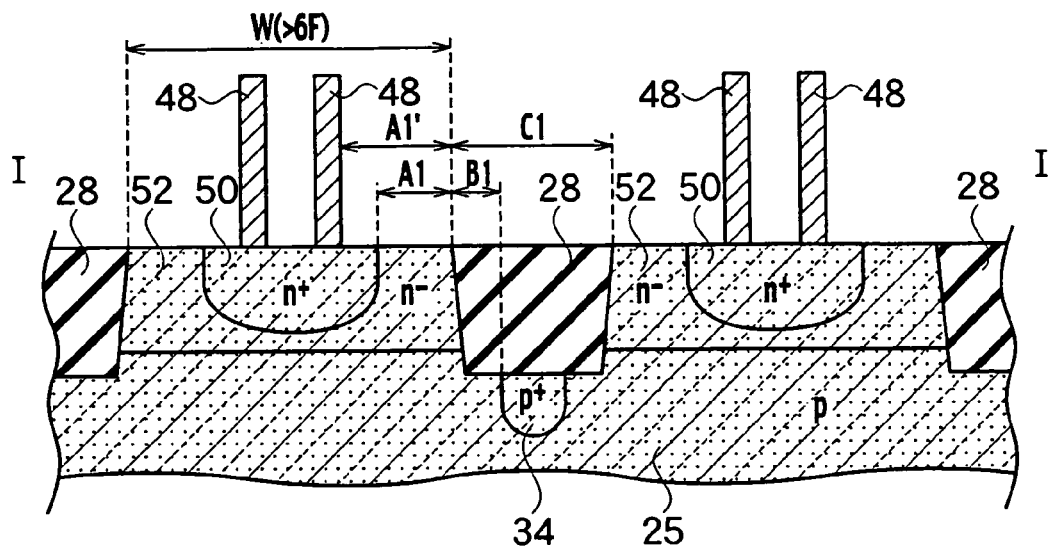
FIG. 28 is a schematic cross section diagram taken on the I—I line spanning parallel to the channel width, showing the word line transfer transistor on the nonvolatile semiconductor memory device according to the modified example of the first embodiment of the present invention.

On the nonvolatile semiconductor memory device according a modified example of the first embodiment of the present invention, the schematic cross section structure of the word line transfer transistor exhibited by the cross section taken along the I—I line spanning in the second direction parallel to the channel width includes the p-well region 25, the element isolation region 28 formed inside of the p-well region 25, the field stopper $p^+$ layer 34, an $n^-$ diffusion layer 52, an $n^-$ diffusion layer 50, and the word line contact plug 48, as shown in FIG. 28. The field stopper $p^+$ layer 34 is disposed on the bottom of the element isolation region 28, the $n^-$ diffusion layer 52 defines the active areas 16-1, 16-2, and two of the word line contact plug 48 is disposed to the $n^+$ diffusion layer 50.

Figure 29:
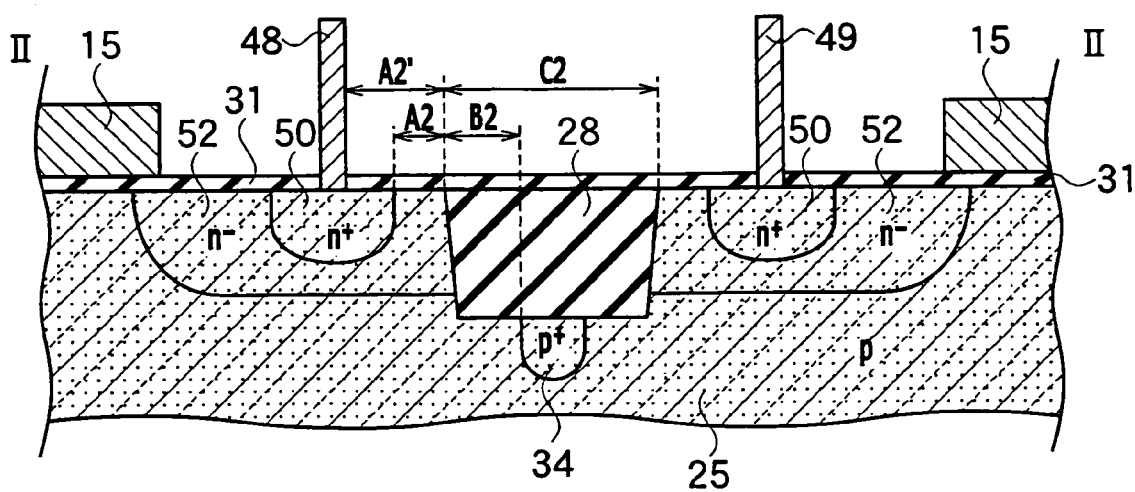
FIG. 29 is a schematic cross section diagram taken on the II—II line spanning orthogonal to the channel width, showing the word line transfer transistor on the nonvolatile semiconductor memory device according to the modified example of the first embodiment of the present invention.

On the nonvolatile semiconductor memory device according to the modified example of the first embodiment of the present invention, the schematic cross section structure of the word line transfer transistor exhibited by the cross section taken along the II—II line spanning in the first direction orthogonal to the channel width includes the p-well region 25, the element isolation region 28 formed inside of the p-well region 25, the field stopper $p^+$ layer 34, an $n^-$ diffusion layer 52, an $n^+$ diffusion layer 50, the word line contact plug 48 and CG line contact plug 49, a gate insulating film 31, and the gate electrode 15 disposed above the gate insulating film 31, as shown in FIG. 29. The field stopper $p^+$ layer 34 is disposed on the bottom of the element isolation region 28, the $n^-$ diffusion layer 52 defines the active areas 16-1, 17-1, and the word line contact plug 48 is disposed to the $n^+$ diffusion layer 50. In FIGS. 28 and 29, in addition to A1 being attributively greater than A2 (A1>A2) and A1' being attributively greater than A2' (A1'>A2'), B1 is attributively smaller than B2 (B1<B2) and C1 is attributively smaller than C2 (C1<C2). More specifically, A1, which is the distance between the $n^+$ diffusion layer 50 and the edge of the element isolation region 28 in the second direction parallel to the channel width has the attribute of being comparatively greater than A2, which is the distance between the $n^+$ diffusion layer 50 and the edge of the element isolation region 28 in the first direction orthogonal to the channel width. A1', which is the distance between the word line contact plug 48 and the edge of the element isolation region 28 in the second direction parallel to the channel width has the attribute of being comparatively greater than A2', which is the distance between the word line contact plug 48 and the edge of the element isolation region 28 in the first direction orthogonal to the channel width. In addition to this, B1, which is the distance between the field stopper $p^+$ layer 34 and the edge of the element isolation region 28 in the second direction parallel to the channel width, has the attribute of being smaller than B2, which is the distance between the field stopper $p^+$ layer 34 and the edge of the element isolation region 28 in the first direction orthogonal to the channel width, and C1, which is the width of the element isolation region in the second direction parallel to the channel width, has the attribute of being smaller than C2, which is the width of the element isolation region in the first direction orthogonal to the channel width.

Figure 26:
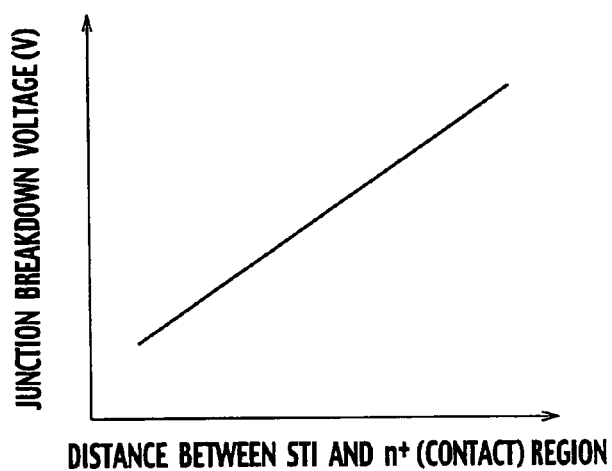
FIG. 26 is the relationship between the junction breakdown voltage in between the field stopper p$^+$ layer 34 and the n$^+$ diffusion layer 50, and the distance in between the element isolation region (STI) 28 and the n$^+$ diffusion layer 50.

By adopting this sort of structure, it becomes possible to improve the junction breakdown voltage while maintaining the threshold voltage $V_{th}$ value properties of during backward biased application, on the nonvolatile semiconductor memory device according to the first embodiment of the present invention, as was described in reference to FIGS. 25 through 27. Further adding to this sort of technological advantage, the width C1 of the element isolation region can be reduced, it also becomes possible to reduce the surface area of the word line transfer transistor. More specifically, as was made clear in FIGS. 25 through 27, in setting so that A1>A2 and A1'>A2', it becomes possible to increase the value of the junction breakdown voltage while keeping a constant value of the backward biased voltage $V_{bs}(=-V_{pgm})$.

On the nonvolatile semiconductor memory device according to a modified example of the first embodiment of the present invention, it is possible to improve the junction breakdown voltage by setting so that A1>A2 and A1'>A2'. Because of this, even if B1, which is the distance between the field stopper $p^+$ layer 34 and the edge of the element isolation region 28 in the second direction parallel to the channel width, is reduced, the junction breakdown voltage will not be deteriorated. As a result, it becomes possible to reduce C1, which is the width of the element isolation region in the direction parallel to the channel width W.

Again, on the nonvolatile semiconductor memory device according to the modified example of the first embodiment of the present invention, it is desirable that the channel width W is greater than 6X (W>6X) (X=the diameter of the contact plug), when considering factors such as the process margin and the backward bias properties.

[Second Embodiment]

(Fourth Example of a Layout Pattern of the Word Line Transfer Transistors)

Figure 30:
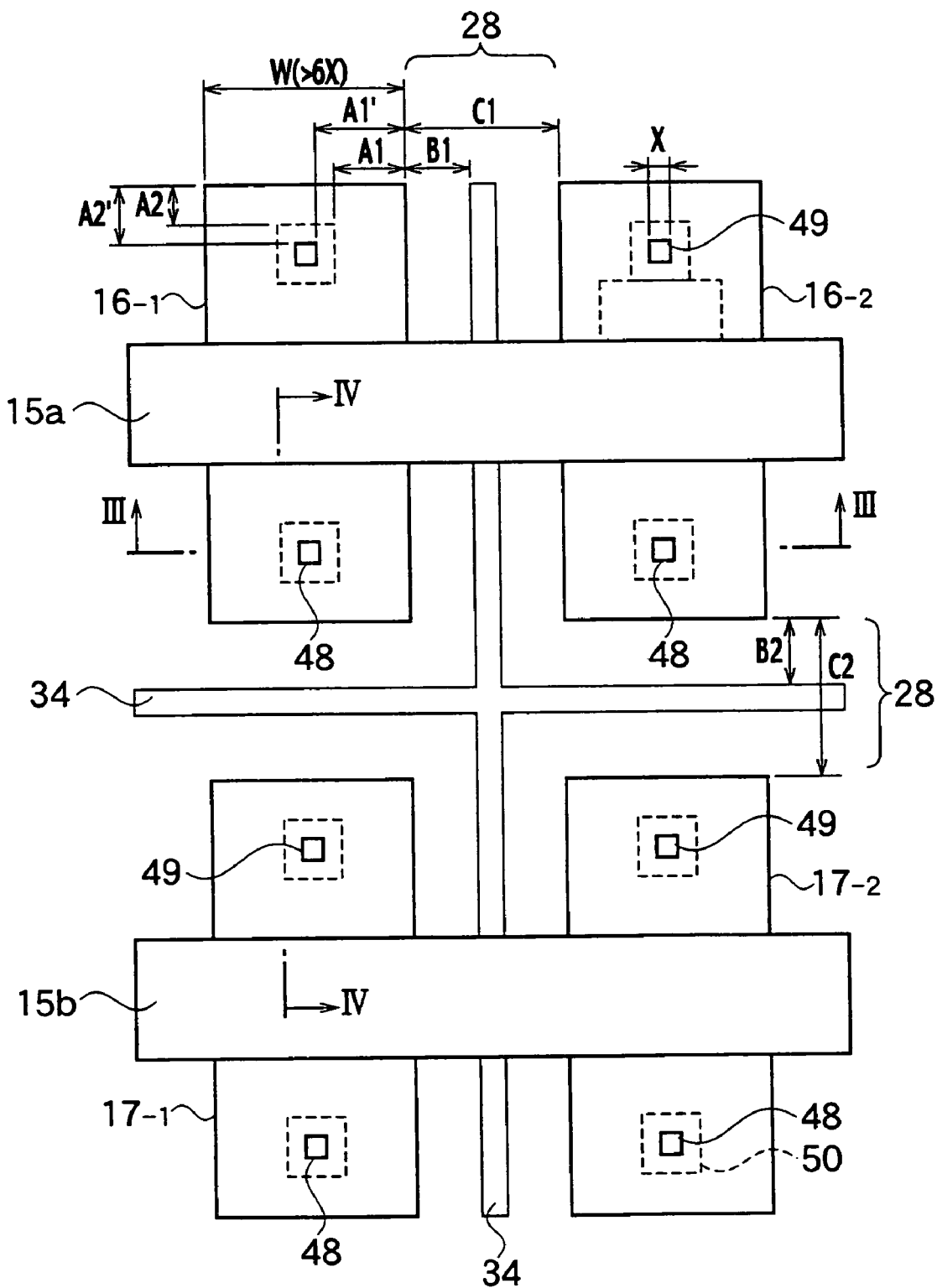
FIG. 30 is a constitution diagram of the layout pattern of the four adjacent word line transistors on the nonvolatile semiconductor memory device according to the second embodiment of the present invention (fourth layout pattern example).

The constitution of another layout pattern of the four adjacent word line transfer transistors of the nonvolatile semiconductor memory device according to the first embodiment of the present invention includes the active areas 16-1, 16-2, and 17-1, 17-2 of the word line transfer transistors aligned in two rows, the word line contact plug 48 and CG line contact plug 49 formed inside of the active areas 16-1, 16-2, and 17-1, 17-2, the gate electrodes 15a and 15b, the element isolation region 28, and the field stopper $p^+$ layer 34, as shown in FIG. 30. The gate electrodes 15a and 15b are connected in common with the gates of the word line transfer transistors aligned in rows, and the element isolation region 28 separates each of the active areas 16-1, 16-2, and 17-1, 17-2 from each other, and the field stopper $p^+$ layer 34 is disposed on the bottom of the element isolation region 28.

Figure 31:
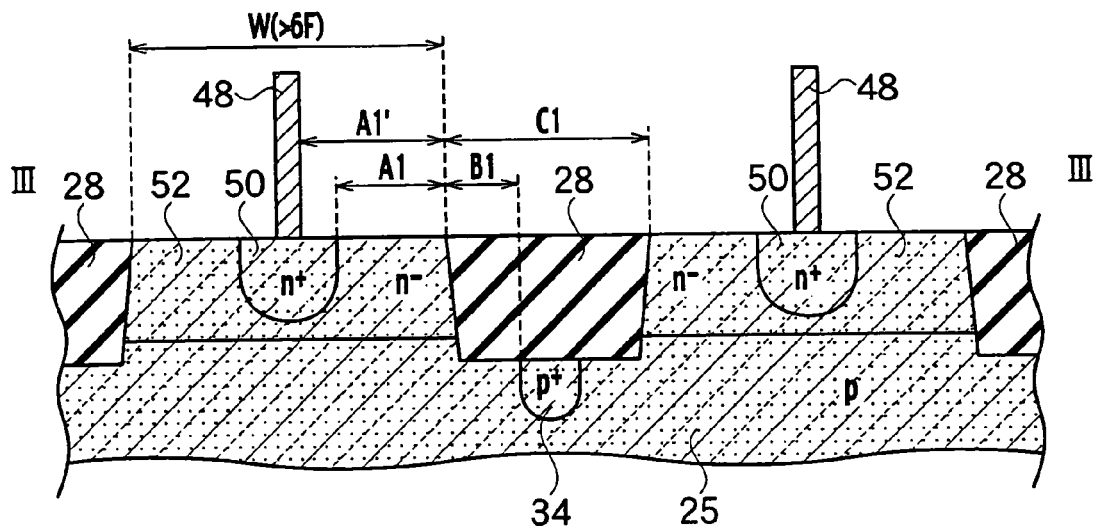
FIG. 31 is a schematic cross section diagram taken on the III—III line in FIG. 30 spanning parallel to the channel width, showing a word line transfer transistor.

In FIG. 31, the schematic cross section structure of the word line transfer transistor exhibited by the cross section taken along the III—III line spanning in the second direction parallel to the channel width in FIG. 30 includes the p-well region 25, the element isolation region 28, the field stopper p+ layer 34, the n− diffusion layer 52, the n+ diffusion layer 50, and the word line contact plug 48. The field stopper p+ layer 34 is disposed on the bottom of the element isolation region 28, the element isolation region 28 is formed inside of the p-well region 25, the n− diffusion layer 52 defines the active areas 16-1, 16-2, the n+ diffusion layer 50 is formed inside of the n− diffusion layer 52, and the word line contact plug 48 is disposed to the n+ diffusion layer 50.

Figure 32:
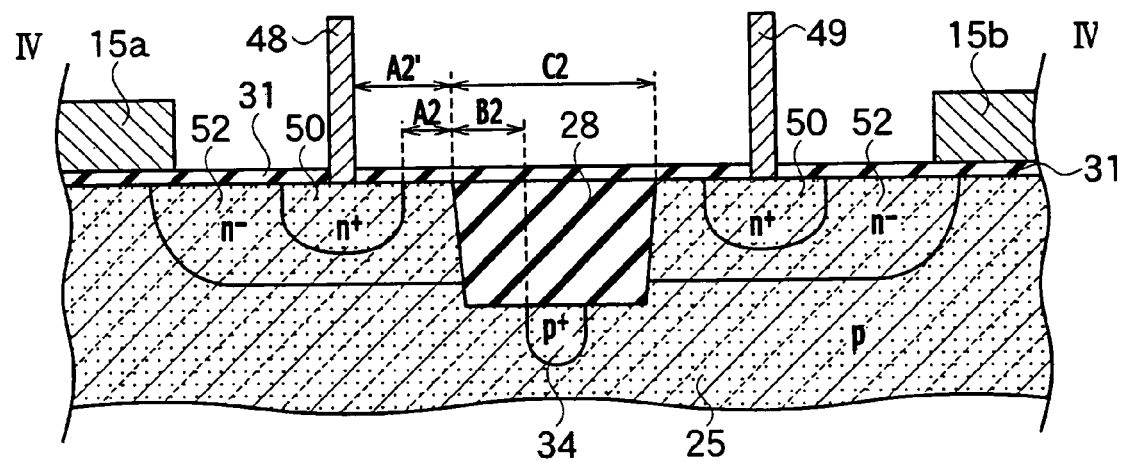
FIG. 32 is a schematic cross section diagram taken on the IV—IV line in FIG. 30 spanning orthogonal to the channel width, showing a word line transfer transistor.

In FIG. 32, the schematic cross section structure of the word line transfer transistor exhibited by the cross section taken along the IV—IV line spanning in the first direction orthogonal to the channel width in FIG. 30 includes the p-well region 25, the element isolation region 28, the field stopper p+ layer 34, the n− diffusion layer 52, the n+ diffusion layer 50, the word line contact plug 48, the CG line contact plug 49, the gate insulating film 31 of the word line transfer transistor, and the gate electrodes 15a, 15b. The field stopper p+ layer 34 is disposed on the bottom of the element isolation region 28, the element isolation region 28 is formed inside of the p-well region 25, the n− diffusion layer 52 defines the active areas 16-1, 17-1, the n+ diffusion layer 50 is formed inside of the n− diffusion layer 52, the word line contact plug 48 and CG line contact plug 49 are disposed contacting the n+ diffusion layer 50, and the gate electrodes 15a, 15b are disposed on top of the gate insulating film 31.

It is attributive of the nonvolatile semiconductor memory device according to the second embodiment of the present invention that the channel width W of the word line transfer transistor is established large, to an extent that the threshold voltage value $V_{th}$ during backward biased voltage application will not be deteriorated, and one each of the word line contact plug 48 and CG line contact plug 49 are disposed to a single n+ diffusion layer 50.

As shown in FIG. 20, generally, a plurality of the word line contact plug 48 and CG line contact plug 49 are disposed to a single n+ diffusion layer 50, when the channel width W is relatively large value. It is desirable for the distance in between the word line contact plug 48 to be 2X or above. Also, it is desirable for A1', which is the distance between the word line contact plug 48 and the edge of the element isolation region 28, to be X or above, to allow extra room for positioning alignment. Therefore the smallest channel width W needed to dispose two word line contact plugs 48 is: 2X (the diameter of the word line contact plug 48 multiplied by tow)+2X (the interval between the word line contact plugs 48)+2X (the distance between the word line contact plug 48 and the element isolation region 28)=6X. In the same manner, the smallest channel width W needed to dispose two CG line contact plugs 49 is 2X (the diameter of the CG line contact plug 49 multiplied by tow)+2X (the interval between the CG line contact plugs 49)+2X (the distance between the CG line contact plug 49)+2X (the distance between the CG line contact plug 49 and the element isolation region 28)=6X.

In the case in which W is greater than 6X (W>6X), compared to the structure in the case in which a plurality of word line contact plug 48 and CG line contact plug 49 are disposed, the value of the junction breakdown voltage will increase due to disposing only a single word line contact plug 48 or CG line contact plug 49 on the nonvolatile semiconductor memory device according to the second embodiment of the present invention.

As shown in FIG. 30, in the layout pattern of the four adjacent word line transfer transistors on the nonvolatile semiconductor memory device according to the second embodiment of the present invention, the channel width W is greater than 6X (W>6X), and only one word line contact plug 48 is disposed on top of a single n+ diffusion layer 50 for source/drain. By setting to this sort of structure, when compared to the structure in which a plurality of the word line contact plug 48 is disposed on top of a single n+ diffusion layer 50, it becomes possible to establish the A1', which is the distance between the word line contact plug 48 and the edge of the element isolation region 28 (STI) and the A1, which is the distance between the n+ diffusion layer 50 and the edge of the element isolation region 28, each at a large distance. As a result, the value of the junction breakdown voltage is increased. Concerning the CG line contact plug 49 as well, disposal occurs in the same manner as the word line contact plug 48.

In the FIGS. 31 and 32, A1 is attributively greater than A2 (A1>A2) and A1' is attributively greater than A2' (A1'>A2'). More specifically, A1, which is the distance between the n+ diffusion layer 50 and the edge of the element isolation region 28 in the second direction parallel to the channel width has the attribute of being comparatively greater than A2, which is the distance between the n+ diffusion layer 50 and the edge of the element isolation region 28 in the first direction orthogonal to the channel width. A1', which is the distance between the word line contact plug 48 and the edge of the element isolation region 28 in the second direction parallel to the channel width has the attribute of being comparatively greater than A2', which is the distance between the word line contact plug 48 and the edge of the element isolation region 28 in the first direction orthogonal to the channel width. And further, it is attributive that only a single word line contact plug 48 is disposed on top of the source/drain n+ diffusion layer 50, with W being greater than 6X (W>6X). Concerning the CG line contact plug 49 as well, disposal occurs in the same manner as the word line contact plug 48.

The structure shown in FIGS. 31 and 32, when compared to the structure shown in FIGS. 28 and 29, the A1', which is the distance between the word line contact plug 48 and the edge of the element isolation region 28, and the A1, which is the distance between the n+ diffusion layer 50 and the edge of the element isolation region 28 in the second direction parallel to the channel width, are established at a large distance, while the channel width W of the word line transfer transistor remains the same. Because of this, it becomes possible to increase the value of the junction breakdown voltage without raising the threshold voltage value $V_{th}$ of the word line transfer transistor during the application of a backward biased voltage $V_{bs}(=-V_{pgm})$. And there occur no increases in the surface area of the word line transfer transistor because the word line transfer transistor's channel width W remains the same. And even in cases in which the channel width W is narrowed for device miniaturization, it becomes easy to establish the values of A1 and A1' at large distances, and also possible to realize a sufficient value of the junction breakdown voltage, because there is only a single word line contact plug 48.

It is desirable that the thickness of the gate insulating film of the high breakdown voltage word line transfer transistor is more than twice as thick as the tunnel insulating film of the memory cell transistor. The thickness of the gate insulating film is preferable in between 25 nm to 50 nm. This is so that the gate insulating film of the word line transfer transistor will not be destroyed even if a voltage in the range of 25V is applied to the gate electrode or the diffusion layer of the word line transfer transistor, having the programming voltage $V_{pgm}$ and the erasing voltage $V_{era}$ of the memory cell transistor set to 25V or less.

Here the relationship of A1' and A2', which are the distances between the word line contact plug 48 and the edge of the element isolation region 28, will be described. In order to optimize the distances A1' and A2' it is essential to consider the following two points: Having that X=the diameter of the contact plug 48, 1) the channel width W is desirably greater than 6X (W>6X) for the sake of the backward bias properties, 2) it is desirable that the distance between the contact plug 48 and the edge of the element isolation region 28 is 2X or above, to allow extra room for positioning alignment. Therefore, in considering the above two points, concerning the dimensions that will allow the smallest element surface area, A2' (which is the distance between the word line contact plug 48 and the edge of the element isolation region 28 in the first direction orthogonal to the channel width)=2X. This is determined according to positioning alignment. Also in a case in which there is only a single contact plug 48 and W=6X, A1' (which is the distance between the word line contact plug 48 and the edge of the element isolation region 28 in the second direction parallel to the channel width)=2.5X. This is determined according to { (channel width)−(diameter of the contact plug)}/2. Therefore, it is desirable that A2' divided by A1' is greater than or equal to 1.25(A2'/A1'≧1.25). And even in a case in which there are plurality of the contact plugs shown in the first embodiment, it is possible to attain the same technological advantage by maintaining the relationship of A2'/A1'≧1.25, if the channel width W is large enough.

[Modified Example of the Second Embodiment]

Figure 33:
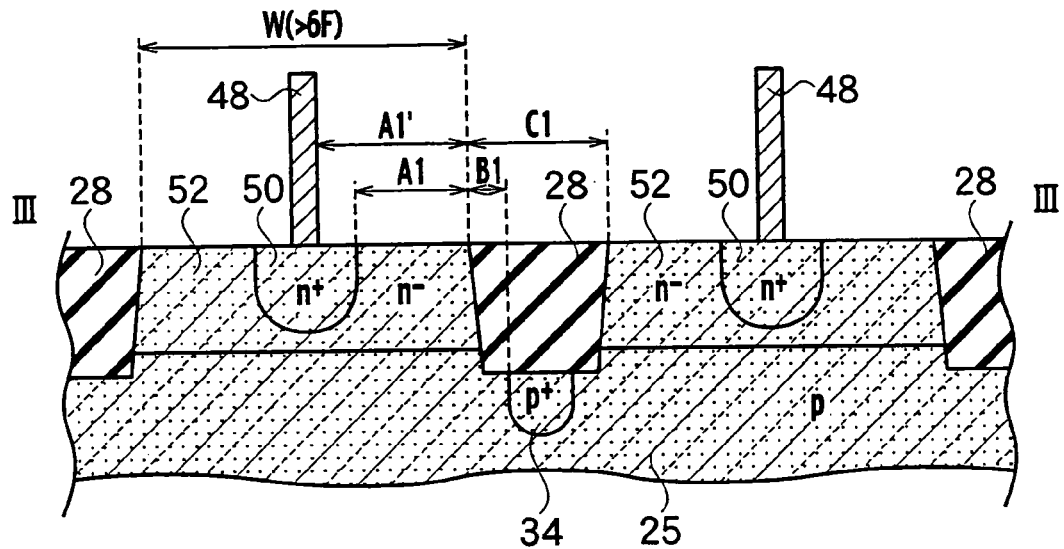
FIG. 33 is a schematic cross section diagram taken on the III—III line spanning parallel to the channel width, showing the word line transfer transistor on the nonvolatile semiconductor memory device according to the second embodiment of the present invention (A1>A2, A1'>A2', B1<B2, C1<C2).

On the nonvolatile semiconductor memory device according a modified example of the second embodiment of the present invention, as shown in FIG. 33, the schematic cross section structure of the word line transfer transistor exhibited by the cross section taken along the III—III line spanning in the second direction parallel to the channel width, includes the p-well region 25, the element isolation region 28, the field stopper p$^+$ layer 34, the n$^−$ diffusion layer 52, the n$^+$ diffusion layer 50, and the word line contact plug 48. The field stopper p$^+$ layer 34 is disposed on the bottom of the element isolation region 28, the element isolation region 28 is formed inside of the p-well region 25, the n$^−$ diffusion layer 52 defines the active areas 16-1, 16-2, the n$^+$ diffusion layer 50 is formed inside of the n$^−$ diffusion layer 52, and the word line contact plug 48 is disposed to the n$^+$ diffusion layer 50.

Figure 34:
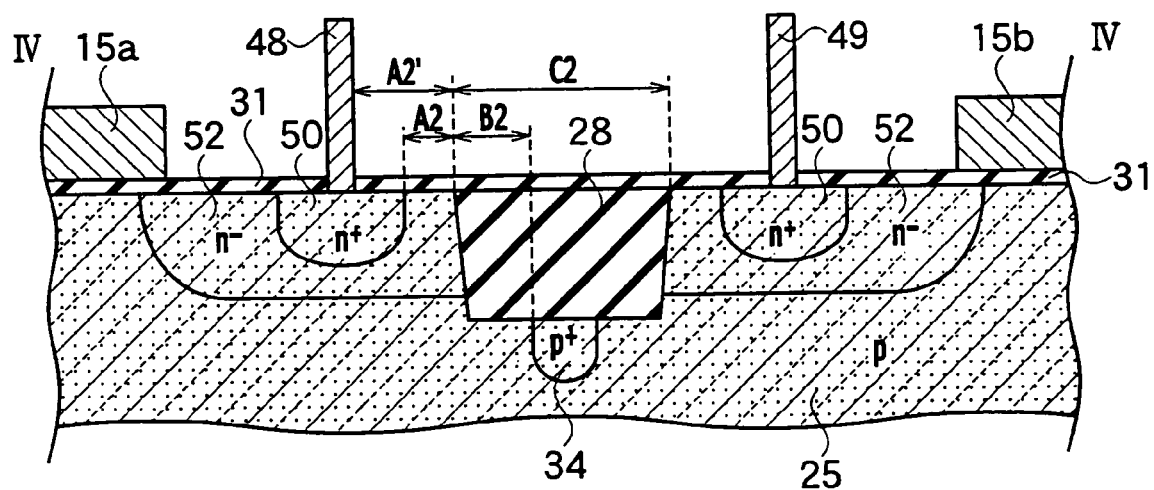
FIG. 34 is a schematic cross section diagram taken on the IV—IV line spanning orthogonal to the channel width, showing the word line transfer transistor on the nonvolatile semiconductor memory device according to the second embodiment of the present invention (A1>A2, A1'>A2', B1<B2, C1<C2).

In FIG. 34, the schematic cross section structure of the word line transfer transistor exhibited by the cross section taken along the IV—IV line spanning in the first direction orthogonal to the channel width includes the p-well region 25, the element isolation region 28, the field stopper p$^+$ layer 34, the n$^−$ diffusion layer 52, the n$^+$ diffusion layer 50, the word line contact plug 48, the CG line contact plug 49, the gate insulating film 31 of the word line transfer transistor, and the gate electrodes 15a, 15b. The field stopper p$^+$ layer 34 is disposed on the bottom of the element isolation region 28, the element isolation region 28 is formed inside of the p-well region 25, the n$^−$ diffusion layer 52 defines the active areas 16-1, 17-1, the n$^+$ diffusion layer 50 is formed inside of the n$^−$ diffusion layer 52, the word line contact plug 48 and CG line contact plug 49 are disposed to the n$^+$ diffusion layer 50, and the gate electrodes 15a, 15b are disposed on top of the gate insulating film 31.

In FIGS. 33 and 34, in addition to A1 being attributively greater than A2 (A1>A2) and A1' being attributively greater than A2' (A1'>A2'), B1 is attributively smaller than B2 (B1<B2) and C1 is attributively smaller than C2 (C1<C2). More specifically, A1, which is the distance between the n$^+$ diffusion layer 50 and the edge of the element isolation region 28 in the second direction parallel to the channel width has the attribute of being comparatively greater than A2, which is the distance between the n$^+$ diffusion layer 50 and the edge of the element isolation region 28 in the direction orthogonal to the channel width. A1', which is the distance between the word line contact plug 48 and the edge of the element isolation region 28 in the direction parallel to the channel width has the attribute of being comparatively greater than A2', which is the distance between the word line contact plug 48 and the edge of the element isolation region 28 in the direction orthogonal to the channel width. In addition to this, B1, which is the distance between the field stopper p$^+$ layer 34 and the edge of the element isolation region 28 in the second direction parallel to the channel width, has the attribute of being smaller than B2, which is the distance between the field stopper p$^+$ layer 34 and the edge of the element isolation region 28 in the first direction orthogonal to the channel width, and C1, which is the width of the element isolation region 28 in the second direction parallel to the channel width, has the attribute of being smaller than C2, which is the width of the element isolation region 28 in the first direction orthogonal to the channel width.

By adopting this sort of structure, it becomes possible to improve the junction breakdown voltage while maintaining the threshold voltage $V_{th}$ value properties of during backward biased application, on the nonvolatile semiconductor memory device according to the modified example of the second embodiment of the present invention, as was described in reference to FIGS. 25 through 27. Further adding to this sort of technological advantage, the width C1 of the element isolation region 28 can be reduced, it also becomes possible to reduce the surface area of the word line transfer transistor. More specifically, as was made clear in FIGS. 25 through 27, in setting so that A1>A2 and A1'>A2', it becomes possible to improve junction breakdown voltage while keeping the backward bias properties.

On the nonvolatile semiconductor memory device according to a modified example of the second embodiment of the present invention it is possible to increase the value of the junction breakdown voltage by establishing that A1>A2 and A1'>A2'. Because of this, even if B1, which is the distance between the field stopper p$^+$ layer 34 and the edge of the element isolation region 28 in the second direction parallel to the channel width, is reduced, the junction breakdown voltage will not be deteriorated. As a result, it becomes possible to reduce C1, which is the width of the element isolation region 28 in the second direction parallel to the channel width.

Again, on the nonvolatile semiconductor memory device according to a modified example of the second embodiment of the present invention, it is desirable that the channel width W is greater than 6X (W>6X) (X=the diameter of the contact plug), when considering factors such as securing the process margin and the maintaining the backward bias properties.

And even in cases in which the channel width W is narrowed for device miniaturization, it becomes easy to establish the values of A1 and A1' at large distances, and also possible to realize a sufficient value of the junction breakdown voltage, because there is only a single word line contact plug 48 or CG line contact plug 49.

In light of the above, on the nonvolatile semiconductor memory device according to the first and second embodiments of the present invention, it is possible to realize device miniaturization according to changing the values of A1, which is the distance between the $n^+$ diffusion layer 50 and the edge of the element isolation region 28 in the second direction parallel to the channel width, or A1', which is the distance between the word line contact plug 48 and the edge of the element isolation region 28 in the second direction parallel to the channel width, on the word line transfer transistor. It also becomes possible to secure the junction breakdown voltage properties while maintaining the backward bias properties.

Especially on the nonvolatile semiconductor memory device according to the second embodiment of the present invention, by setting the channel width W to be 6 times larger than the diameter X of the word line contact plug 48, and by disposing only a single word line contact plug 48 or CG line contact plug 49 on top of a single $n^+$ diffusion layer 50 on the word line transfer transistor, device miniaturization as well as the realization of both the backward bias properties as well as the junction breakdown voltage properties become possible.

[Third Embodiment]

Figure 35:
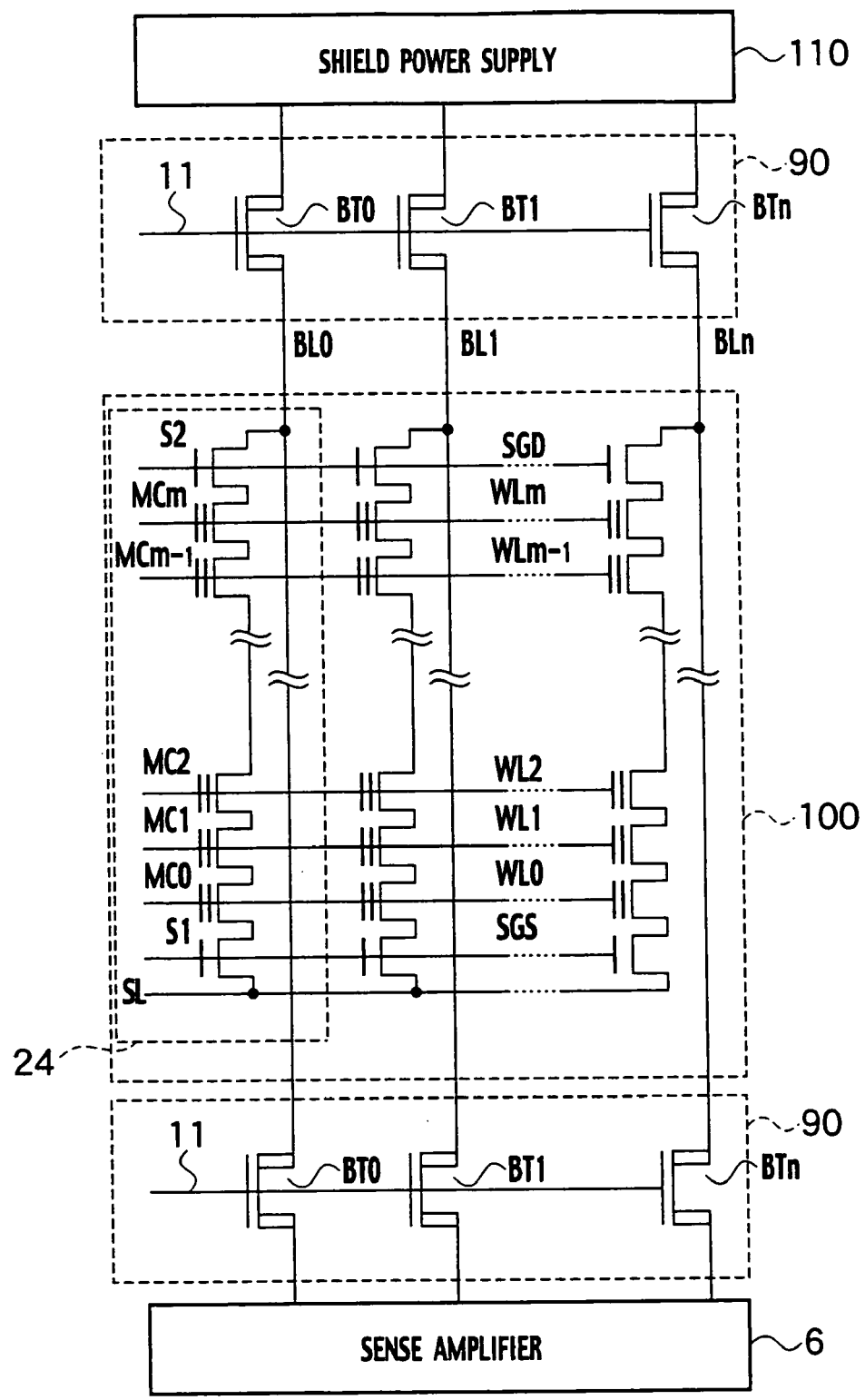
FIG. 35 is a schematic block diagram showing the connection relationship between a memory cell array and a bit line switching transistor unit on the nonvolatile semiconductor memory device according to the third embodiment of the present invention.

The nonvolatile semiconductor memory device according to the third embodiment of the present invention is constituted by, as shown in FIG. 35, the memory cell array 100, a switching transistor unit 90, the sense amplifier 6, and a shield power supply 110, in the case the memory cell array is constituted by a NAND type EEPROM. The memory cell array 100 includes memory cell transistors MC disposed at the intersection of the plurality of word lines WL0 through WLm spanning in rows and the plurality of bit lines BL0 through BLn spanning in columns. The two bit-line switching transistor units 90 are disposed in the periphery of the memory cell array 100.

Concerning the row decoder 5 shown on the nonvolatile semiconductor memory device according to the first embodiment of the present invention, illustration has been omitted from FIG. 35. Here, in the same fashion as in FIG. 1, it is acceptable to establish the word line transfer transistor unit 3 and elaborate on the structure of the disposed word line transfer transistors described in the first and second embodiments of the present invention.

On one side of the structure, the bit line switching transistor unit 90 is disposed in between the memory cell array 100 and the shield power supply 110. And on the other side, the bit line switching transistor unit 90 is disposed in between the memory cell array 100 and the sense amplifier 6. And the bit line switching transistor unit 90 is constituted by the high breakdown voltage bit line switching transistors BT0 through BTn that are each connected to the bit lines BL0 through BLn, respectively.

In the source/drain regions of the bit line switching transistors BT0 through BTn that constitute the bit line switching transistor unit 90, disposed in between the memory cell array 100 and the shield power supply 110, the bit lines BL0 through BLn are connected on one side, and the shield power supply 110 is connected on the other side.

In the source/drain regions of the bit line switching transistors BT0 through BTn that constitute the bit line switching transistor unit 90, disposed in between the memory cell array 100 and the sense amplifier 6, the bit lines BL0 through BLn are connected on one side, and the sense amplifier 6 is connected on the other side.

Memory cell array 100 includes the NAND cell unit 24, which is constituted by m memory cell transistors MC0 through MCm connected in series in between the bit line side select gate transistor S2 and the source line side select gate transistor S1. The n units of the NAND cell unit 24 are aligned in parallel rows, constituting the memory cell blocks. A plurality of the memory cell blocks is disposed in rows and columns forming a matrix, altogether constituting a single memory cell array 100. FIG. 35 shows the state of n number of the NAND cell unit 24 aligned in parallel rows.

On the nonvolatile semiconductor memory device according to the third embodiment of the present invention, the schematic cross section structure of the memory cell transistors MC0 through MCm describing the erasing operation of the NAND type EEPROM includes an n-well region 26 formed inside of the p type semiconductor substrate 27, and a p-well region p-well region 25, as shown in FIG. 35. With this sort of well structure, it is possible to apply a high erasing voltage $V_{era}$ to the p-well region 25 during erasing.

The erasing operation on the nonvolatile semiconductor memory device according to the third embodiment of the present invention can be performed in the same manner as the first embodiment of the present invention in the description using FIGS. 10 through 13.

Figure 36:
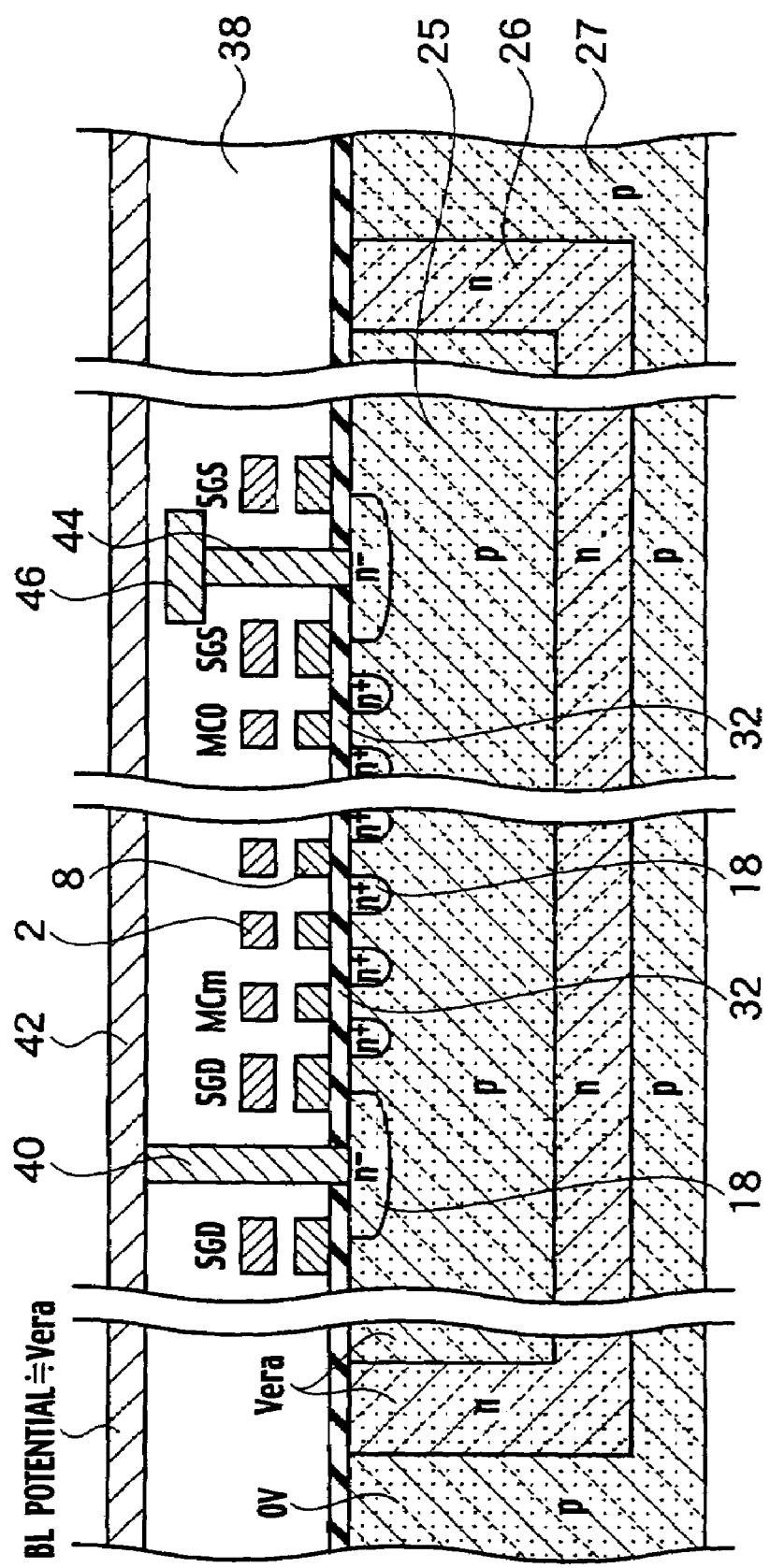
FIG. 36 is a schematic showing the erasing operation of a NAND type EEPROM as the nonvolatile semiconductor memory device according to the third embodiment of the present invention.

Here the necessity of the bit line switching transistors BT0 through BTn will be described taking a closer look at the bit line voltage. An erasing voltage $V_{era}$ in the range of 20V is applied to the p-well region 25 during erasing, as shown in FIG. 36. At this time the bit line voltage also rises to a potential level roughly the same as the erasing voltage $V_{era}$ due to the capacitive-coupling with the p-well region 25.

Because elements like the sense amplifier 6 and the shield power supply 110 connected to the bit lines BL0 through BLn through the bit line switching transistor unit 90 are constituted by low breakdown voltage transistors, these low breakdown voltage transistors would be destroyed by the application of the erasing voltage $V_{era}$. The bit line switching transistors BT0 through BTn serve to cut off the erasing voltage $V_{era}$ so that it is not transferred to elements such as the sense amplifier 6 and the shield power supply 110.

The thickness of the gate insulating film of the high breakdown voltage word line transfer transistor should be twice as thick as the thickness of the tunnel insulating film of the memory cell transistor, and more preferably, should have a thickness of between 25 nm and 50 nm. This is to make it so that the even if a 25V voltage is applied to the gate electrode or the diffusion layer of the high breakdown voltage word line transfer transistor after having set the programming voltage $V_{pgm}$, and the erasing voltage $V_{era}$ of the memory cell transistor to below 25V, the gate insulating film of the word line transfer transistor will not be destroyed.

(The Main Relationships of the Voltages Applied to the Bit Line Switching Transistors)

Figure 37A:
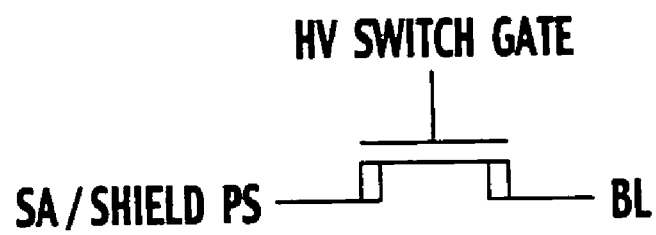
FIG. 37A is a diagram that expresses the relationship of the voltage of the bit line switching transistor, showing one side of the source and drain diffusion layers of the bit line switching transistors being connected to the bit line and the other side connected to the sense amplifier or the shield power supply.

On the equivalent circuit of the bit line switching transistor shown in FIG. 37A, one end of the bit line switching transistor's source and drain diffusion layer is connected to the sense amplifier 6 or shield power supply 110, and the other end is connected to the bit line. The gate electrode of the high-voltage (HV) switching gate is connected to a bit line switching gate line 11 (FIG. 35).

Figure 37B:
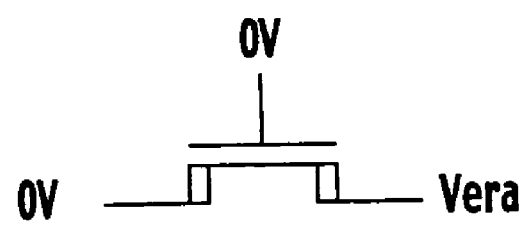
FIG. 37B is a diagram that expresses the relationship of the voltage of the bit-line switching transistor, showing the state of the voltage of the bit line rising to that of the erasing voltage $V_{era}$ during erasing operation, and the state of a 0V/0V voltage applied to the source/drain diffusion layers.
Figure 37C:
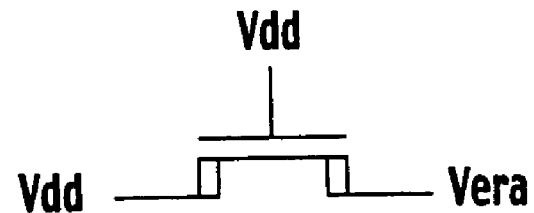
FIG. 37C is a diagram that expresses the relationship of the voltage of the bit-line switching transistor, showing the state of a voltage $V_{dd}$ (in the range of 2.5V) applied to the source diffusion layer/gate.
Figure 37D:
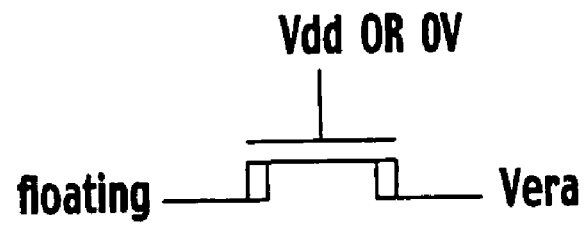
FIG. 37D is a diagram that expresses the relationship of the voltage of the bit-line switching transistor, showing the state of a voltage floating/$V_{dd}$ applied to the source diffusion layer/gate.

During erasing, as shown in FIG. 37B, the voltage of the bit line is increased to that of the erasing voltage $V_{era}$, and in order that the erasing voltage $V_{era}$ is not transferred to the source diffusion layer, the bit line switching transistor is cut off according to the application of a voltage such as: 0V/0V, $V_{dd}$ (in the range of 2.5V)/$V_{dd}$, floating/$V_{dd}$, floating/0V to the source diffusion layer/gate electrode, as shown in FIGS. 37B through 37D.

Here it is attributive that an erasing voltage $V_{era}$ in the range of 20V is applied to the drain diffusion layer even though only a voltage $V_{dd}$ in the range of 5V or less is applied to the source diffusion layer.

(First Example of a Layout Pattern of the Bit Line Switching Transistor Unit)

Figure 38:
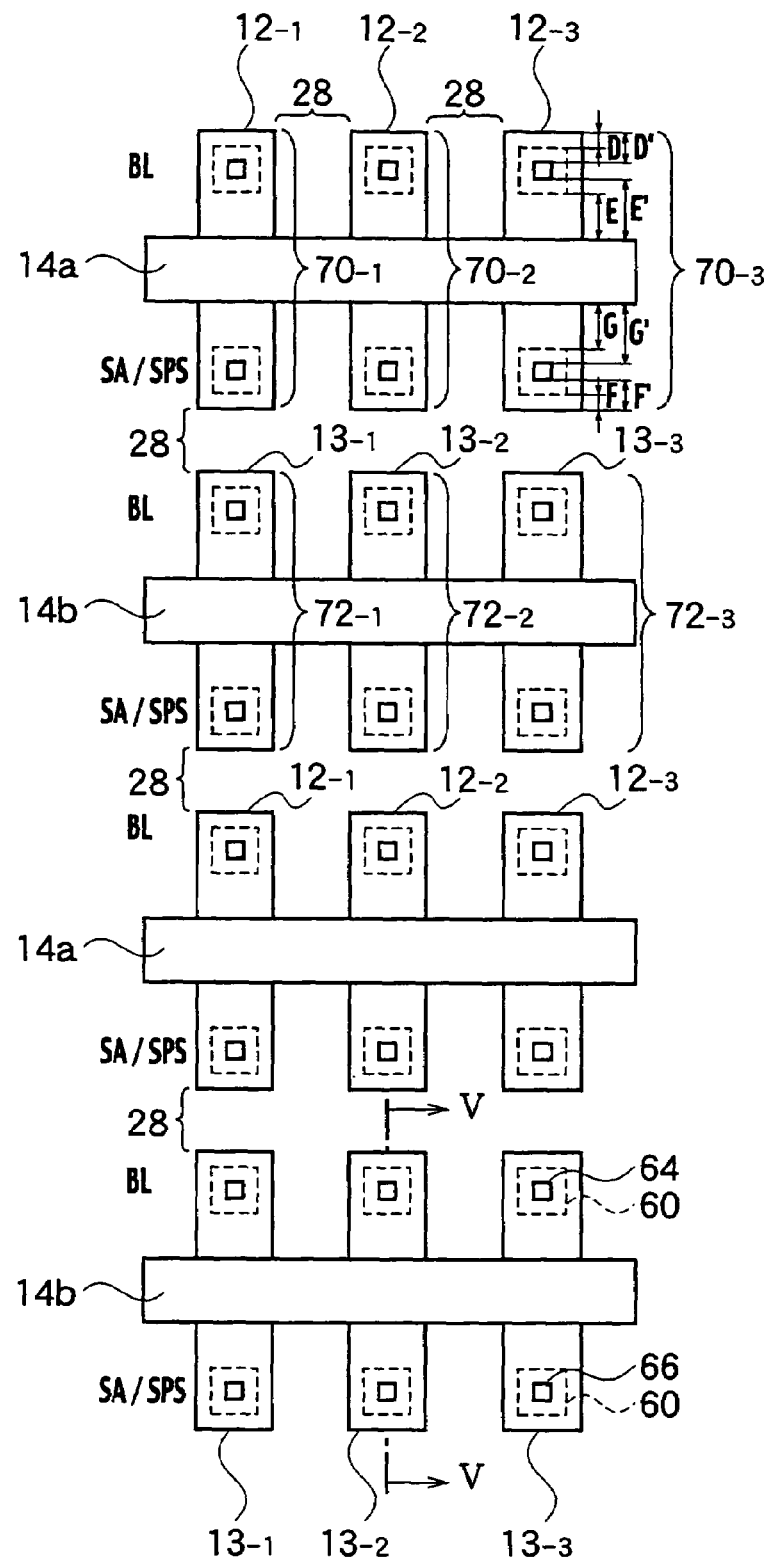
FIG. 38 is a constitution diagram of a layout pattern of a bit line switching transistor on the nonvolatile semiconductor memory device according to the third embodiment of the present invention (first layout pattern example: an example disposing a plurality of bit line switching transistors sharing a gate, and one end of the contact plug is connected to the bit line, and the other end is connected to the sense amplifier).

The layout pattern of the bit line switching transistor unit 90 of the nonvolatile semiconductor memory device according to the third embodiment of the present invention using an example case in which a plurality of bit line switching transistors are disposed sharing the gate, and one side of the contact plug is connected to the bit line while the other side is connected to the sense amplifier 6 or shield power supply 110, includes bit line switching transistors 70-1, 70-2, 70-3 and 72-1, 72-2, 72-3 aligned in two rows, active areas 12-1, 12-2, 12-3 and 13-1, 13-2, 13-3 of the bit line switching transistors 70-1, 70-2, 70-3 and 72-1, 72-2, 72-3, an $n^+$ diffusion layer 60, a contact plug 64, a sense amplifier/shield power supply contact plug 66, and gate electrodes 14a, 14b, as shown in FIG. 38. The $n^+$ diffusion layer 60 is formed inside of the active areas 12-1, 12-2, 12-3 and 13-1, 13-2, 13-3, the bit line contact plug 64 and the sense amplifier/shield power supply contact plug 66 are formed inside of the $n^+$ diffusion layer 60, the gate electrodes 14a, 14b are connected in common with the gates of the bit line switching transistors 70-1, 70-2, 70-3 and 72-1, 72-2, 72-3 that are aligned in two rows. Further, the appearance of the electrode wiring and the like given to the active areas 12-1, 12-2, 12-3 and 13-1, 13-2, 13-3 of the bit line switching transistors 70-1, 70-2, 70-3 and 72-1, 72-2, 72-3 has been omitted in FIG. 38.

(Second Example of a Layout Pattern of the Bit Line Switching Transistor Unit)

Figure 39:
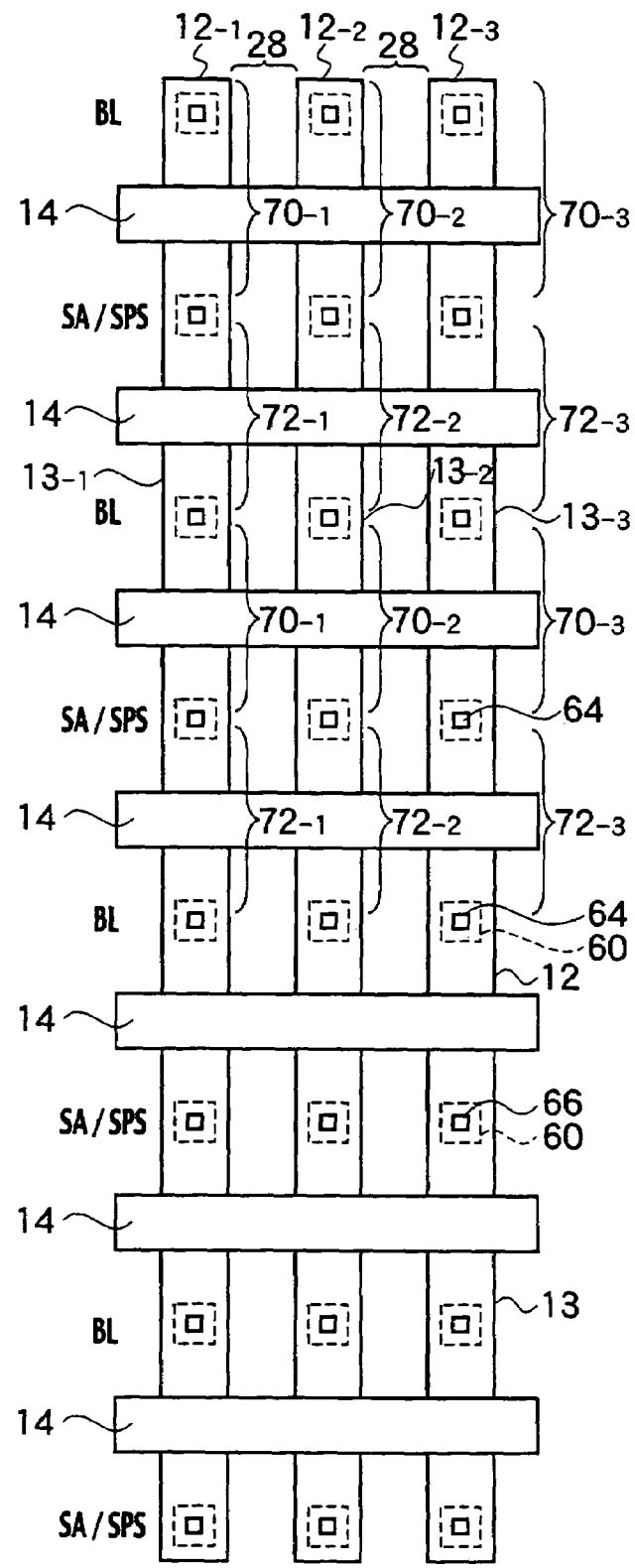
FIG. 39 is a constitution diagram of another layout pattern of a bit line switching transistor on the nonvolatile semiconductor memory device according to the third embodiment of the present invention (second layout pattern example: an example case in which surface area is cut by disposing a plurality of the adjacent bit line switching transistors so that the adjacent bit line switching transistors share the source/drain diffusion layer in the first direction orthogonal to the channel width.

Another layout pattern of the bit line switching transistor unit 90 of the nonvolatile semiconductor memory device according to the third embodiment of the present invention, using an example case in which surface area is cut by disposing a plurality of adjacent bit line switching transistors so that they share the source/drain diffusion layer in the first direction orthogonal to the channel width, includes the bit line switching transistors 70-1, 70-2, 70-3 and 72-1, 72-2, 72-3, the active areas 12-1, 12-2, 12-3 and 13-1, 13-2, 13-3 of the bit line switching transistors 70-1, 70-2, 70-3 and 72-1, 72-2, 72-3, the $n^+$ diffusion layer 60, the bit line contact plug 64 and the sense amplifier/shield power supply contact plug 66, and the gate electrode 14, as shown in FIG. 39. The $n^+$ diffusion layer 60 is formed inside of the active areas 12-1, 12-2, 12-3 and 13-1, 13-2, 13-3, the bit line contact plug 64 and the sense amplifier/shield power supply contact plug 66 are formed inside of the $n^+$ diffusion layer 60, and the gate electrode 14 is connected in common with the gates of the bit line switching transistors 70-1, 70-2, 70-3 and 72-1, 72-2, 72-3 aligned in rows. Further, the appearance of the electrode wiring and the like given to the active areas 12-1, 12-2, 12-3 and 13-1, 13-2, 13-3 of the bit line switching transistors 70-1, 70-2, 70-3 and 72-1, 72-2, 72-3 has been omitted in FIG. 39.

According to the structure of the layout pattern shown in FIG. 39, that is, disposing the adjacent bit line switching transistors so that they share the source/drain diffusion layer in the first direction, it becomes possible to cut surface area.

(Third Example of a Layout Pattern of the Bit Line Switching Transistor Unit)

Figure 40:
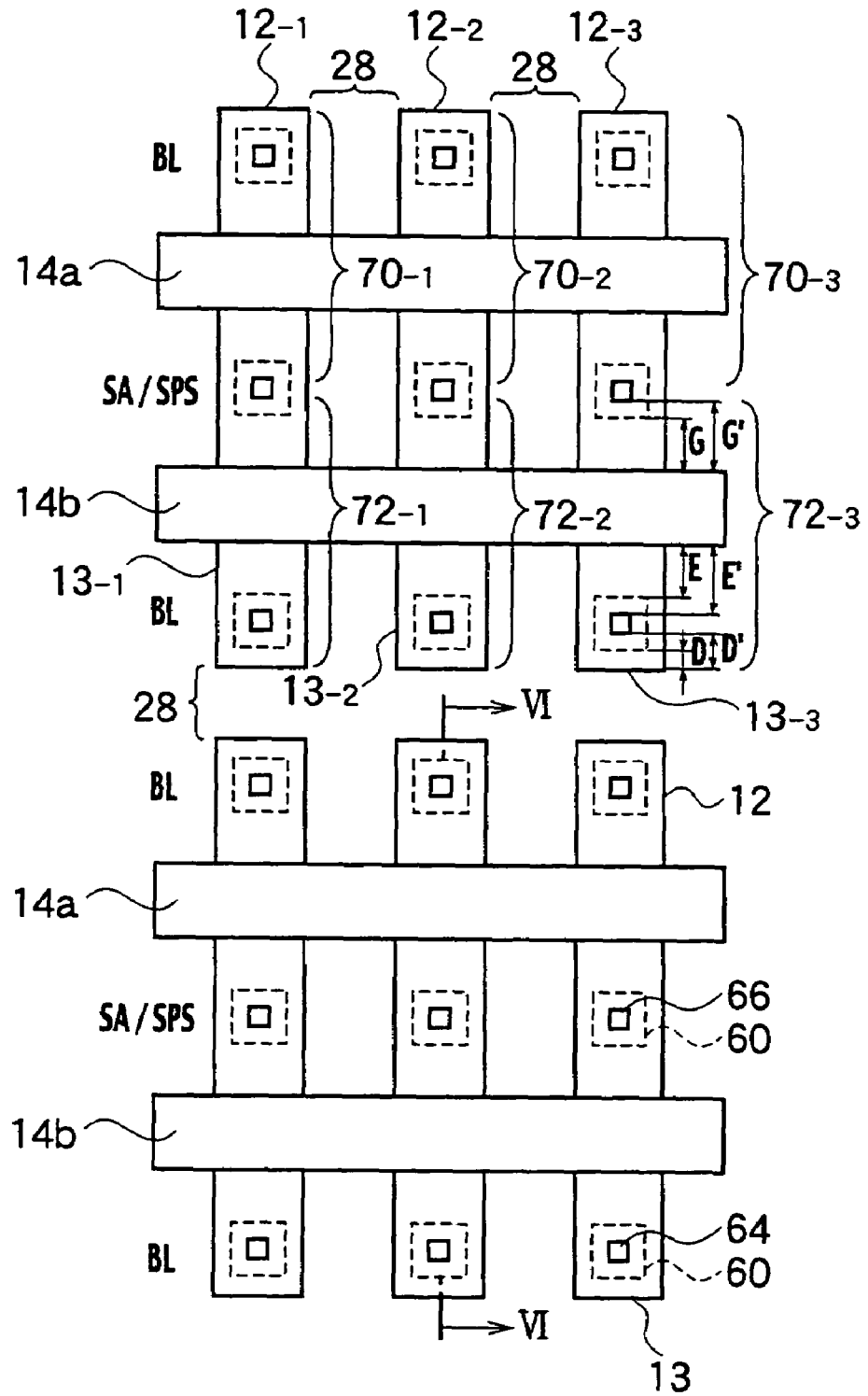
FIG. 40 is a constitution diagram of yet another layout pattern of a bit line switching transistor on the nonvolatile semiconductor memory device according to the third embodiment of the present invention (third layout pattern example: an example case in which surface area is cut by having a single diffusion layer shared by two bit line switching transistors and disposing the diffusion layer connected to the bit line to each of the bit line switching transistors independently so that only the diffusion layer connected to the sense amplifier is shared).

The constitution of still another layout pattern of the bit line switching transistor unit 90 of the nonvolatile semiconductor memory device according to the third embodiment of the present invention, using an example case in which surface area is cut by having a single diffusion layer shared by two bit line switching transistors and disposing the diffusion layer connected to the bit line to each of the bit line switching transistors independently so that only the diffusion layer connected to the sense amplifier 6 or the shield power supply 110 is shared, is constituted by the bit line switching transistors 70-1, 70-2, 70-3 and 72-1, 72-2, 72-3, the active areas 12-1, 12-2, 12-3 and 13-1, 13-2, 13-3 of the bit line switching transistors 70-1, 70-2, 70-3 and 72-1, 72-2, 72-3, the $n^+$ diffusion layer 60, the bit line contact plug 64 and the sense amplifier/shield power supply contact plug 66, and the gate electrodes 14a, 14b, as shown in FIG. 40. The $n^+$ diffusion layer 60 is formed inside of the active areas 12-1, 12-2, 12-3 and 13-1, 13-2, 13-3, the bit line contact plug 64 and the sense amplifier/shield power supply contact plug 66 are formed inside of the $n^+$ diffusion layer 60, and the gate electrodes 14a and 14b are connected in common with the gates of the bit line switching transistors 70-1, 70-2, 70-3 and 72-1, 72-2, 72-3 aligned in rows. Further, the appearance of the electrode wiring and the like given to the active areas 12-1, 12-2, 12-3 and 13-1, 13-2, 13-3 of the bit line switching transistors 70-1, 70-2, 70-3 and 72-1, 72-2, 72-3 has been omitted in FIG. 40.

In FIG. 40, an example in which disposing the diffusion layer connected to the bit line to each of the bit line switching transistors independently so that only the diffusion layer connected to the sense amplifier 6 or the shield power supply 110 is shared. Or it is also acceptable to dispose the diffusion layer connected to the sense amplifier 6 or the shield power supply 110 to each of the bit line switching transistors independently so that only the diffusion layer connected to the bit line is shared. It is possible to cut surface area in this instance, because two bit-line switching transistors share a single diffusion layer.

(Optimization of the Dimensions of the Bit Line Switching Transistors and Element Isolation Regions)

Figure 41:
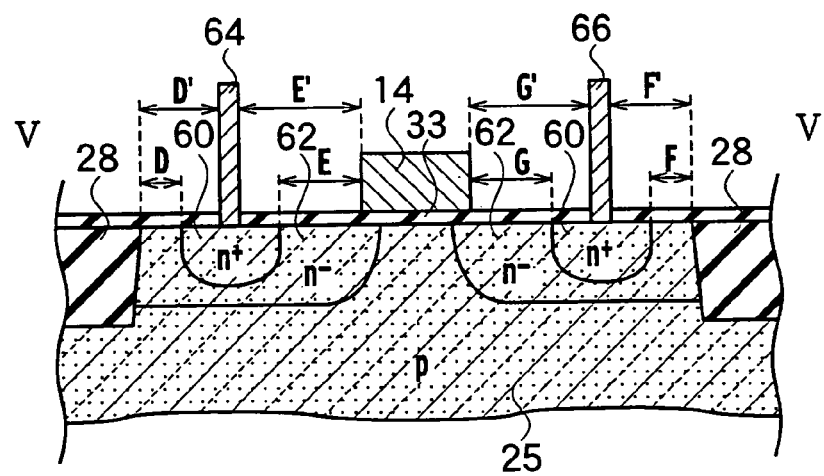
FIG. 41 is a schematic cross section diagram taken on the V—V line in FIG. 38 spanning orthogonal to the channel width, showing a bit line switching transistor.

In FIG. 41, the schematic cross section structure of the bit line switching transistor exhibited by the cross section taken along the V—V line spanning in the first direction orthogonal to the channel width in FIG. 38, includes the p-well region 25, the element isolation region 28 formed inside of the p-well region 25, an $n^-$ diffusion layer 62, the $n^+$ diffusion layer 60, the bit line contact plug 64 and the sense amplifier/shield power supply contact plug 66, a gate insulating film 33 of the bit line switching transistor, and the gate electrode 14. The $n^-$ diffusion layer 62 defines the active area 13-2, the $n^+$ diffusion layer 60 is formed inside of the $n^-$ diffusion layer 62, the bit line contact plug 64 and the sense amplifier/shield power supply contact plug 66 are each disposed to the $n^+$ diffusion layer 60, and the gate electrodes 14 is disposed on top of the gate insulating film 33.

Figure 42:
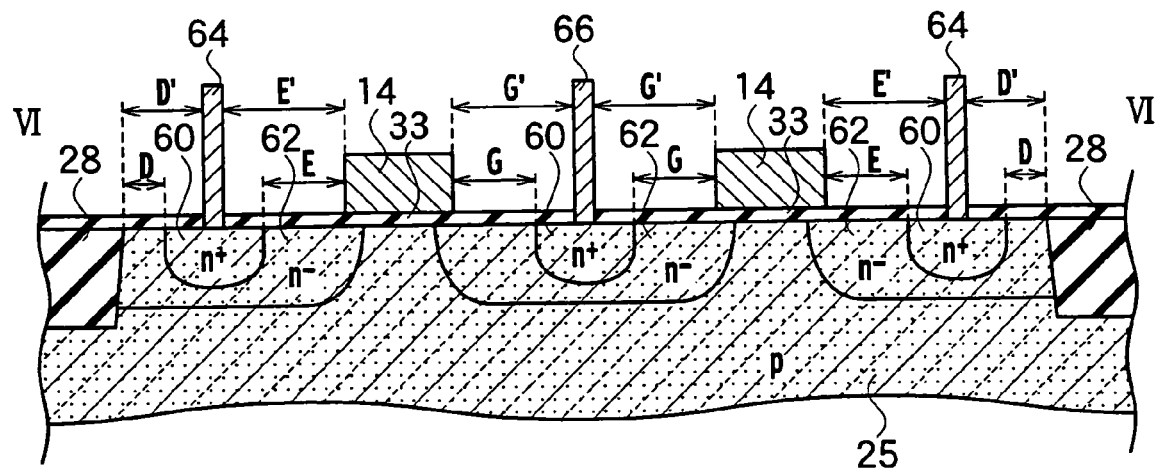
FIG. 42 is a schematic cross section diagram taken on the VI—VI line in FIG. 40 spanning orthogonal to the channel width, showing a bit line switching transistor.

In FIG. 42, the schematic cross section structure of the bit line switching transistor exhibited by the cross section taken along the VI—VI line spanning in the first direction orthogonal to the channel width in FIG. 40, includes the p-well region 25, the element isolation region 28 formed inside of the p-well region 25, the $n^-$ diffusion layer 62, the $n^+$ diffusion layer 60, the bit line contact plug 64 and the sense amplifier/shield power supply contact plug 66, the gate insulating film 33 of the bit line switching transistor, and the gate electrode 14. The $n^-$ diffusion layer $n^-$ diffusion layer 62 defines the active areas 12-2, 13-2, the $n^+$ diffusion layer 60 is formed inside of the $n^-$ diffusion layer 62, the bit line contact plug 64 and the sense amplifier/shield power supply contact plug 66 are each disposed to the n⁺ diffusion layer 60, and the gate electrodes 14 is disposed on top of the gate insulating film 33.

Guidelines concerning the dimensions are provided below for the purpose of increasing the value of the breakdown voltage and reducing the surface area of the bit line switching transistor on the nonvolatile semiconductor memory device according to the third embodiment of the present invention.

The distance between the element isolation region 28 and the n⁺ diffusion layer 60 connected to the bit line contact plug 64 is defined as D, the distance between the bit line contact plug 64 and the edge of the element isolation region 28 is defined as D', the distance between the gate electrode 14 and the n⁺ diffusion layer 60 connected to the bit line contact plug 64 is defined as E, the distance between the bit line contact plug 64 and the gate electrode 14 is defined as E', the distance between the edge of the element isolation region 28 and the n⁺ diffusion layer 60 connected to the sense amplifier/shield power supply contact plug 66 is defined as F, the distance between the sense amplifier/shield power supply contact plug 66 and the edge of the element isolation region 28 is defined as F', the distance between the gate electrode 14 and the n⁺ diffusion layer 60 connected to the sense amplifier/shield power supply contact plug 66 is defined as G, the distance between the sense amplifier/shield power supply contact plug 66 and the gate electrode 14 is defined as G'.

Afterward, the diffusion layer connected to the bit line BL, and to which the erasing voltage $V_{era}$ is applied, is called as the drain of the bit line switching transistor, and the diffusion layer connected to the sense amplifier 6 or shield power supply 110, and to which the erasing voltage $V_{era}$ is not applied, is called as the source of the bit line switching transistor.

Here, for optimum device miniaturization it is desirable for the gate length to have a short length, and for improving drain breakdown voltage it is desirable for the gate length to have a long length. The technological advantages inherent to device miniaturization are pursued on the embodiments of the present invention by reducing the distance from the gate electrode 14 to the contact plug 64/66 on only one side. Reducing the gate length by 20% will sufficiently attain the technological advantages of device miniaturization. This 20% reduction amounts to the value of approximately 0.2„m~0.3„m reduction in dimensions. If the distance between the gate electrode 14 and the contact plug 64/66 is reduced in the range of by 0.2„m to inherent to chip miniaturization can be attained in the same manner as in the reduction of the gate length. Therefore, in order to sufficiently attain the technological advantages of device miniaturization, it is desirable that E'/G'>1.5, E'–G'>0.2„m, and G'<0.5„m, while securing the drain breakdown voltage.

[First Modified Example of the Third Embodiment]

Figure 43:
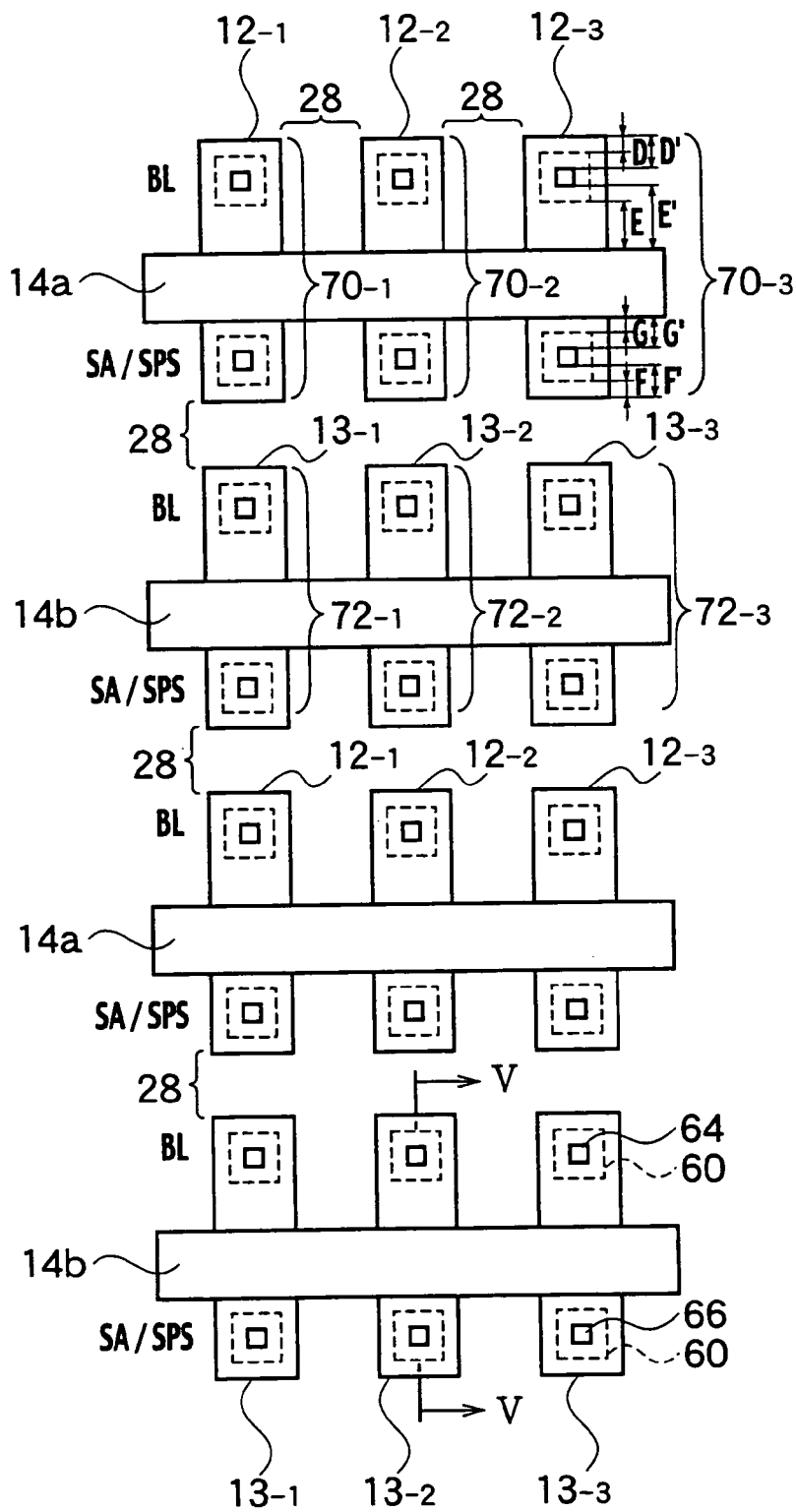
FIG. 43 is a constitution diagram of a layout pattern of a bit line switching transistor on the nonvolatile semiconductor memory device according to the first modified example of the third embodiment of the present invention (fourth layout pattern example: an example disposing a plurality of bit line switching transistors sharing a gate, and one end of a contact plug is connected to a bit line, and the other end is connected to a sense amplifier or a shield power supply).
Figure 44:
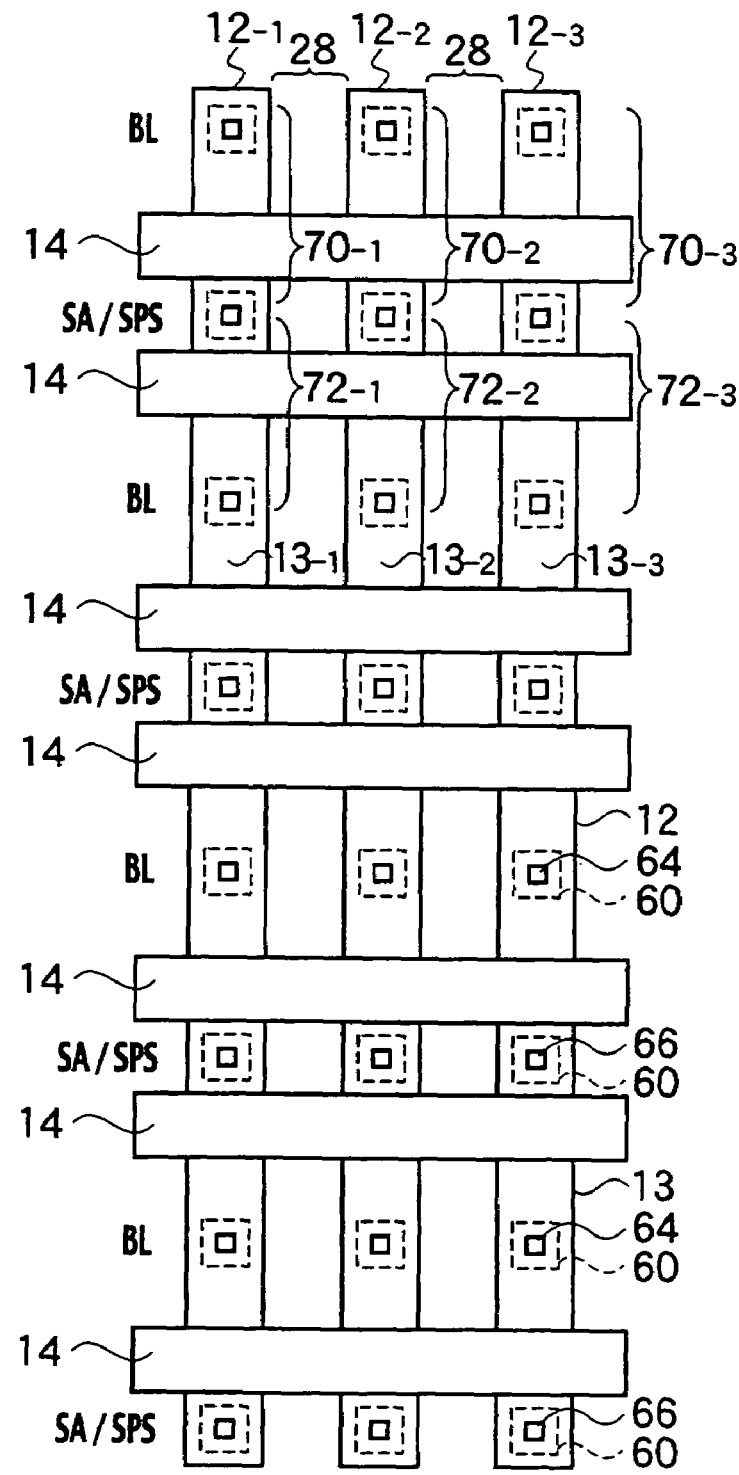
FIG. 44 is a constitution diagram of another layout pattern of a bit line switching transistor on the nonvolatile semiconductor memory device according to the first modified example of the third embodiment of the present invention (fifth layout pattern example: an example case in which surface area is cut by disposing a plurality of the adjacent bit line switching transistors so that they share the source/drain diffusion layer in the direction orthogonal to the channel width (first direction)).
Figure 45:
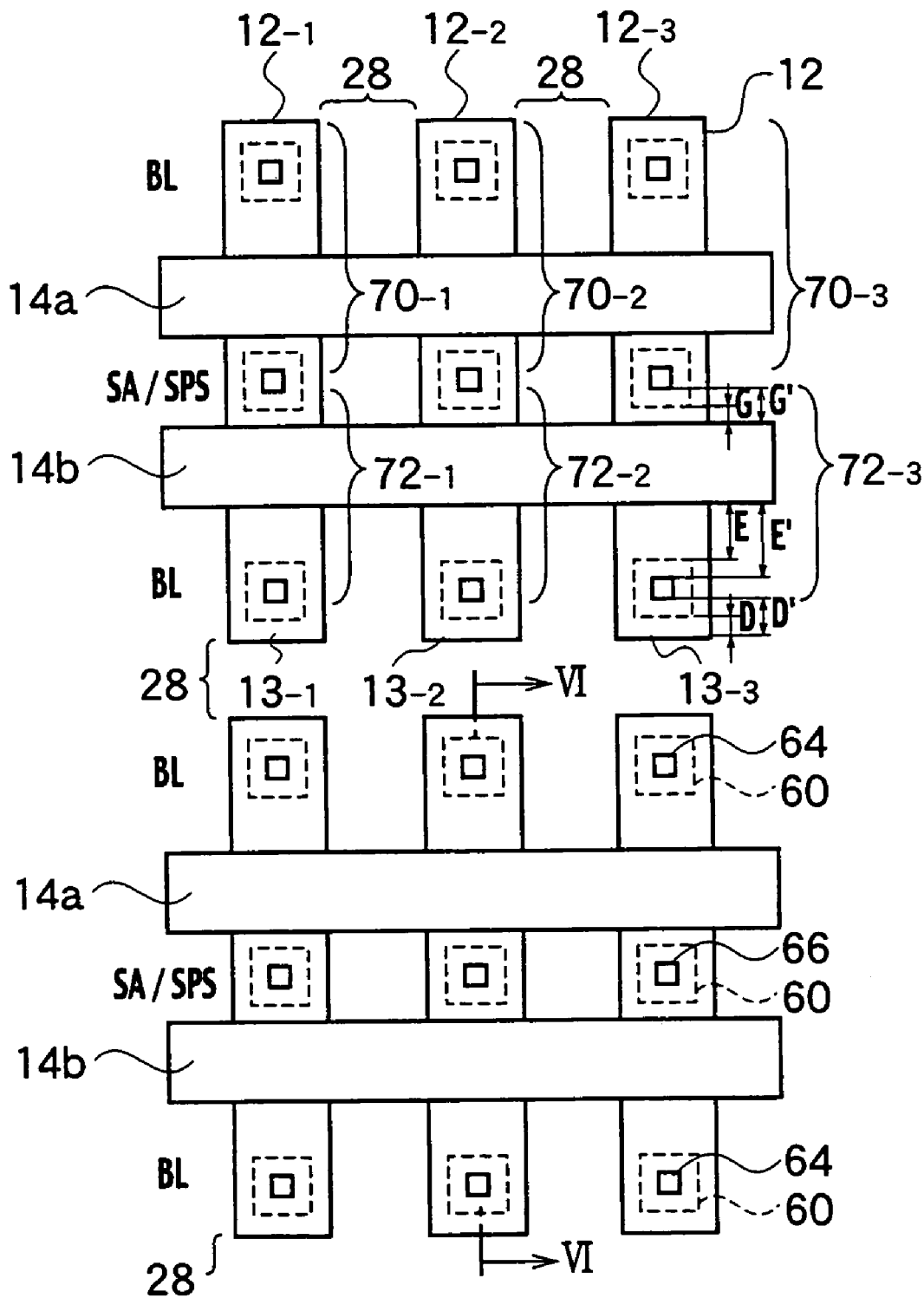
FIG. 45 is a constitution diagram of yet another layout pattern of a bit line switching transistor on the nonvolatile semiconductor memory device according to the first modified example of the third embodiment of the present invention (sixth layout pattern example: an example case in which surface area is cut by having a single diffusion layer shared by two bit line switching transistors and disposing the diffusion layer connected to the bit line to each of the bit line switching transistors independently so that only the diffusion layer connected to the sense amplifier is shared).

The first modified example of the third embodiment corresponding to FIGS. 38 through 40 is shown in FIGS. 43 through 45.

(Fourth Example of a Layout Pattern of the Bit Line Switching Transistor Unit)

The constitution of a layout pattern of the bit line switching transistor unit 90 of the nonvolatile semiconductor memory device according to the first modified example of the third embodiment of the present invention, using an example case in which a plurality of the bit line switching transistors is disposed sharing the gate electrodes 14a, 14b in the second direction parallel to the channel width, the bit line contact plug 64 is connected to the bit line BL and the sense amplifier/shield power supply contact plug 66 is connected to the sense amplifier 6 or the shield power supply 110, is shown in FIG. 43.

(Fifth Example of a Layout Pattern of the Bit Line Switching Transistor Unit)

The constitution of another layout pattern of the bit line switching transistor unit 90 of the nonvolatile semiconductor memory device according to the first modified example of the third embodiment of the present invention, using an example case in which surface area is cut by disposing a plurality of the adjacent bit line switching transistors so that the adjacent bit line switching transistors share the source/drain diffusion layer in the first direction orthogonal to the channel width, is shown in FIG. 44.

(Sixth Example of a Layout Pattern of the Bit Line Switching Transistor Unit)

The constitution of still another layout pattern of the bit line switching transistor unit 90 of the nonvolatile semiconductor memory device according to the first modified example of the third embodiment of the present invention, using an example case in which surface area is cut by having a single diffusion layer shared by two bit line switching transistors and disposing the diffusion layer connected to the bit line to each of the bit line switching transistors independently so that only the diffusion layer connected to the sense amplifier 6 or the shield power supply 110 is shared, is shown in FIG. 45.

It is attributive of the nonvolatile semiconductor memory device according to the first modified example of the third embodiment of the present invention that E is established greater than G (E>G), and E' is established greater than G' (E'>G') on the layout pattern of the bit line switching transistor. Plainly stated, E, which is the distance between the gate electrode 14 and the n⁺ diffusion layer 60 on top of the n⁻ diffusion layer 62 connected to bit line contact plug 64, is greater than G, which is the distance between the gate electrode 14 and the n⁺ diffusion layer 60 on top of the n⁻ diffusion layer 62 connected to the sense amplifier/shield power supply contact plug 66. And E', which is the distance between the gate electrode 14 and the bit line contact plug 64 on top of the n⁻ diffusion layer 62 connected to the bit line contact plug 64, is greater than G', which is the distance between the gate electrode 14 and the sense amplifier/shield power supply contact plug 66 on top of the n⁻ diffusion layer 62 connected to the sense amplifier/shield power supply contact plug 66.

Figure 46:
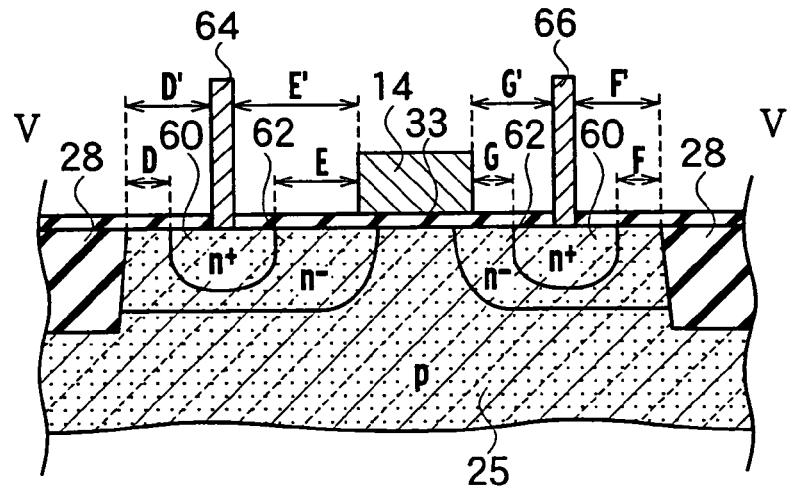
FIG. 46 is a schematic cross section diagram taken on the V—V line in FIG. 43 spanning orthogonal to the channel width, showing a bit line switching transistor.

As shown in FIG. 46, the schematic cross section structure of the bit line switching transistor exhibited by the cross section taken along the V—V line spanning in the first direction orthogonal to the channel width in FIG. 43, includes the p-well region 25, the element isolation region 28, the n⁻ diffusion layer 62, the n⁺ diffusion layer 60, the bit line contact plug 64 and the sense amplifier/shield power supply contact plug 66, the gate insulating film 33 of the bit line switching transistor, and the gate electrode 14. The n⁻ diffusion layer 62 defines the active area 13-2, the n⁺ diffusion layer 60 is formed inside of the n⁻ diffusion layer 62, the bit line contact plug 64 and the sense amplifier/shield power supply contact plug 66 are each disposed to the n⁺ diffusion layer 60, and the gate electrodes 14 is disposed on top of the gate insulating film 33.

Figure 47:
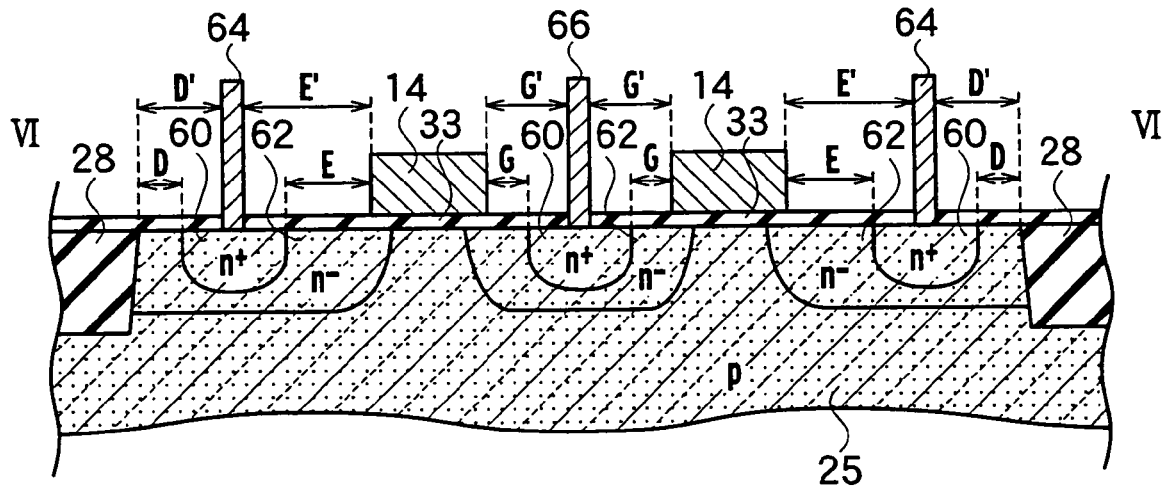
FIG. 47 is a schematic cross section diagram taken on the VI—VI line in FIG. 45 spanning orthogonal to the channel width, showing a bit line switching transistor.

As shown in FIG. 47, the schematic cross section structure of the bit line switching transistor exhibited by the cross section taken along the VI—VI line spanning in the first direction orthogonal to the channel width in FIG. 45, includes the p-well region 25, the element isolation region 28 formed inside of the p-well region 25, the n⁻ diffusion layer 62, the n⁺ diffusion layer 60, the bit line contact plug 64 and the sense amplifier/shield power supply contact plug 66, the gate insulating film 33 of the bit line switching transistor, and the gate electrode 14. The n⁻ diffusion layer 62 defines the active areas 12-2, 13-2, the n⁺ diffusion layer 60 is formed inside of the n⁻ diffusion layer 62, the bit line contact plug 64 and the sense amplifier/shield power supply contact plug 66 are each disposed to the n⁺ diffusion layer 60, and the gate electrode 14 is disposed on top of the gate insulating film 33.

As shown in FIGS. 46 and 47, the n⁺ diffusion layer 60 is surrounded and shielded by the n⁻ diffusion layer 62. The n⁻ diffusion layer 62 is disposed as an offset region in between the gate electrode 14 and the n⁺ diffusion layer 60. The length Ldd (offset length) of the n⁻ diffusion layer 62 serving as the offset region is equivalent to E at the n⁻ diffusion layer 62 connected to the bit line contact plug 64, and is equivalent to G at the n⁻ diffusion layer 62 connected to the sense amplifier/shield power supply contact plug 66 and so offset length E is greater than offset length G (E>G). It is desirable that the n⁺ diffusion layer 60 is formed as an arsenic (As) impurity doped layer and the n⁻ diffusion layer 62 is formed as a phosphorous (P) impurity doped layer in order to secure the junction breakdown voltage while simultaneously suppressing the short-channel effect.

Here, the gate length of the bit line switching transistor is in the range of 0.5„m to 2„m and the thickness of the gate insulating film 33 is in the range of 20 nm to 50 nm.

In order to gain a larger technological advantage from device miniaturization, it is desirable to establish E/G>1.5, E−G>0.2„m, E'/G'>1.5 and E'−G'>0.2„m, having that E is the distance between the gate electrode 14 and the n⁺ diffusion layer 60 on top of the n⁻ diffusion layer 62 connected to the bit line contact plug 64, G is the distance between the gate electrode 14 and the n⁺ diffusion layer 60 on top of the n⁻ diffusion layer 62 connected to the sense amplifier/shield power supply contact plug 66, E' is the distance between the gate electrode 14 and the bit line contact plug 64, and G' is the distance between the gate electrode 14 and the sense amplifier/shield power supply contact plug 66.

Figure 48:
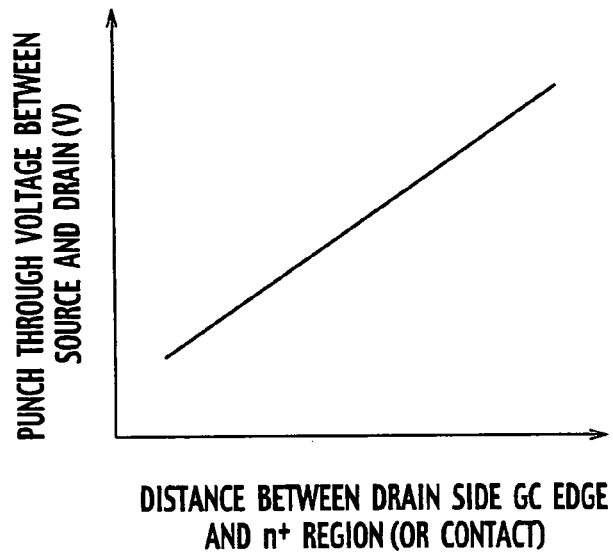
FIG. 48 is the relationship between the source/drain punch-through breakdown voltage and E', which is the distance between the bit line contact plug 64 and the gate electrode 14 (or E, which is the distance between the gate electrode 14 and the n$^+$ diffusion layer 60 connected to the bit line contact plug 64).

The relationship between the source/drain punch-through breakdown voltage of the bit line switching transistor and E', which is the distance between the drain side GC edge of the gate electrode 14 and the bit line contact plug 64 (or E, which is the distance between the gate electrode 14 and the n⁺ diffusion layer 60 that has the bit line contact plug 64 connected), is expressed by the relationship shown in FIG. 48.

Figure 49:
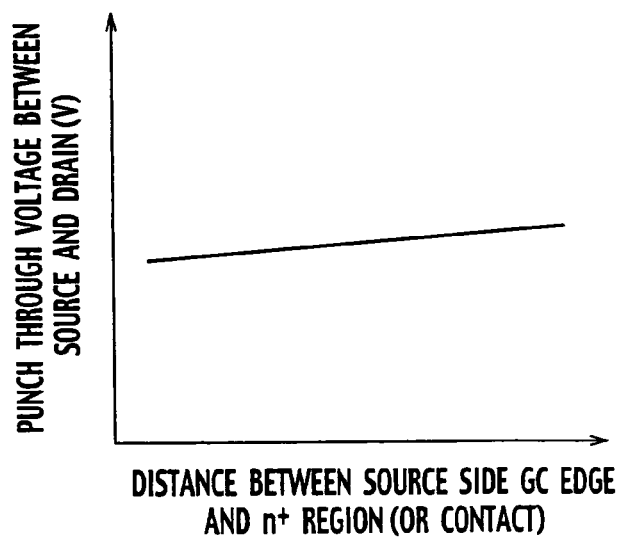
FIG. 49 is the relationship between the source/drain punch-through breakdown voltage and G', which is the distance between the sense amplifier/shield power supply contact plug 66 and the gate electrode 14 (or G, which is the distance between the gate electrode 14 and the n$^+$ diffusion layer 60 connected to the sense amplifier/shield power supply contact plug 66).

The relationship between the source/drain punch-through breakdown voltage of the bit line switching transistor and G', which is the distance between the sense amplifier/shield power supply contact plug 66 and the source side GC edge of the gate electrode 14 (or G, which is the distance between the source side GC edge of the gate electrode 14 and the n⁺ diffusion layer 60 connected to the sense amplifier/shield power supply contact plug 66) is expressed by the relationship shown in FIG. 49. However, there is really no remarkable relationship, as shown in FIG. 49.

As clearly seen from FIGS. 48 and 49, the value of the source/drain punch through breakdown voltage of the bit line switching transistor has remarkable dependence on dimensions E and E' on the drain side, and has no remarkable dependence on dimensions G and G' on the source side. Because of this, it is possible to reduce the surface area of the bit line switching transistor, without remarkable effects on the drain breakdown voltage, by simply reducing the dimensions G and G' on the source side, to which the high erasing voltage $V_{era}$ is not applied.

[Second Modified Example of the Third Embodiment]

Figure 50:
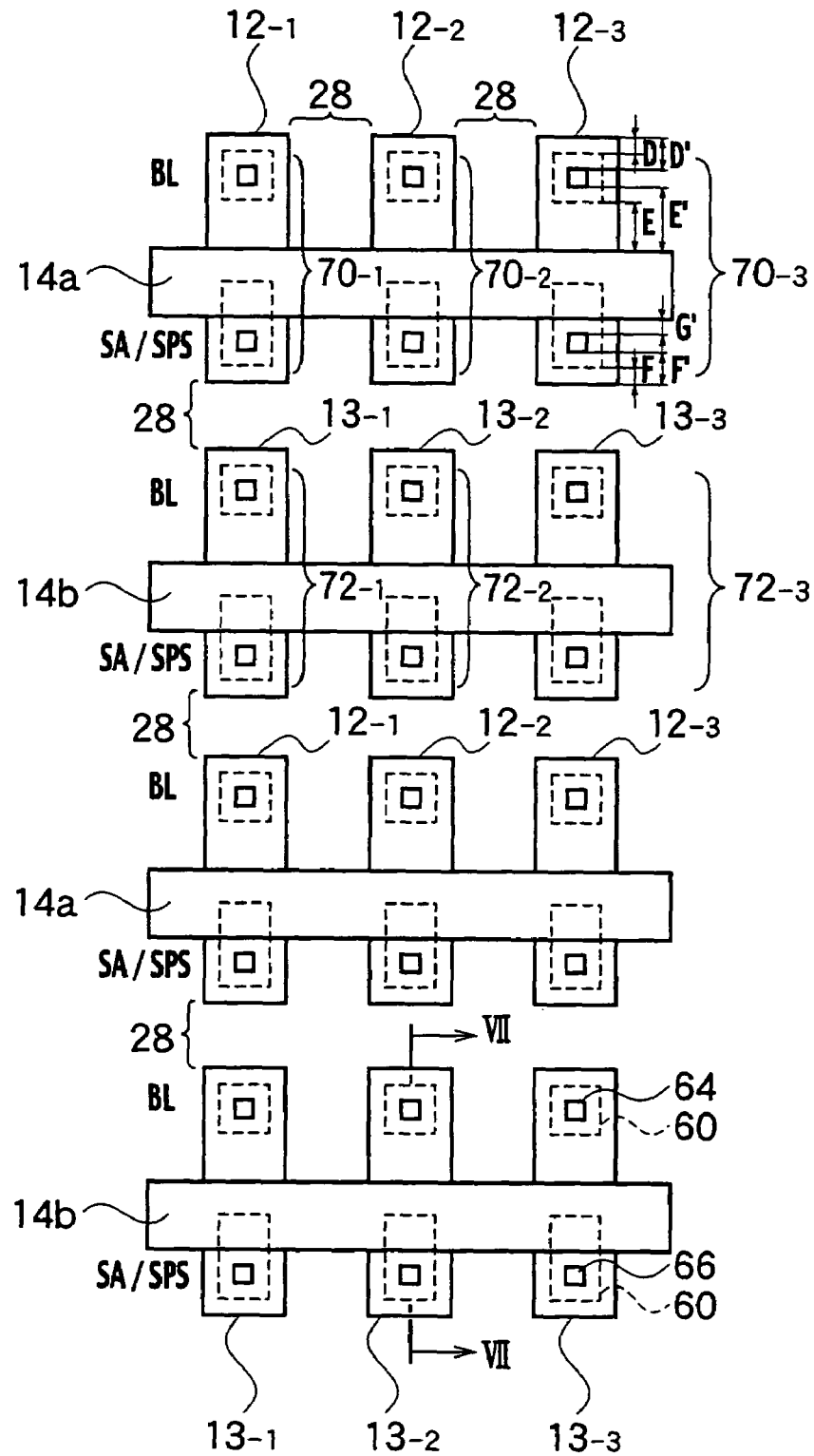
FIG. 50 is a constitution diagram of yet another layout pattern of a bit line switching transistor on the nonvolatile semiconductor memory device according to the second modified example of the third embodiment of the present invention (seventh layout pattern example: an example disposing a plurality of bit line switching transistors sharing a gate, and one end of a contact plug is connected to a bit line, and the other end is connected to a sense amplifier or a shield power supply, while establishing E>G, E'>G', G=0)
Figure 51:
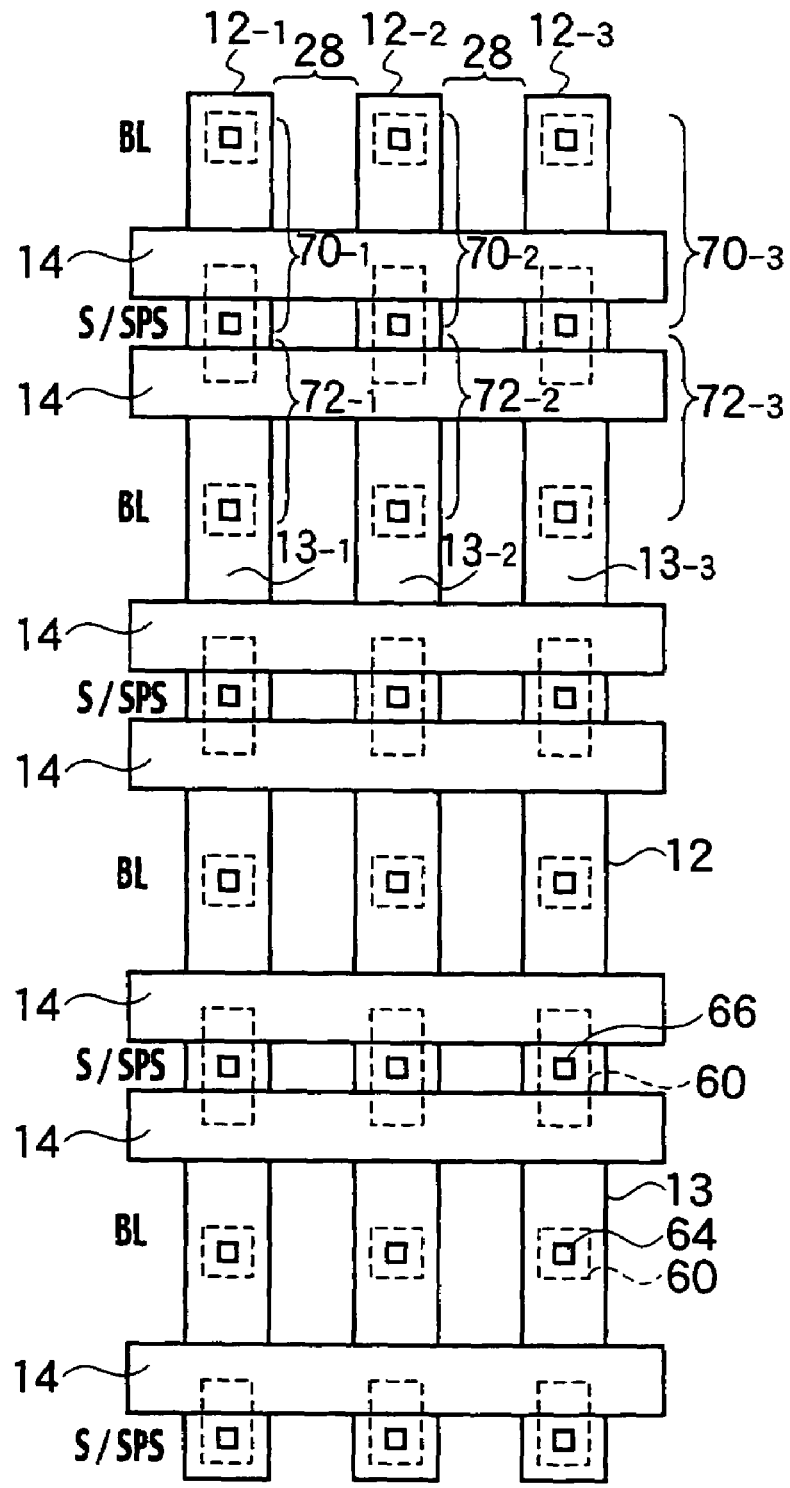
FIG. 51 is a constitution diagram of yet another layout pattern of a bit line switching transistor on the nonvolatile semiconductor memory device according to the second modified example of the third embodiment of the present invention (eighth layout pattern example: an example that cuts surface area by disposing a plurality of adjacent bit line switching transistors sharing a source/drain diffusion layer orthogonal to the first direction, while establishing E>G, E'>G', G=0).
Figure 52:
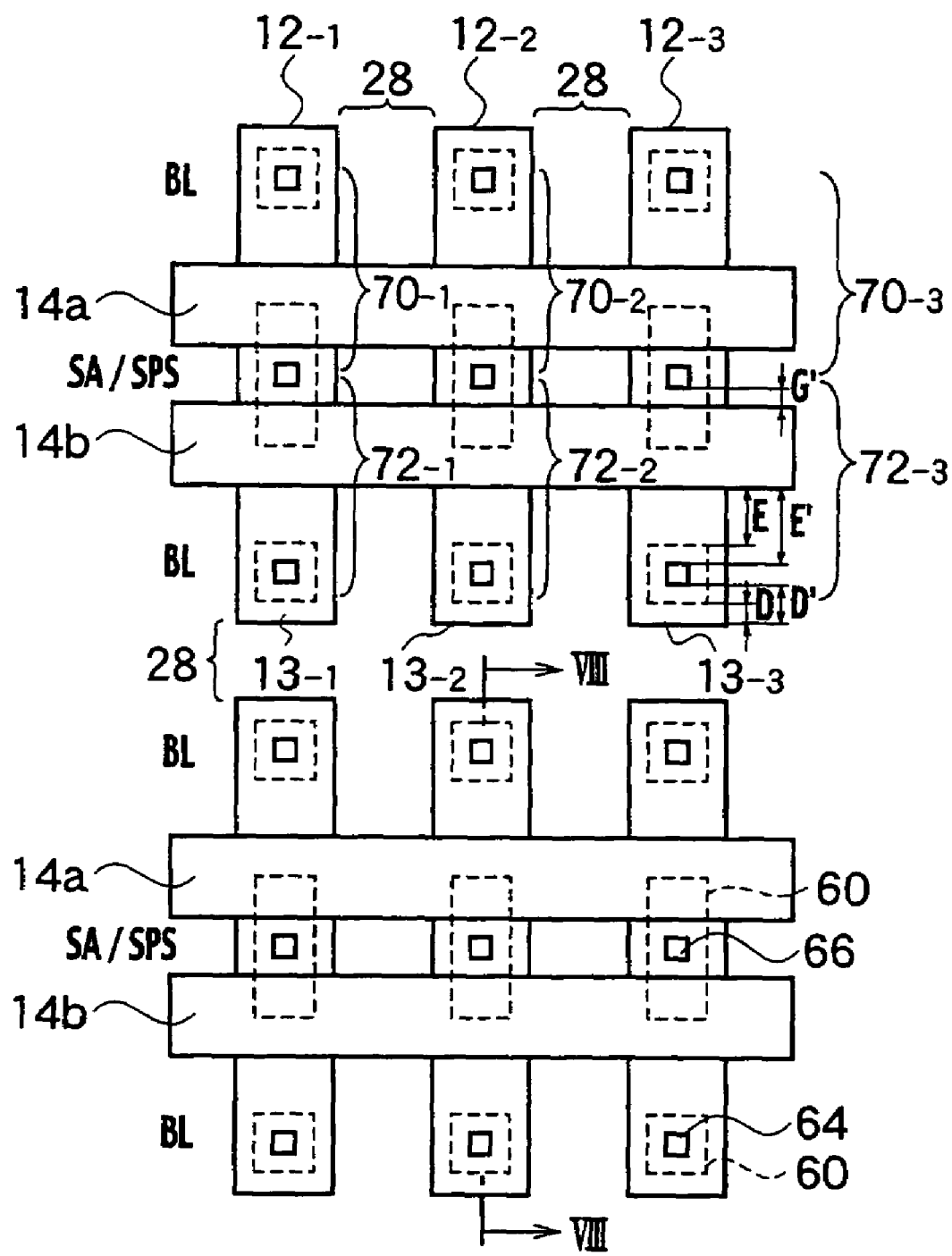
FIG. 52 is a constitution diagram of yet another layout pattern of a bit line switching transistor on the nonvolatile semiconductor memory device according to the second modified example of the third embodiment of the present invention (ninth layout pattern example: an example case in which surface area is cut by having a single diffusion layer shared by two bit line switching transistors and disposing the diffusion layer connected to the bit line to each of the bit line switching transistors independently so that only the diffusion layer connected to the sense amplifier is shared, while establishing E>G, E'>G', G=0)

The second modified example of the third embodiment corresponding to FIGS. 38 through 40 is shown in FIGS. 50 through 52.

(Seventh Example of a Layout Pattern of the Bit Line Switching Transistor Unit)

The constitution of still another layout pattern of the bit line switching transistor unit 90 of the nonvolatile semiconductor memory device according to the second modified example of the third embodiment of the present invention, using an example case in which the bit line switching transistors are disposed sharing the gate electrodes 14a, 14b in the second direction parallel to the channel width, the bit line contact plug 64 is connected to the bit line BL, the sense amplifier/shield power supply contact plug 66 is connected to the sense amplifier 6 or the shield power supply 110, while establishing E greater than G (E>G), E' greater than G' (E'>G') and G equal to 0 (G=0), is shown in FIG. 50.

(Eighth Example of a Layout Pattern of the Bit Line Switching Transistor Unit)

The constitution of still another layout pattern of the bit line switching transistor unit 90 of the nonvolatile semiconductor memory device according to the second modified example of the third embodiment of the present invention, using an example case in which surface area is cut by disposing a plurality of the adjacent bit line switching transistors so that they share the source/drain diffusion layer in the first direction orthogonal to the channel width, while establishing E greater than G (E>G), E' greater than G' (E'>G') and G equal to 0 (G=0), is shown in FIG. 51.

(Ninth Example of a Layout Pattern of the Bit Line Switching Transistor Unit)

The constitution of still another layout pattern of the bit line switching transistor unit 90 of the nonvolatile semiconductor memory device according to the second modified example of the third embodiment of the present invention, using an example case in which surface area is cut by having a single diffusion layer shared by two bit line switching transistors and disposing the diffusion layer connected to the bit line to each of the bit line switching transistors independently so that only the diffusion layer connected to the sense amplifier 6 or the shield power supply 110 is shared while establishing E greater than G (E>G), E' greater than G' (E'>G') and G equal to 0 (G=0), is shown in FIG. 52.

It is attributive of the nonvolatile semiconductor memory device according to the second modified example of the third embodiment of the present invention that E>G, and E'>G' shown in FIGS. 50 and 52, G equals 0 (G=0). Plainly stated, G, which is the distance between the gate electrode 14 and the n⁺ diffusion layer 60 connected to the sense amplifier/shield power supply contact plug 66, is zero.

Figure 53:
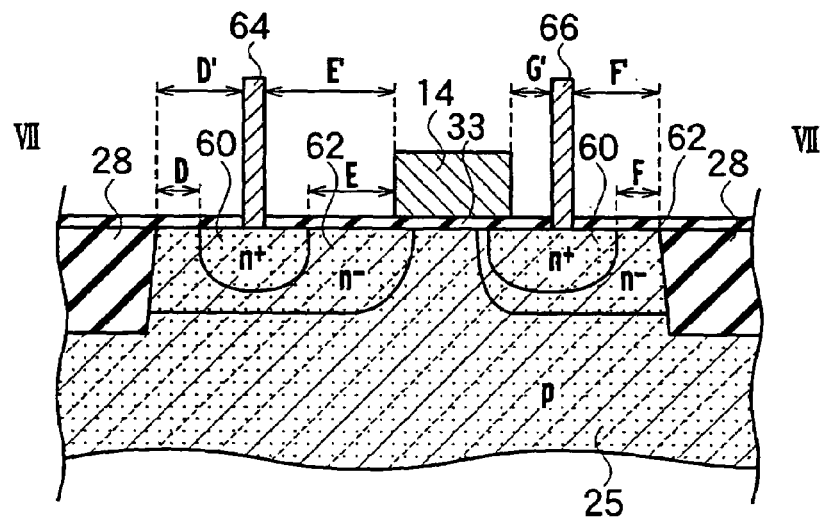
FIG. 53 is a schematic cross section diagram taken on the VII—VII line in FIG. 50 spanning orthogonal to the channel width, showing a bit line switching transistor.

As shown in FIG. 53, the schematic cross section structure of the bit line switching transistor exhibited by the cross section taken along the VII—VII line spanning in the first direction orthogonal to the channel width in FIG. 50, includes the p-well region 25, the element isolation region 28 formed inside of the p-well region 25, the n⁻ diffusion layer 62, the n⁺ diffusion layer 60, the bit line contact plug 64 and the sense amplifier/shield power supply contact plug 66, the gate insulating film 33 of the bit line switching transistor, and the gate electrode 14. The n⁻ diffusion layer 62 defines the active area 13-2, the n⁺ diffusion layer 60 is formed inside of the n⁻ diffusion layer 62, the bit line contact plug 64 and the sense amplifier/shield power supply contact plug 66 are each disposed to the n⁺ diffusion layer 60, and the gate electrode 14 is disposed on top of the gate insulating film 33.

Figure 54:
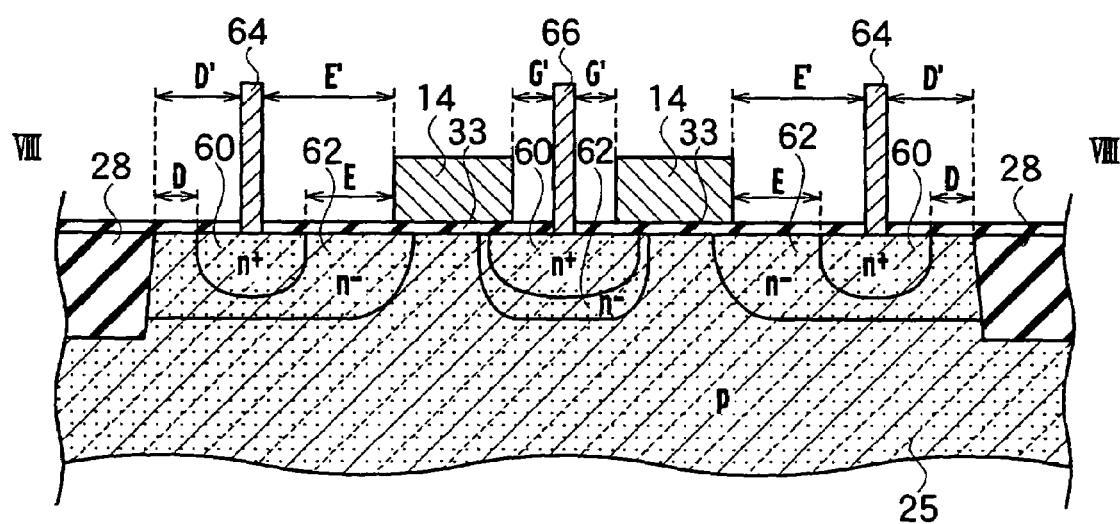
FIG. 54 is a schematic cross section diagram taken on the VIII—VIII line in FIG. 52 spanning orthogonal to the channel width, showing a bit line switching transistor.

As shown in FIG. 54, the schematic cross section structure of the bit line switching transistor exhibited by the cross section taken along the VIII—VIII line spanning in the first direction orthogonal to the channel width in FIG. 52, includes the p-well region 25, the element isolation region 28 formed inside of the p-well region 25, the n⁻ diffusion layer 62, the n⁺ diffusion layer 60, the bit line contact plug 64 and the sense amplifier/shield power supply contact plug 66, the gate insulating film 33 of the bit line switching transistor, and the gate electrode 14. The n⁻ diffusion layer 62 defines the active areas 12-2, 13-2, the n⁺ diffusion layer 60 is formed inside of the n⁻ diffusion layer 62, the bit line contact plug 64 and the sense amplifier/shield power supply contact plug 66 are each disposed to the n⁺ diffusion layer 60, and the gate electrode 14 is disposed on top of the gate insulating film 33.

As shown in FIGS. 53 and 54, the n⁺ diffusion layer 60 is surrounded and shielded by the n⁻ diffusion layer 62. The n⁻ diffusion layer 62 is disposed in an offset region in between the gate electrode 14 and the n⁺ diffusion layer 60. The offset length Ldd of the n⁻ diffusion layer 62 is equivalent to E at the n⁻ diffusion layer 62 connected to the bit line contact plug 64, and is equivalent to G at the n⁻ diffusion layer 62 connected to the sense amplifier/shield power supply contact plug 66, thus leading to G=0 and E>G=0.

The n⁺ diffusion layer 60 connected to the sense amplifier/shield power supply contact plug 66 is shielded by the n⁻ diffusion layer 62, and there exists no offset region in between the gate electrode 14 and the n⁺ diffusion layer 60.

According to the structure as shown in FIGS. 53 and 54, there is the technological advantage of being able to even further reduce G', which is the distance between the sense amplifier/shield power supply contact plug 66 and the gate electrode 14 on the source side connected to the sense amplifier/shield power supply contact plug 66.

[Third Modified Example of the Third Embodiment]

Figure 55:
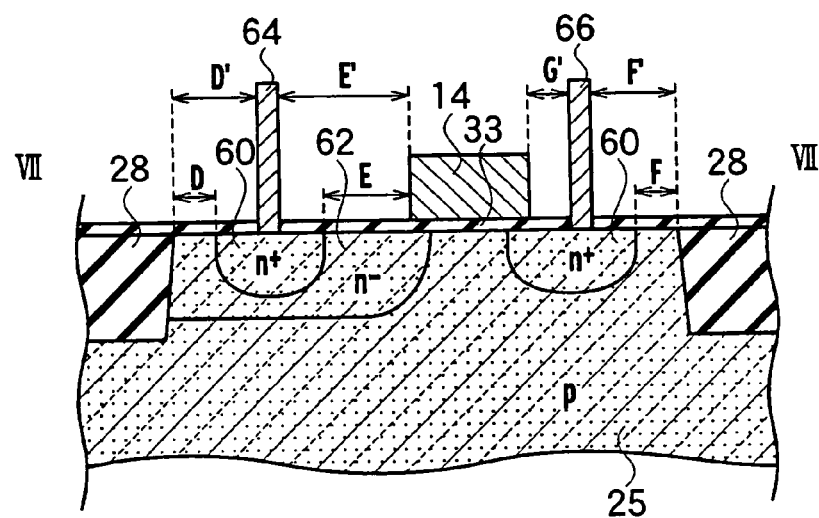
FIG. 55 is a schematic cross section diagram taken on the VII—VII line spanning orthogonal to the channel width, showing the word line transfer transistor on the nonvolatile semiconductor memory device according to the third modified example of the third embodiment of the present invention (Structured forming the source side diffusion layer only on the $n^+$ diffusion layer and not forming the $n^-$ diffusion layer).

As shown in FIG. 55, another schematic cross section structure of the bit line switching transistor that forms the source side diffusion layer only at the n⁺ diffusion layer 60 and does not form the n⁻ diffusion layer 62 on the source side is exhibited by the cross section taken along the VII—VII line spanning in the first direction orthogonal to the channel width in FIG. 50, includes the p-well region 25, the element isolation region 28 formed inside of the p-well region 25, the n⁻ diffusion layer 62, the n⁺ diffusion layer 60 formed inside of the n⁻ diffusion layer 62, the n⁺ diffusion layer 60 formed on the source side, the bit line contact plug 64 and the sense amplifier/shield power supply contact plug 66, the gate insulating film 33 of the bit line switching transistor, and the gate electrode 14. The n⁻ diffusion layer 62 is formed only on the drain side, the bit line contact plug 64 and the sense amplifier/shield power supply contact plug 66 are each disposed to the n⁺ diffusion layer 60, and the gate electrode 14 is disposed on top of the gate insulating film 33.

Figure 56:
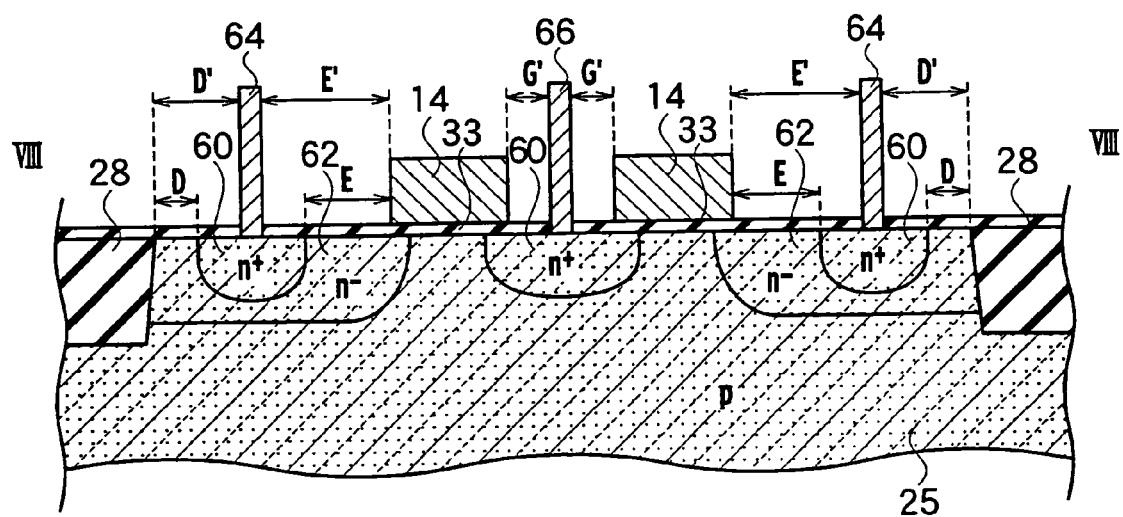
FIG. 56 is a schematic cross section diagram taken on the VIII—VIII line spanning orthogonal to the channel width, showing the word line transfer transistor on the nonvolatile semiconductor memory device according to the third modified example of the third embodiment of the present invention (Structured forming the source side diffusion layer only on the $n^+$ diffusion layer and not forming the $n^-$ diffusion layer).

As shown in FIG. 56, another schematic cross section structure of the bit line switching transistor that forms the source side diffusion layer only at the n⁺ diffusion layer 60 and does not form the n⁻ diffusion layer 62 on the source side is exhibited by the cross section taken along the VIII—VIII line spanning in the first direction orthogonal to the channel width in FIG. 52, includes the p-well region 25, the element isolation region 28 formed inside of the p-well region 25, the n⁻ diffusion layer 62, the n⁺ diffusion layer 60 formed inside of the n⁻ diffusion layer 62, the n⁺ diffusion layer 60 formed on the source side, the bit line contact plug 64 and the sense amplifier/shield power supply contact plug 66, the gate insulating film 33 of the bit line switching transistor, and the gate electrode 14. The n⁻ diffusion layer 62 is formed only on the drain side, the bit line contact plug 64 and the sense amplifier/shield power supply contact plug 66 are each disposed to the n⁺ diffusion layer 60, and the gate electrode 14 is disposed on top of the gate insulating film 33.

As shown in FIGS. 55 and 56, although the n⁺ diffusion layer 60 on the drain side is surrounded and shielded by the n⁻ diffusion layer 62, the n⁺ diffusion layer 60 on the source side is not shielded by the n⁻ diffusion layer 62. The n⁻ diffusion layer 62 is disposed in the offset region in between the gate electrode 14 and the n⁺ diffusion layer 60. The offset length Ldd of the n⁻ diffusion layer 62 is E at the n⁻ diffusion layer 62 connected to the bit line contact plug 64.

Here, the n⁺ diffusion layer 60 connected to the sense amplifier/shield power supply contact plug 66 is not shielded by the n⁻ diffusion layer 62. Also, G=0, E>G=0.

According to a structure in this fashion, there is the technological advantage of being able to even further reduce G', which is the distance between the sense amplifier/shield power supply contact plug 66 and the gate electrode 14 on the source side connected to the sense amplifier/shield power supply contact plug 66.

Here, in order to magnify the technological advantage gained by device miniaturization, it is desirable that E'/G'>1.5, E'−G'>0.2„m, and G'<0.5„m, having that E' is the distance between the gate electrode 14 and the bit line contact plug 64, and G' is the distance between the gate electrode 14 and the sense amplifier/shield power supply contact plug 66.

It is also acceptable that F, which is the distance between the edge of the element isolation region 28 and the n⁺ diffusion layer 60 connected to the sense amplifier/shield power supply contact plug 66, be less than D, which is distance between the element isolation region 28 and the n⁺ diffusion layer 60 connected to the bit line contact plug 64. It is also acceptable that F', which is the distance between the sense amplifier/shield power supply contact plug 66 and the edge of the element isolation region 28, be less than D', which is the distance between the bit line contact plug 64 and the edge of the element isolation region 28. Even though the junction breakdown voltage drops by reducing F and F', a high voltage is not applied to the source side connected to the sense amplifier 6 and the shield power supply 110, so there is no significant influence on the junction breakdown voltage of the bit line switching transistor.

[Fourth Modified Example of the Third Embodiment]

Figure 57:
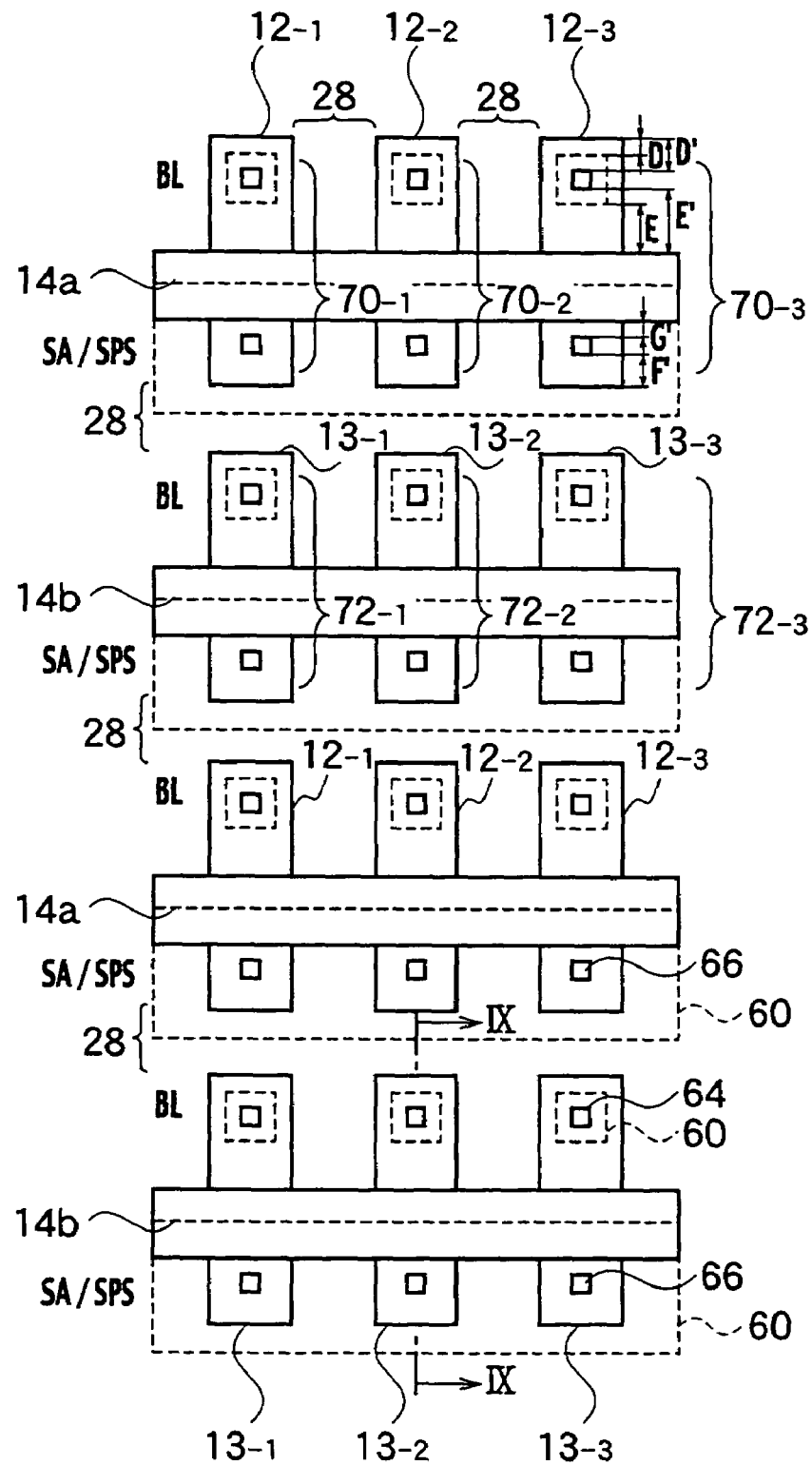
FIG. 57 is a constitution diagram of yet another layout pattern of a bit line switching transistor on the nonvolatile semiconductor memory device according to the fourth modified example of the third embodiment of the present invention (tenth layout pattern example: an example disposing a plurality of bit line switching transistors sharing a gate, and one end of a contact plug is connected to a bit line, and the other end is connected to a sense amplifier, while establishing E>G, E'>G', G=0, F=0).
Figure 58:
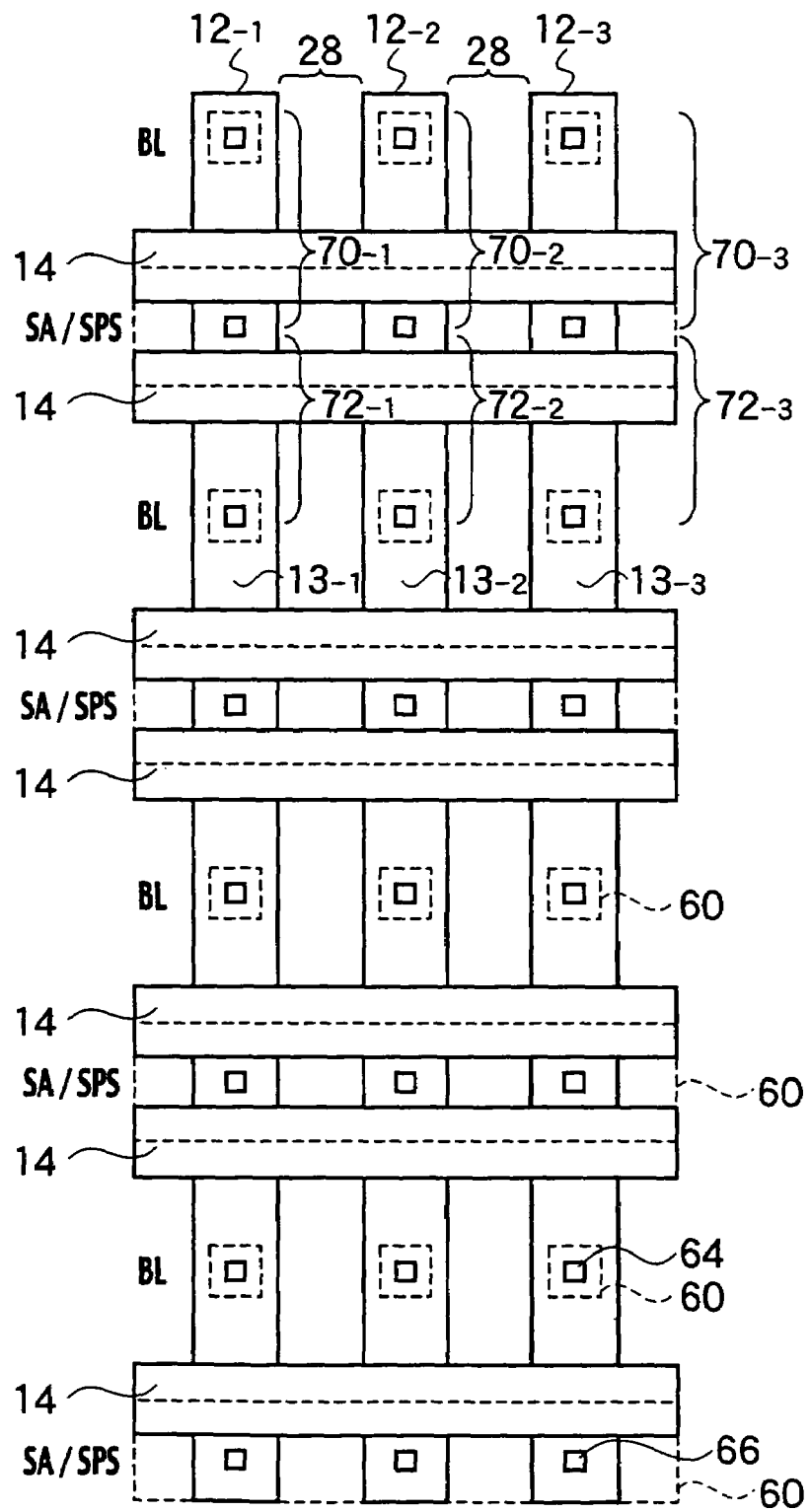
FIG. 58 is a constitution diagram of yet another layout pattern of a bit line switching transistor on the nonvolatile semiconductor memory device according to the fourth modified example of the third embodiment of the present invention (eleventh layout pattern example: an example that cuts surface area by disposing a plurality of adjacent bit line switching transistors sharing a source/drain diffusion layer orthogonal to the first direction, while establishing E>G, E'>G', G=0, F=0).
Figure 59:
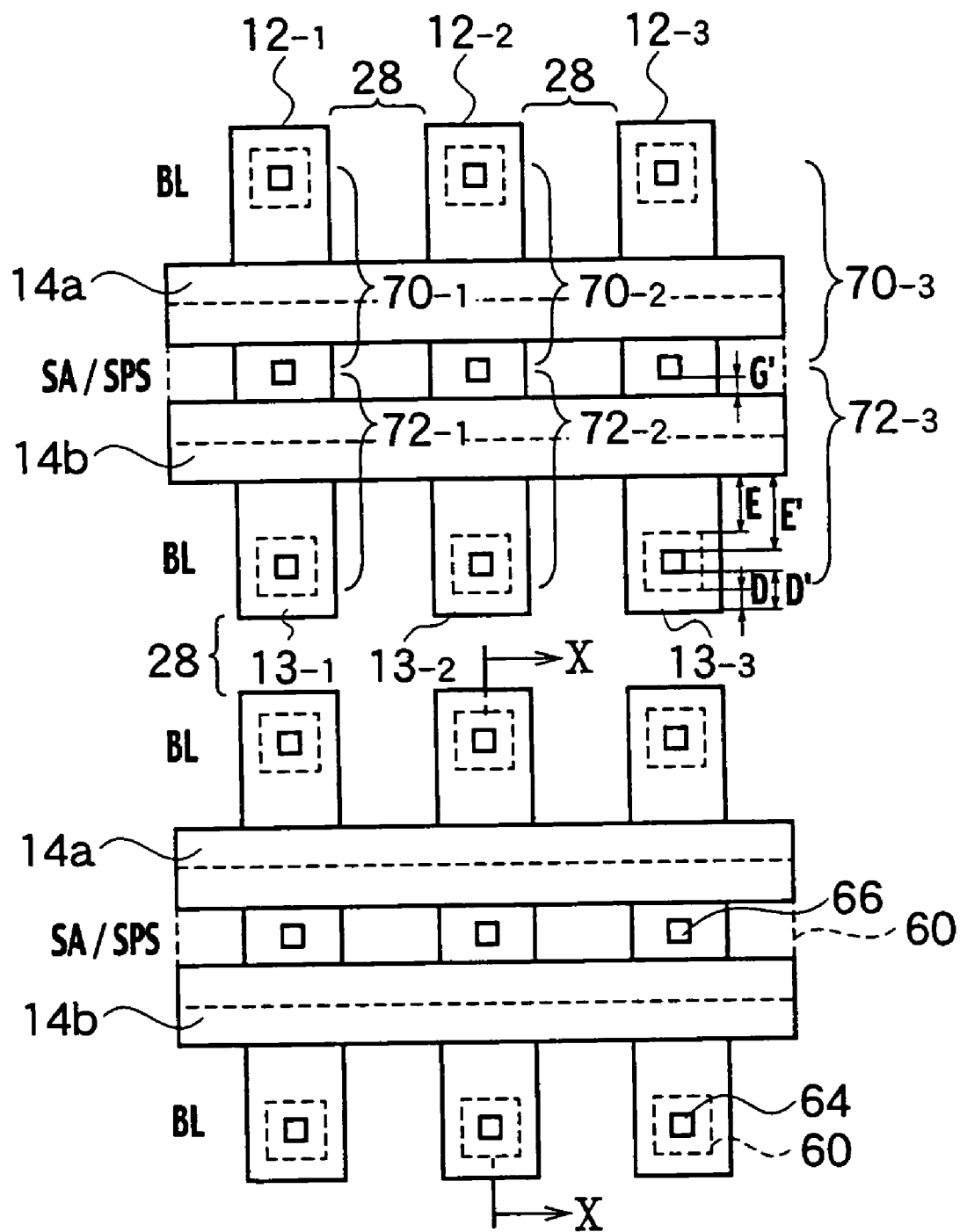
FIG. 59 is a constitution diagram of yet another layout pattern of a bit line switching transistor on the nonvolatile semiconductor memory device according to the fourth modified example of the third embodiment of the present invention (twelfth layout pattern example: an example case in which surface area is cut by having a single diffusion layer shared by two bit line switching transistors and disposing the diffusion layer connected to the bit line to each of the bit line switching transistors independently so that only the diffusion layer connected to the sense amplifier is shared, while establishing E>G, E'>G', G=0, F=0)

The fourth modified example of the third embodiment corresponding to FIGS. 38 through 40 is shown in FIGS. 57 through 59.

(Tenth Example of a Layout Pattern of the Bit Line Switching Transistor Unit)

The constitution of another layout pattern of the bit line switching transistor unit 90 of the nonvolatile semiconductor memory device according to the fourth modified example of the third embodiment of the present invention, using an example case in which a plurality of the bit line switching transistors is disposed sharing the gate electrodes 14a, 14b in the second direction parallel to the channel width, the bit line contact plug 64 is connected to the bit line BL and the sense amplifier/shield power supply contact plug 66 is connected to the sense amplifier 6 or the shield power supply 110, while establishing that E>G, E'>G', G=0, F=0, is shown in FIG. 57.

(Eleventh Example of a Layout Pattern of the Bit Line Switching Transistor Unit)

The constitution of still another layout pattern of the bit line switching transistor unit 90 of the nonvolatile semiconductor memory device according to the fourth modified example of the third embodiment of the present invention, using an example case in which surface area is cut by disposing a plurality of the adjacent transistors so that they share the source/drain diffusion layer in the direction orthogonal to the channel width (first direction), while establishing that E>G, E'>G', G=0, F=0, is shown in FIG. 58.

(Twelfth Example of a Layout Pattern of the Bit Line Switching Transistor Unit)

The constitution of still another layout pattern of the bit line switching transistor unit 90 of the nonvolatile semiconductor memory device according to the fourth modified example of the third embodiment of the present invention, using an example case in which surface area is cut by having a single diffusion layer shared by two bit line switching transistors and disposing the diffusion layer connected to the bit line to each of the bit line switching transistors independently so that only the diffusion layer connected to the sense amplifier 6 or the shield power supply 110 is shared, while establishing that E>G, E'>G', G=0, F=0, is shown in FIG. 59.

In the fourth modified example of the third embodiment of the present invention shown in FIGS. 57 to 59, it is attributive that E>G, and E'>G', but in addition to this, G=0. Stated plainly, G, which is the distance between the gate electrode 14 and the $n^+$ diffusion layer 60 connected to the sense amplifier/shield power supply contact plug 66, is zero. Further, the $n^+$ diffusion layer 60 connected to the sense amplifier/shield power supply contact plug 66 on the source side is formed to cover the entire device elemental region (F=0). As a result, it is possible to improve on the mask lithography margins through the ion implantation process used to form the $n^+$ diffusion layer 60.

Figure 60:
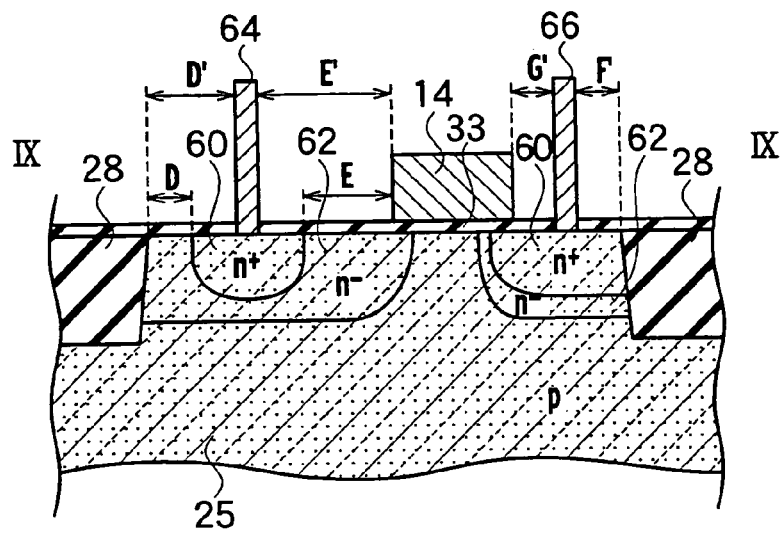
FIG. 60 is a schematic cross section diagram taken on the IX—IX line in FIG. 57 spanning orthogonal to the channel width, showing a bit line switching transistor.

As shown in FIG. 60, the schematic cross section structure of the bit line switching transistor exhibited by the cross section taken along the IX—IX line spanning in the first direction orthogonal to the channel width in FIG. 57 includes the p-well region 25, the element isolation region 28, the $n^-$ diffusion layer 62, the $n^+$ diffusion layer 60, the bit line contact plug 64, the sense amplifier/shield power supply contact plug 66, the gate insulating film 33, and the gate electrode 14. The $n^-$ diffusion layer 62 defines the active area 13-2, the $n^+$ diffusion layer 60 is formed inside of the $n^-$ diffusion layer 62, the bit line contact plug 64 and the sense amplifier/shield power supply contact plug 66 are each disposed to the $n^+$ diffusion layer 60, and the gate electrode 14 is disposed on top of the gate insulating film 33.

Figure 61:
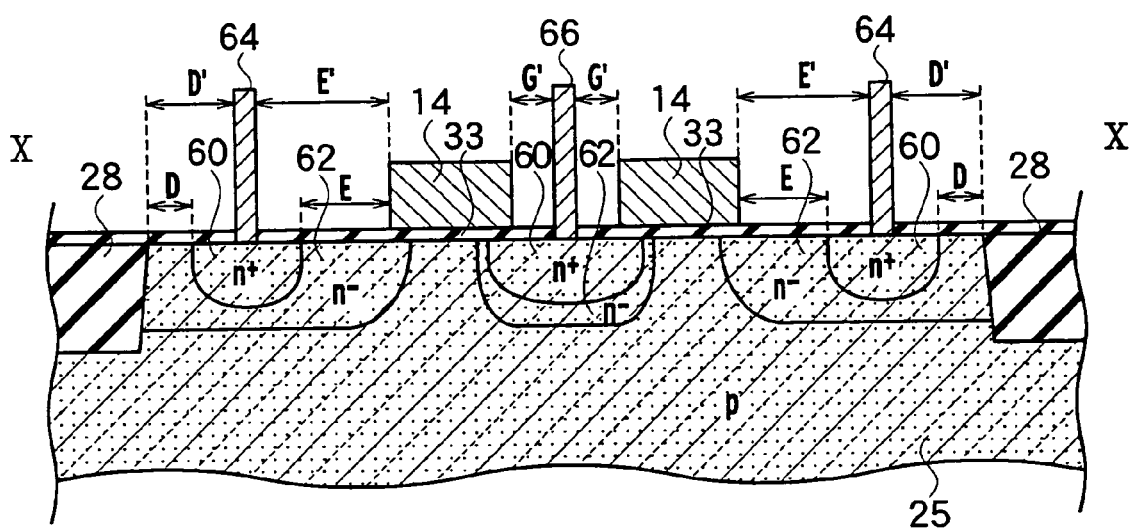
FIG. 61 is a schematic cross section diagram taken on the X—X line in FIG. 59 spanning orthogonal to the channel width, showing a bit line switching transistor.

As shown in FIG. 61, the schematic cross section structure of the word line transfer transistor exhibited by the cross section taken along the X—X line spanning in the first direction orthogonal to the channel width in FIG. 57 includes the p-well region 25, the element isolation region 28, the $n^-$ diffusion layer 62, the $n^+$ diffusion layer 60, the bit line contact plug 64, the sense amplifier/shield power supply contact plug 66, the gate insulating film 33, and the gate electrode 14. The $n^-$ diffusion layer 62 defines the active areas 12-2, 13-2, the $n^+$ diffusion layer 60 is formed inside of the $n^-$ diffusion layer 62, the bit line contact plug 64 and the sense amplifier/shield power supply contact plug 66 are each disposed to the $n^+$ diffusion layer 60, and the gate electrode 14 is disposed on top of the gate insulating film 33.

As shown in FIGS. 60 and 61, the $n^+$ diffusion layer 60 is surrounded and shielded by the $n^-$ diffusion layer 62. The $n^-$ diffusion layer 62 is disposed in the offset region in between the gate electrode 14 and the bit line contact plug 64. Here, the $n^-$ diffusion layer 62 covers the $n^+$ diffusion layer 60 connected to the sense amplifier/shield power supply contact plug 66 and there is no offset region in between the $n^+$ diffusion layer 60 and the gate electrode 14. More specifically, at the $n^-$ diffusion layer 62 connected to the bit line contact plug 64, the offset length Ldd of the $n^-$ diffusion layer 62 is E, but at the $n^-$ diffusion layer 62 connected to the sense amplifier/shield power supply contact plug 66, the offset length Ldd of the $n^-$ diffusion layer 62 is G=0, and E>G=0. According to a structure in this fashion, there is the technological advantage of being able to even further reduce G', which is the distance between the sense amplifier/shield power supply contact plug 66 and the gate electrode 14. Further, as shown in FIG. 60, the $n^+$ diffusion layer 60 connected to the sense amplifier/shield power supply contact plug 66 is structured contacting the element isolation region 28.

[Fifth Modified Example of the Third Embodiment]

Figure 62:
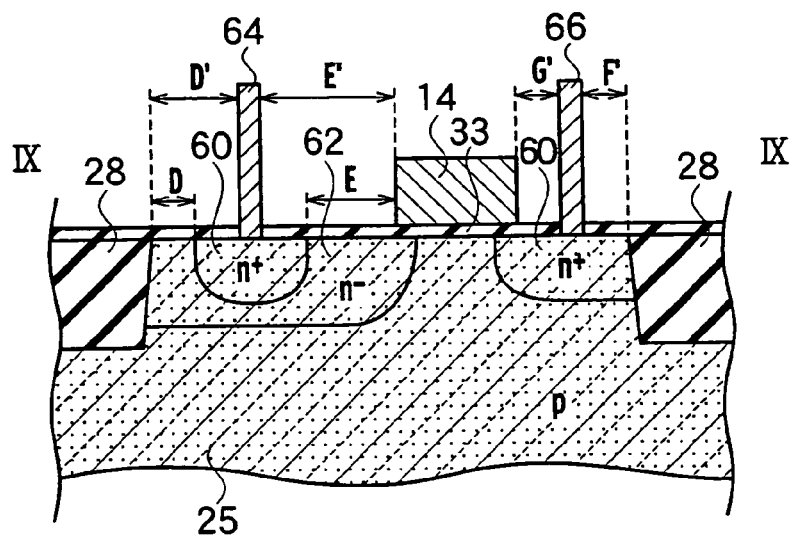
FIG. 62 is a schematic cross section diagram taken on the IX—IX line spanning orthogonal to the channel width, showing the bit line switching transistor on the nonvolatile semiconductor memory device according to the fifth modified example of the third embodiment of the present invention (Structured forming the source side diffusion layer only on the $n^+$ diffusion layer and not forming the $n^-$ diffusion layer).

As shown in FIG. 62, another schematic cross section structure of the bit line switching transistor that forms the source side diffusion layer only at the $n^+$ diffusion layer 60 and does not form the $n^-$ diffusion layer 62 on the source side is exhibited by the cross section taken along the IX—IX line spanning in the direction orthogonal to the channel width in FIG. 57, includes the p-well region 25, the element isolation region 28 formed inside of the p-well region 25, the $n^-$ diffusion layer 62, the $n^+$ diffusion layer 60 formed inside of the $n^-$ diffusion layer 62, the $n^+$ diffusion layer 60 formed on the source side, the bit line contact plug 64 and the sense amplifier/shield power supply contact plug 66, the gate insulating film 33 of the bit line switching transistor, and the gate electrode 14. The $n^-$ diffusion layer 62 is formed only on the drain side, the bit line contact plug 64 and the sense amplifier/shield power supply contact plug 66 are each disposed to the $n^+$ diffusion layer 60, and the gate electrode 14 is disposed on top of the gate insulating film 33.

Figure 63:
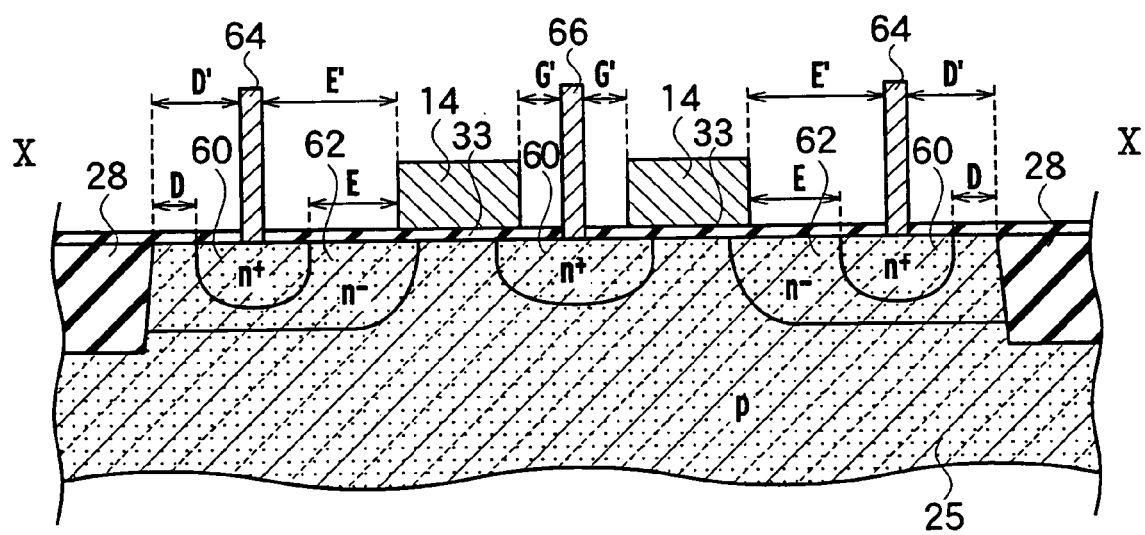
FIG. 63 is a schematic cross section diagram taken on the X—X line spanning orthogonal to the channel width, showing the bit line switching transistor on the nonvolatile semiconductor memory device according to the fifth modified example of the third embodiment of the present invention (Structured forming the source side diffusion layer only on the $n^+$ diffusion layer and not forming the $n^-$ diffusion layer).

As shown in FIG. 63, still another schematic cross section structure of the bit line switching transistor that forms the source side diffusion layer only at the $n^+$ diffusion layer 60 and does not form the $n^-$ diffusion layer 62 on the source side is exhibited by the cross section taken along the X—X line spanning in the first direction orthogonal to the channel width in FIG. 59, includes the p-well region 25, the element isolation region 28 formed inside of the p-well region 25, the $n^-$ diffusion layer 62, the $n^+$ diffusion layer 60 formed inside of the $n^-$ diffusion layer 62, the $n^+$ diffusion layer 60 formed on the source side, the bit line contact plug 64 and the sense amplifier/shield power supply contact plug 66, the gate insulating film 33 of the bit line switching transistor, and the gate electrode 14. The $n^-$ diffusion layer 62 is formed only on the drain side, the bit line contact plug 64 and the sense amplifier/shield power supply contact plug 66 are each disposed to the $n^+$ diffusion layer 60, and the gate electrode 14 is disposed on top of the gate insulating film 33.

As shown in FIGS. 62 and 63, the $n^+$ diffusion layer 60 on the drain side is surrounded and shielded by the $n^-$ diffusion layer 62 but the $n^+$ diffusion layer 60 on the source side is not shielded by the $n^-$ diffusion layer 62. The $n^-$ diffusion layer 62 is disposed in an offset region in between the gate electrode 14 and the n⁺ diffusion layer 60. At the bit line contact plug 64, the offset length Ldd of the n⁻ diffusion layer 62 is E.

The n⁺ diffusion layer 60 on the source side connected to the sense amplifier/shield power supply contact plug 66 is not shielded by the n⁻ diffusion layer 62. Also G=0, and E>G=0.

According to the structure as shown in FIGS. 62 and 63, there is the technological advantage of being able to even further reduce G', which is the distance between the sense amplifier/shield power supply contact plug 66 and the gate electrode 14 on the source side connected to the sense amplifier/shield power supply contact plug 66.

In order to gain a larger technological advantage from device miniaturization, it is desirable to establish E'/G'>1.5, E'−G'>0.2„m, and G'<0.5„m having that E' is the distance between the gate electrode 14 and the bit line contact plug 64, and G' is the distance between the gate electrode 14 and the sense amplifier/shield power supply contact plug 66.

In order to gain a larger technological advantage from device miniaturization, here it is desirable to establish D'/F'>1.5, D'−F'>0.1„m and F'<0.3„m having that F' is the distance between the sense amplifier/shield power supply contact plug 66 and the edge of the element isolation region 28, and D' is the distance between the bit line contact plug 64 and the edge of the element isolation region 28.

By using the nonvolatile semiconductor memory device according to the third embodiment of the present invention, miniaturization of the word line transfer transistors and the bit line switching transistors of the NAND type EEPROM can be realized without any decreasing of the value of the breakdown voltage.

[Fourth Embodiment]

(AND Structure)

The nonvolatile semiconductor memory device according to the first through third embodiments of the present invention has peripheral circuitry made up by high breakdown voltage transistors, including an electrically erasable/re-writeable semiconductor memory in a memory cell array. The circuit constitution of the memory cell array 100 on the nonvolatile semiconductor memory device that is configured to maintain the breakdown voltage of the word line transfer transistors connected to the word lines and the bit line switching transistors connected to the bit lines and having reduced dimensions is not limited to a NAND type, as other circuit constitutions are also applicable.

Figure 64:
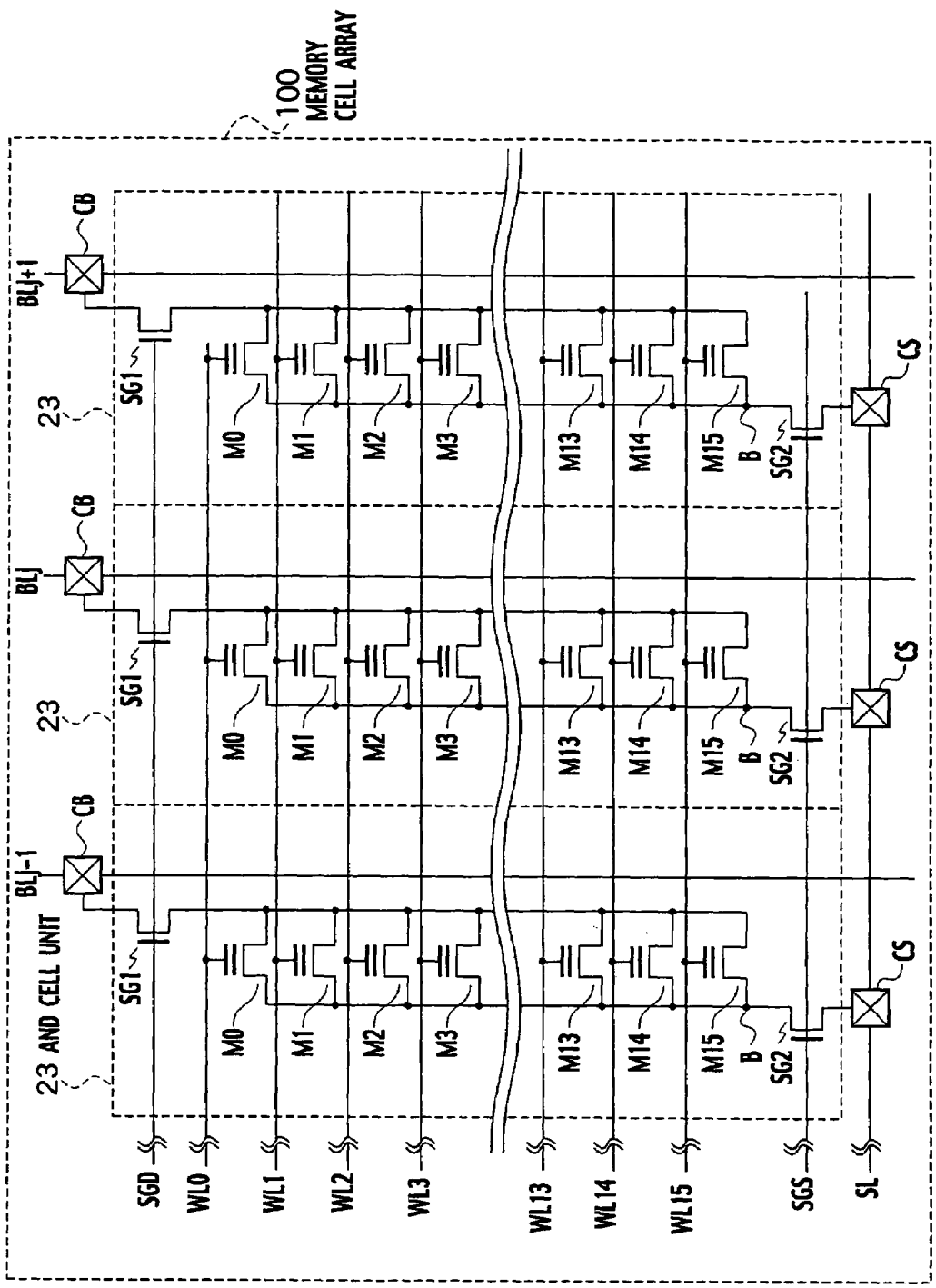
FIG. 64 is a schematic showing an AND type EEPROM applied to the memory cell array as the nonvolatile semiconductor device according to the fourth embodiment of the present invention.

On the nonvolatile semiconductor memory device according to the fourth embodiment of the present invention, an AND type circuit constituted EEPROM applied to the memory cell array 100 has a constitution of a plurality of AND cell units 23 aligned in rows, which is surrounded by the dashed line shown in FIG. 64. The AND cell unit 23 is constituted by the memory cell transistors M0 through M15 connected in parallel, and the select gate transistors SG1 and SG2. The drain of the select gate transistor SG1 is connected to the bit lines . . . BLj−1, BLj, BLj+1 . . . through the bit line contact CB. The source of the select gate transistor SG2 is connected to the common source line SL through the source line contact CS.

The AND cell unit 23 has the each of the drain regions of the memory cell transistors M0 through M15 connected in common, and has each of the source regions of the memory cell transistors M0 through M15 connected in common. The drain regions of the memory cell transistors M0 through M15 connected in parallel are connected to the bit line side select gate transistor SG1. The source regions of the memory cell transistors M0 through M15 connected in parallel are connected to source line side select gate transistor SG2. The word lines WL0 through WL15 spanning in rows are each connected to the gate electrodes of the memory cell transistors M0 through M15. The select gate line SGD is connected to the gate electrode of the bit line side select gate transistor SG1. The select gate line SGS spanning in the row direction is connected to the source line side select gate transistor SG2.

Now, also on the peripheral unit of the AND type circuit structured memory cell array 100 shown in FIG. 64, a word line transfer transistor unit is disposed in the same fashion as in the nonvolatile semiconductor memory device according to the first embodiment of the present invention, or a bit line switching transistor unit is disposed in the same fashion as in the nonvolatile semiconductor memory device according to the third embodiment of the present invention.

By using the nonvolatile semiconductor memory device according to the fourth embodiment of the present invention, miniaturization of the word line transfer transistors and the bit line switching transistors of the AND type EEPROM can be realized without any decreasing of the value of the breakdown voltage.

[Fifth Embodiment]

(NOR Structure)

Figure 65:
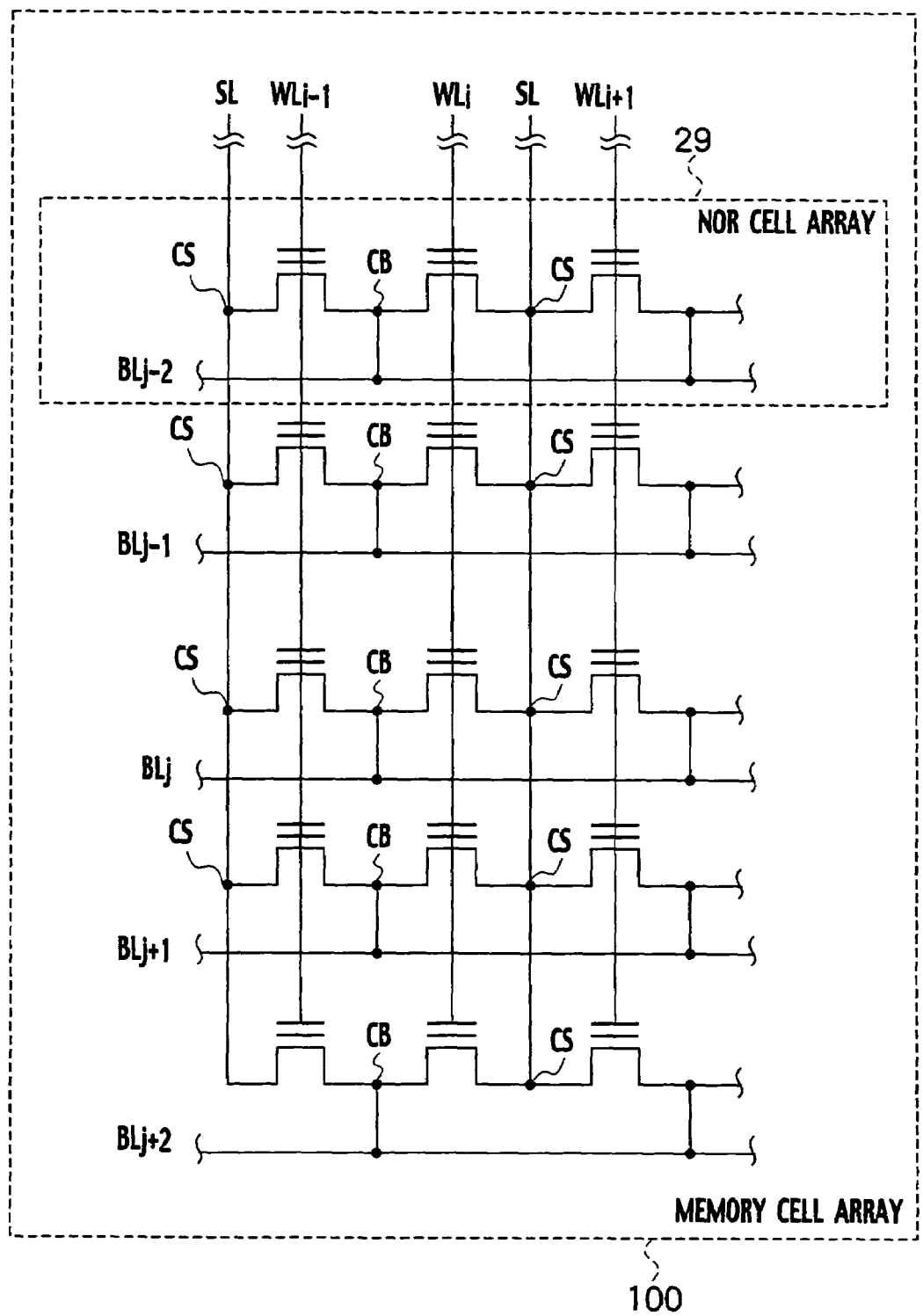
FIG. 65 is a schematic showing a NOR type EEPROM applied to the memory cell array as the nonvolatile semiconductor device according to the fourth embodiment of the present invention.

On the nonvolatile semiconductor memory device according to the fifth embodiment of the present invention, a NOR type circuit constituted EEPROM applied to the memory cell array 100 has a constitution of a plurality of NOR cell units 29 aligned in rows, which is surrounded by the dashed line shown in FIG. 65.

Within the NOR cell unit 29, the common source region of the two adjacent memory cell transistors is connected to the source line SL through the source line contact CS, and the common drain region is connected to the bit lines . . . BLj−2, BLj−1, BLj, BLj+1, BLj+2 . . . through the bit line contact CB. And further, the NOR cell unit 29 is aligned in the direction of the word lines WLi−1, WLi, WLi+1 . . . orthogonally crossing the bit lines . . . BLj−2, BLj−1, BLj, BLj+1, BLj+2 . . . , and each of the word lines WLi−1, WLi, WLi+1 . . . are connected in common with the gates of the memory cell transistors in between the NOR cell unit 29. A nonvolatile semiconductor memory device according to a NOR type circuit structure has high speed reading attributes compared to a nonvolatile semiconductor memory device according to a NAND type circuit structure.

Now, also on the peripheral unit of the NOR type circuit structured memory cell array 100 shown in FIG. 65, a word line transfer transistor unit is disposed in the same fashion as in the nonvolatile semiconductor memory device according to the first embodiment of the present invention, or a bit line switching transistor unit is disposed in the same fashion as in the nonvolatile semiconductor memory device according to the third embodiment of the present invention.

By using the nonvolatile semiconductor memory device according to the fifth embodiment of the present invention, miniaturization of the word line transfer transistors and the bit line switching transistors of the NOR type EEPROM can be realized without any decreasing of the value of the breakdown voltage.

[Sixth Embodiment]

(Two-transistor/Cell Structure)

Figure 66:
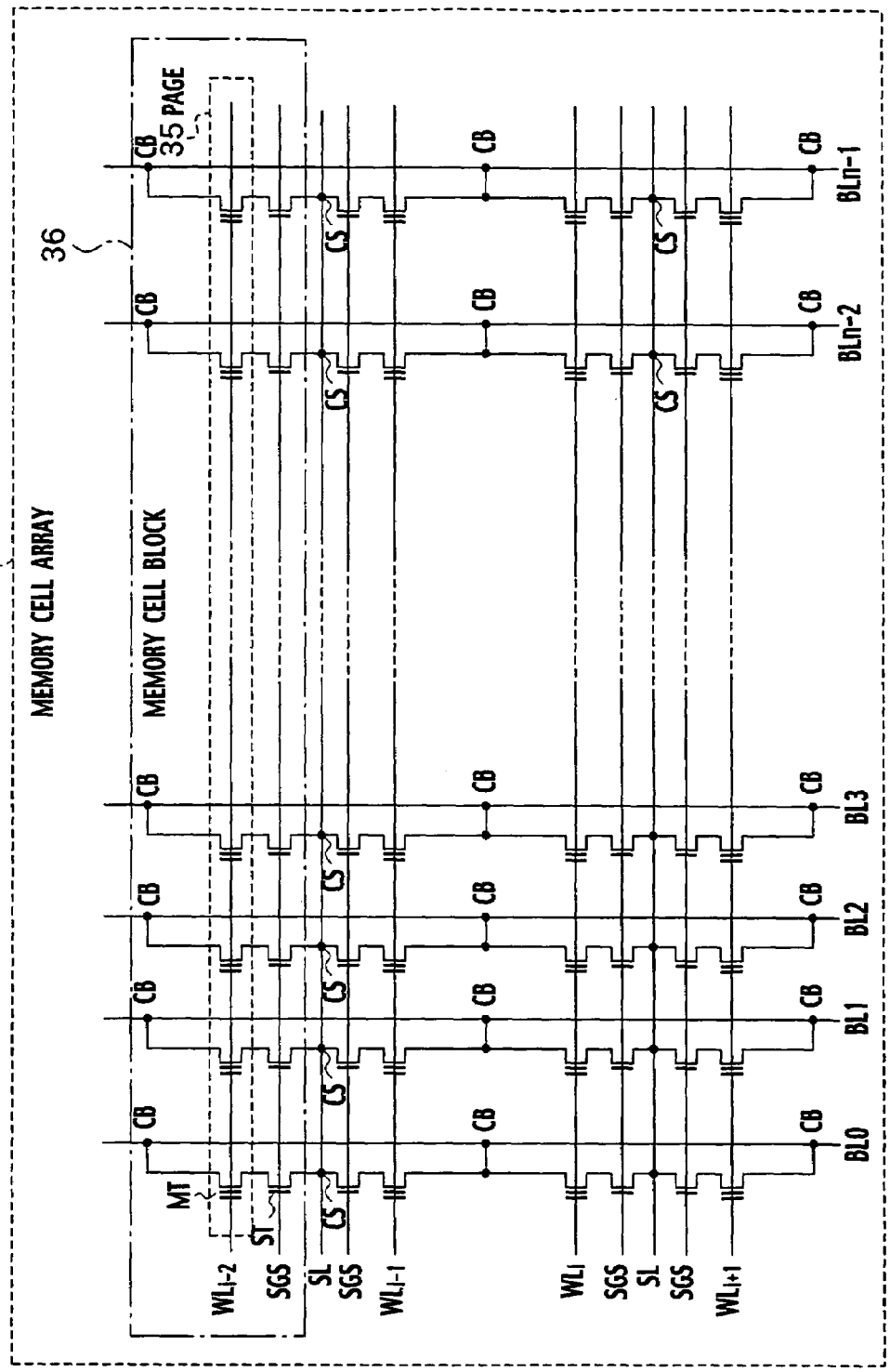
FIG. 66 is a schematic showing a two-transistor/cell type EEPROM applied to the memory cell array as the nonvolatile semiconductor device according to the fourth embodiment of the present invention.

A two transistor/cell constitution EEPROM applied to the memory cell array 100 as the nonvolatile semiconductor memory device according to the sixth embodiment of the present invention has a constitution of a plurality of a memory cell block 36 aligned in columns, which is surrounded by the dashed line shown in FIG. 66. An exemplary semiconductor memory, according to the sixth embodiment of the present invention, has a two-transistor/cell system structure as a basic structure, including a gate insulating film as a tunnel insulating film, which is formed on a p-well or a semiconductor substrate, and memory cells, each having a stacked gate structure configured from a floating gate, an inter-gate insulating film, and a control gate on the gate insulating film. The drain region of a memory cell transistor MT is connected to a bit line contact CB via the diffusion layer, and the source region thereof is connected to the drain region of a select transistor ST via the diffusion layer. In addition, the source region of the select transistor ST is connected to a source line contact CS via the diffusion layer. Such two-transistor/cell memory cells, which are arranged in parallel along the word line length, as shown in FIG. 66, configure a memory cell block 36. Within a single memory cell block 36, the word line $WL_{i-2}$ is commonly connected to the control gates of memory cells, thereby configuring a page unit 35. Naturally, pages within multiple blocks may configure a page unit. In addition, the select gate line SGS is commonly connected to the gates of respective select transistors. On the other hand, along the length of bit lines BL0, BL1, BL2, . . . , BLn, circuit structures having two-transistor/cell system memory cells symmetrically arranged with the source line SL as a line of symmetry are arranged in series.

The memory cell transistor MT and the select gate transistor ST of the two-transistor/cell structure are connected to the bit lines BL0, BL1, BL2, . . . , BLn through the bit line contact CB, and connected to the source line SL through the source line contact CS, forming the memory cell array 100 in the fashion shown in FIG. 66.

Now, also on the peripheral unit of the two transistor/cell constituted memory cell array 100 shown in FIG. 66, a word line transfer transistor unit is disposed in the same fashion as in the nonvolatile semiconductor memory device according to the first embodiment of the present invention, or a bit line switching transistor unit is disposed in the same fashion as in the nonvolatile semiconductor memory device according to the third embodiment of the present invention.

By using the nonvolatile semiconductor memory device according to the sixth embodiment of the present invention, miniaturization of the word line transfer transistors and the bit line switching transistors of the two-transistor/cell constituted EEPROM can be realized without any sacrifice of breakdown voltage.

[Seventh Embodiment]

(Three-transistor/Cell Structure)

Figure 67:
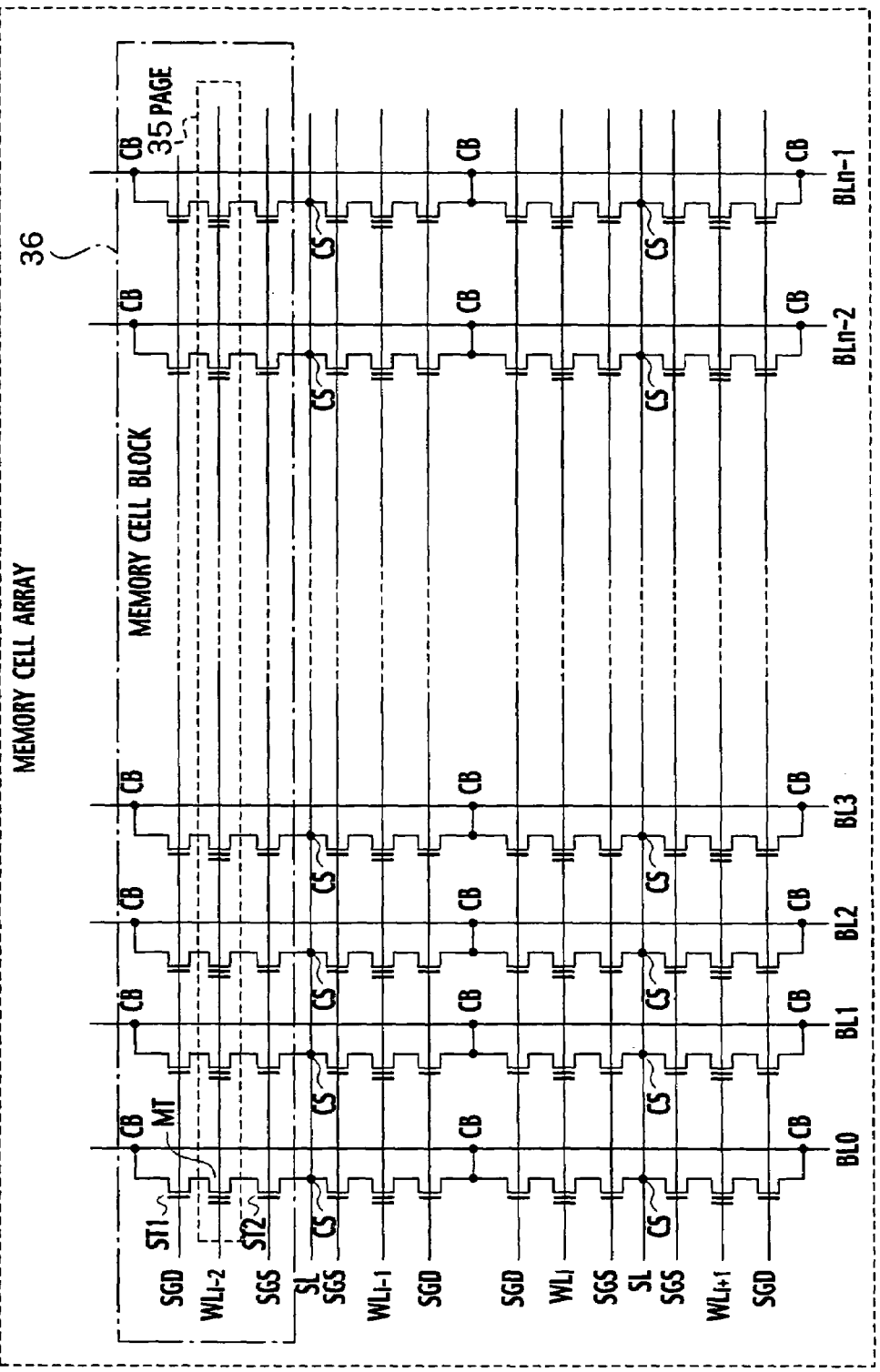
FIG. 67 is a schematic showing a three-transistor/cell type EEPROM applied to the memory cell array as the nonvolatile semiconductor device according to the fourth embodiment of the present invention.

A three-transistor/cell constitution EEPROM applied to the memory cell array 100 as the nonvolatile semiconductor memory device according to the seventh embodiment of the present invention has a constitution of a plurality of a memory cell blocks 36 aligned in columns, which is surrounded by the dashed line shown in FIG. 67. An exemplary semiconductor memory, according to the seventh embodiment of the present invention, has a three-transistor/cell structure as a basic structure, including a gate insulating film as a tunnel insulating film, which is formed on a p-well or a semiconductor substrate, and memory cells, each having a stacked gate structure configured from a floating gate, an inter-gate insulating film, and a control gate on the gate insulating film. The drain region of a memory cell transistor MT is connected to a bit line contact CB via a bit line side select transistor ST1, and the source region thereof is connected to a source line contact CS via the source line side select transistor ST2. Such three-transistor/cell memory cells, which are arranged in parallel along the word line length, as shown in FIG. 67, configure a memory cell block 36. Within a single memory cell block 36, the word line $WL_{i-2}$ is commonly connected to the control gates of memory cells, thereby configuring a page unit 35. Naturally, pages within multiple blocks may configure a page unit. In addition, a select gate line SGS is commonly connected to the gates of the source line side select transistors ST2, and the select gate line SGD is commonly connected to the gates of the bit line side select transistors ST1. On the other hand, along the length of bit lines BL0, BL1, BL2, . . . , BLn, circuit structures having three-transistor/cell memory cells symmetrically arranged with source line SL as a line of symmetry are arranged in series.

The memory cell transistor MT and the select gate transistors ST1 and ST2 of the three-transistor/cell structure are connected to the bit lines BL0, BL1, BL2, . . . , BLn through the bit line contact CB, and connected to the source line SL through the source line contact CS, forming the memory cell array 100 in the fashion shown in FIG. 67.

Now, also on the peripheral unit of the three-transistor/cell constituted memory cell array 100 shown in FIG. 67, a word line transfer transistor unit is disposed in the same fashion as in the nonvolatile semiconductor memory device according to the first embodiment of the present invention, or a bit line switching transistor unit is disposed in the same fashion as in the nonvolatile semiconductor memory device according to the third embodiment of the present invention.

By using the nonvolatile semiconductor memory device according to the seventh embodiment of the present invention, miniaturization of the word line transfer transistors and the bit line switching transistors of the three-transistor/cell constituted EEPROM can be realized without any sacrifice of breakdown voltage.

[Eighth Embodiment]

(Application Example)

Figure 68:
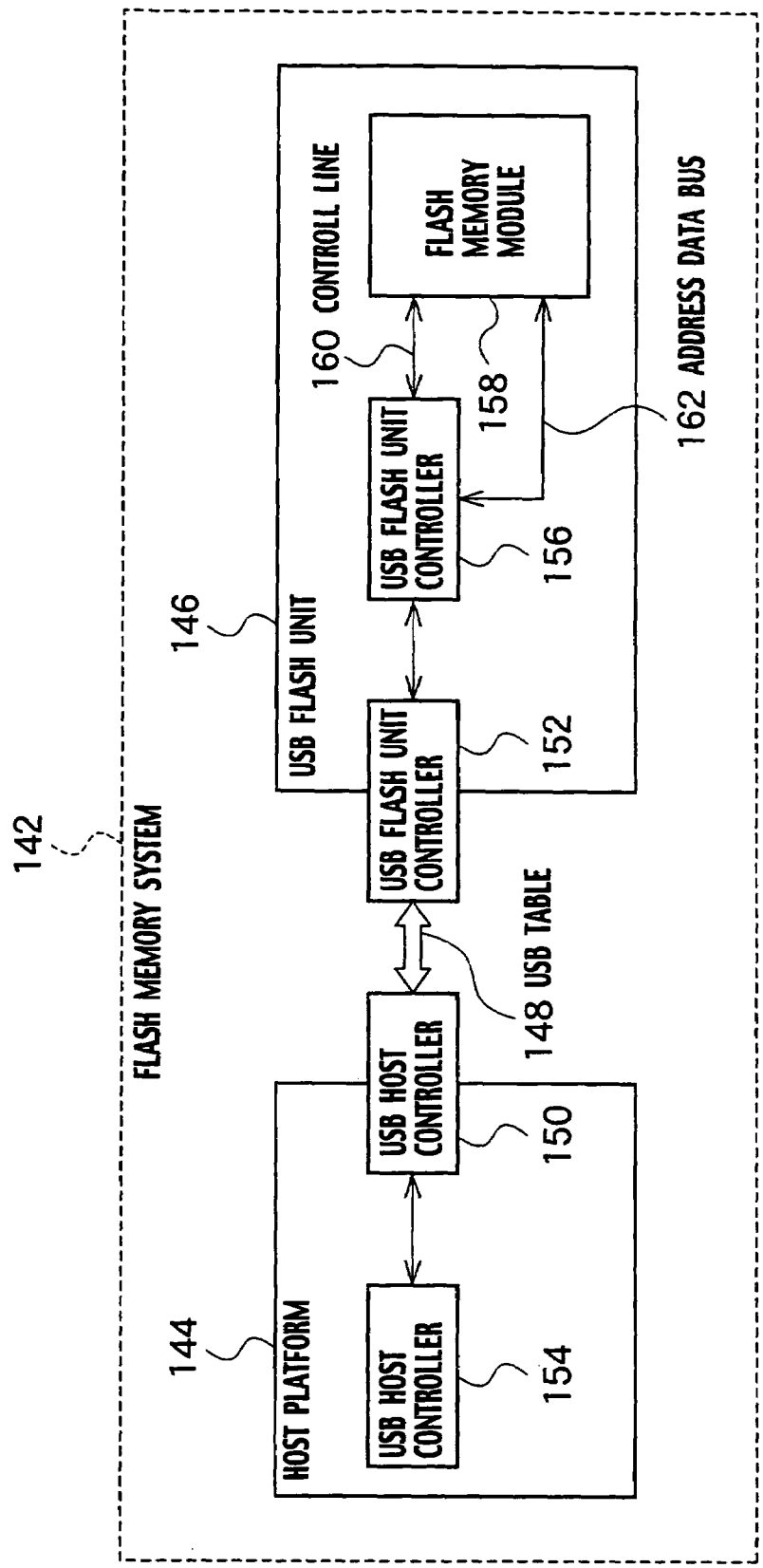
FIG. 68 shows the eighth embodiment of the present embodiment as an example of an application of the nonvolatile semiconductor memory device according to the first through seventh embodiments of the present invention.

FIG. 68 illustrates an application example of a nonvolatile semiconductor memory according to the first to seventh embodiments of the present invention as a eighth embodiment of the present invention. FIG. 68 is a schematic diagram of principal elements of a flash memory and system according to the present invention. As shown in the drawing, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first to ninth embodiments of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which is stored with transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received this request packet, this request is accepted by the USB flash unit controller 156.

Next, the USB flash unit controller 156 performs various operations such as read-in, write-in or erasure of data from or to the flash memory module 158. In addition, the flash unit controller supports basic USB functions such as acquiring a USB address and the like. The USB flash unit controller 156 controls the flash memory module 158 via either a control line 160, which is used to control output from the flash memory module 158, or, for example, other various signals such as a chip enable signal CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

[Other Embodiments]

As described above, the present invention is described according to the first through the eighth embodiment; however, it should not be perceived that descriptions forming part of this disclosure and the drawings are intended to limit the spirit and scope of the present invention. Various alternative embodiments, working examples, and operational techniques will become apparent from this disclosure for those skilled in the art.

For example, the first through the eighth embodiment of the present invention mainly describes two-valued NAND EEPROM. However, the present invention is applicable to multi-valued cell NAND EEPROM of three values or more. For example, four-valued NAND EEPROM allows a memory capacity twice that of the two-valued NAND EEPROM. In addition, the present invention is applicable to multi-valued cell NAND EEPROM of m values (m>3) or more.

In this manner, the present invention naturally includes various embodiments not described herein. Accordingly, the technical scope of the present invention is determined only by specified features of the invention according to appended claims that can be regarded appropriate from the above-mentioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modified examples will become possible for those skilled in the art after receiving the teachings of the present disclosure without departing from the scope thereof.

What is claimed is:

1. A nonvolatile semiconductor memory, comprising:
   a memory cell array constituted by a plurality of word lines, a plurality of bit lines, and electrically erasable/writable memory cell transistors, which have respective tunnel insulating films and are arranged at intersections of the plurality of word lines and the plurality of bit lines; and
   a word line transfer transistor, which is separated by an element isolation region, has a source diffusion layer, a channel region, a gate insulating film on the channel region, and a drain diffusion layer, and is connected to a word line and a gate electrode formed on the gate insulating film via a word line contact plug formed in the drain diffusion layer;
   wherein, channel width of the word line transfer transistor is at least six times width of the word line contact plug, and distance in a second direction between the word line contact plug and corresponding element isolation region is greater than distance in a first direction between the word line contact plug and corresponding element isolation region where, the first direction denotes a direction from the source diffusion layer towards the drain diffusion layer, and the second direction denotes a direction perpendicular to the first direction.

2. The nonvolatile semiconductor memory of claim 1, wherein, width of the element isolation region in the first direction is greater than width of the element isolation region in the second direction.

3. The nonvolatile semiconductor memory of claim 1, further comprising a field stopper impurity layer arranged on the bottom of the element isolation region between adjacent word line transfer transistors;
   wherein, the word line transfer transistor is formed on a semiconductor substrate; thickness of the gate insulating film of the word line transfer transistor is at least two times thickness of the tunnel insulating film of each memory cell transistor; and impurity concentration of the field stopper impurity layer is at least one hundred times impurity concentration of the semiconductor substrate.

4. The nonvolatile semiconductor memory of claim 3, wherein, the source diffusion layer and the drain diffusion layer of the word line transfer transistor further comprises:
   a first n-type diffusion layer, which is connected to the word line contact plug; and
   a second n-type diffusion layer having a lower impurity concentration than that of the first n-type diffusion layer;
   wherein, distance in the first direction between the first n-type diffusion layer and an end of the element isolation region is shorter than distance in the second direction between the first n-type diffusion layer and an end of the element isolation region.

5. The nonvolatile semiconductor memory of claim 4,
wherein, the memory cell transistors comprise NAND-type EEPROM, and
the memory cell transistors arranged in series are connected to a bit line via a select gate transistor.

6. A nonvolatile semiconductor memory, comprising:
a memory cell array constituted by a plurality of word lines, a plurality of bit lines, and electrically-erasable, -writable memory cell transistors arranged at intersections of the plurality of word lines and the plurality of bit lines;
a word line transfer transistor, which is separated by an element isolation region, has a source diffusion layer, a channel region, and a drain diffusion layer; and
a word line contact plug and a word line drive signal line contact plug formed in the drain diffusion layer and the source diffusion layer, respectively;
wherein, channel width of the word line transfer transistor is at least six times width of the word line contact plug, and distance in a second direction between the word line contact plug and corresponding element isolation region is greater than distance in a first direction between the word line contact plug and corresponding element isolation region where, the first direction denotes a direction from the source diffusion layer towards the drain diffusion layer, and the second direction denotes a direction perpendicular to the first direction.

7. The nonvolatile semiconductor memory of claim 6,
wherein, the distance in the second direction between the word line contact plug and corresponding element isolation region is at least 1.25 times the distance in the first direction between the word line contact plug and corresponding element isolation region.

8. The nonvolatile semiconductor memory of claim 6, wherein, width of the element isolation region in the first direction is greater than that of the element isolation region in the second direction.

9. The nonvolatile semiconductor memory of claim 6, further comprising: a field stopper impurity layer arranged on the bottom of the element isolation region between adjacent word line transfer transistors;
wherein, the word line transfer transistor is formed on a semiconductor substrate; thickness of the gate insulating film of the word line transfer transistor is at least two times thickness of the tunnel insulating film of each memory cell transistor; and impurity concentration of the field stopper impurity layer is at least one hundred times impurity concentration of the semiconductor substrate.

10. The nonvolatile semiconductor memory of claim 9,
wherein, the source diffusion layer and the drain diffusion layer of the word line transfer transistor further comprises:
a first n-type diffusion layer, which is connected to the word line contact plug; and
a second n-type diffusion layer having a lower impurity concentration than that of the first n-type diffusion layer;
wherein, distance in the first direction between the first n-type diffusion layer and an end of the element isolation region is shorter than distance in the second direction between the first n-type diffusion layer and an end of the element isolation region.

11. The nonvolatile semiconductor memory of claim 10,
wherein, the memory cell transistors comprise NAND-type EEPROM, and the memory cell transistors arranged in series are connected to a bit line via a select gate transistor.

12. A nonvolatile semiconductor memory, comprising:
a memory cell array constituted by a plurality of word lines, a plurality of bit lines, and electrically-erasable, -writable memory cell transistors arranged at intersections of the plurality of word lines and the plurality of bit lines; and
a bit line switch transistor, which is separated by an element isolation region, has a source diffusion layer, a gate electrode, and a drain diffusion layer, and is connected to a sense amplifier/shield power supply via a sense amplifier/shield power supply contact plug formed in the drain diffusion layer;
wherein, distance between the gate electrode and a bit line contact plug is greater than distance between the gate electrode and the sense amplifier/shield power supply contact plug.

13. The nonvolatile semiconductor memory of claim 12,
wherein, the distance between the gate electrode and the bit line contact plug is at least 1.5 times the distance between the gate electrode and the sense amplifier/shield power supply contact plug.

14. The nonvolatile semiconductor memory of claim 12, further comprising;
a word line transfer transistor, which is separated by an element isolation region, has a source diffusion layer, a channel region, a gate insulating film on the channel region, and a drain diffusion layer, and is connected to a word line and a gate electrode formed on the gate insulating film via a word line contact plug formed in the drain diffusion layer;
wherein, channel width of the word line transfer transistor is at least six times width of the word line contact plug, and distance in a second direction between the word line contact plug and corresponding element isolation region is greater than distance in a first direction between the word line contact plug and corresponding element isolation region where, the first direction denotes a direction from the source diffusion layer towards the drain diffusion layer, and the second direction denotes a direction perpendicular to the first direction.

15. The nonvolatile semiconductor memory of claim 14, wherein width of the element isolation region in the first direction is greater than that of the element isolation region in the second direction.

16. The nonvolatile semiconductor memory of claim 14, further comprising:
a field stopper impurity layer arranged on the bottom of the element isolation region between adjacent word line transfer transistors;
wherein, the word line transfer transistor is formed on a semiconductor substrate; thickness of the gate insulating film of the word line transfer transistor is substantially the same as thickness of a gate insulating film of the bit line switch transistor; the thickness of the gate insulating film of the word line transfer transistor is at least two times thickness of a tunnel insulating film of each memory cell transistor; and impurity concentration of the field stopper impurity layer is at least one hundred times impurity concentration of the semiconductor substrate.

17. The nonvolatile semiconductor memory of claim 16, wherein, the source diffusion layer and the drain diffusion layer of the word line transfer transistor further comprises:
a first n-type diffusion layer, which is connected to the word line contact plug; and
a second n-type diffusion layer having a lower impurity concentration than that of the first n-type diffusion layer;
wherein, distance in the first direction between the first n-type diffusion layer and an end of the element isolation region is shorter than distance in the second direction between the first n-type diffusion layer and an end of the element isolation region.

18. The nonvolatile semiconductor memory of claim 17, wherein, the memory cell transistors comprise NAND-type EEPROM, and the memory cell transistors arranged in series are connected to a bit line via a select gate transistor.

* * * * *